US012793922B2

(12) United States Patent
Fitzgerald et al.

(10) Patent No.: US 12,793,922 B2
(45) Date of Patent: Nov. 10, 2026

(54) CIRCUIT BREAKER CIRCUITRY WITH MICRO-ELECTROMECHANICAL SYSTEMS SWITCH AND OPTICAL ISOLATION

(71) Applicant: Analog Devices International Unlimited Company, County Limerick (IE)

(72) Inventors: Padraig L. Fitzgerald, Mallow (IE); Thomas O'Shea, Kanturk (IE); Jonathan Ephraim David Hurwitz, Edinburgh (GB); Alan J. O'Donnell, Castletroy (IE); David Aherne, Limerick (IE); Patrick Martin McGuinness, Pallaskenry (IE); David J. Clarke, Patrickswell (IE); Richard T. Anslow, Limerick (IE); John Ross Wallrabenstein, Lafayette, IN (US); Finbarr O'Leary, Sixmilebridge (IE); Michael P. Lynch, Bruff (IE); James Patrick Ryan, County Limerick (IE); Michael James Twohig, County Cork (IE); Patrick Byrne, Limerick (IE); Danail Baylov, Limerick (IE); Blas Bogado, Dublin (IE); Damon Bosetti, Arlington, MA (US)

(73) Assignee: Analog Devices International Unlimited Company, County Limerick (IE)

( * ) Notice: Subject to any disclaimer, the term of this patent is extended or adjusted under 35 U.S.C. 154(b) by 35 days.

(21) Appl. No.: 18/991,025

(22) Filed: Dec. 20, 2024

(65) Prior Publication Data

US 2025/0211227 A1 Jun. 26, 2025

Related U.S. Application Data

(60) Provisional application No. 63/725,883, filed on Nov. 27, 2024, provisional application No. 63/725,468,
(Continued)

(51) Int. Cl.
*B81B 5/00* (2006.01)
*H01H 1/00* (2006.01)
(Continued)

(52) U.S. Cl.
CPC ........... *H01H 71/1045* (2013.01); *B81B 5/00* (2013.01); *H01H 1/0036* (2013.01);
(Continued)

(58) Field of Classification Search
CPC ..... H01H 71/1045; H01H 1/0036; B81B 5/00
(Continued)

(56) References Cited

U.S. PATENT DOCUMENTS 5,754,113 A * 5/1998 Boyer ...................... H02H 3/04 340/638
7,042,319 B2 * 5/2006 Ishiwata ............. H01H 50/005 336/200
(Continued)

FOREIGN PATENT DOCUMENTS

EP 2 713 379 A1 4/2014
WO WO 2022/243746 A1 11/2022
(Continued)

OTHER PUBLICATIONS

International Search Report with Written Opinion Dated Mar. 28, 2025, in PCT Application No. PCT/EP2024/087744 in 17 Pages.
(Continued)

*Primary Examiner* — Alexander Talpalatski
(74) *Attorney, Agent, or Firm* — KNOBBE, MARTENS, OLSON & BEAR, LLP

(57) ABSTRACT

High voltage micro-electromechanical systems (MEMS) switches are described. A MEMS teeter-totter switch can include a beam coupled to an anchor on a substrate and two control electrodes, disposed on a surface of the substrate. A control circuit may include an optical isolator that provides an isolated activation voltage to a voltage supply and control circuit. The voltage supply and control circuit uses the
(Continued)

isolated activation voltage to supply a control voltage to one of the control electrodes with respect to a first reference voltage, causing the beam to provide an input voltage received from an input terminal to a contact electrode of the MEMS teeter-totter switch electrically connected to an output terminal. The input voltage is applied on the beam with respect to a second reference voltage different from the first reference voltage.

20 Claims, 33 Drawing Sheets

Related U.S. Application Data filed on Nov. 26, 2024, provisional application No. 63/720,719, filed on Nov. 14, 2024, provisional application No. 63/711,622, filed on Oct. 24, 2024, provisional application No. 63/709,987, filed on Oct. 21, 2024, provisional application No. 63/706,442, filed on Oct. 11, 2024, provisional application No. 63/705,960, filed on Oct. 10, 2024, provisional application No. 63/626,428, filed on Jan. 29, 2024, provisional application No. 63/614,081, filed on Dec. 22, 2023.

(51) Int. Cl.

| | |
|---|---|
| ***H01H 71/10*** | (2006.01) |
| ***H01H 71/74*** | (2006.01) |
| ***H01H 73/04*** | (2006.01) |
| ***H02H 1/00*** | (2006.01) |
| ***H02H 3/08*** | (2006.01) |
| ***H02H 5/04*** | (2006.01) |
| ***H02H 9/06*** | (2006.01) |
| ***H03K 17/78*** | (2006.01) |
| *G01R 19/25* | (2006.01) |
| *H01H 71/00* | (2006.01) |

(52) U.S. Cl.

CPC .......... *H01H 71/74* (2013.01); *H01H 73/045* (2013.01); *H02H 1/0007* (2013.01); *H02H 3/08* (2013.01); *H02H 5/042* (2013.01); *H02H 9/06* (2013.01); *H03K 17/78* (2013.01); *B81B 2201/018* (2013.01); *G01R 19/25* (2013.01); *H01H 2071/008* (2013.01); *H01H 2071/749* (2013.01); *H01H 2221/022* (2013.01)

(58) Field of Classification Search

USPC ........................................................... 335/78

See application file for complete search history.

(56) References Cited

U.S. PATENT DOCUMENTS

| | | | | |
|---|---|---|---|---|
| 7,164,334 | B2 * | 1/2007 | Shirakawa | H01H 59/0009 335/78 |
| 7,903,382 | B2 | 3/2011 | Premierlani et al. | |
| 8,390,407 | B2 * | 3/2013 | Diem | H01H 59/0009 335/86 |
| 8,610,519 | B2 * | 12/2013 | Keimel | H01H 59/0009 335/78 |
| 8,701,459 | B2 | 4/2014 | Geen | |
| 8,779,532 | B2 | 7/2014 | O'Donnell et al. | |
| 9,517,930 | B2 * | 12/2016 | Cazzaniga | B81C 1/00968 |
| 9,871,373 | B2 | 1/2018 | O'Donnell et al. | |
| 10,032,683 | B2 | 7/2018 | Davis et al. | |
| 10,145,906 | B2 | 12/2018 | O'Donnell et al. | |
| 10,365,322 | B2 | 7/2019 | Coyne et al. | |
| 10,557,881 | B2 | 2/2020 | O'Donnell et al. | |
| 10,640,363 | B2 * | 5/2020 | Fitzgerald | H01H 59/0009 |
| 10,848,152 | B2 | 11/2020 | Zhao et al. | |
| 10,901,023 | B2 | 1/2021 | Schat et al. | |
| 10,992,144 | B2 | 4/2021 | Li et al. | |
| 11,228,310 | B2 | 1/2022 | Zhao et al. | |
| 11,313,876 | B2 | 4/2022 | Zhang et al. | |
| 11,320,479 | B2 | 5/2022 | Plum et al. | |
| 11,609,265 | B1 | 3/2023 | Rossmeier et al. | |
| 11,742,038 | B2 | 8/2023 | Raasch et al. | |
| 11,828,785 | B2 | 11/2023 | Carini et al. | |
| 11,842,871 | B2 | 12/2023 | Kadlec et al. | |
| 11,843,992 | B1 | 12/2023 | Puskarich | |
| 11,894,673 | B2 | 2/2024 | Formenti et al. | |
| 12,168,603 | B2 | 12/2024 | Ang et al. | |
| 2006/0181377 | A1 * | 8/2006 | Kweon | H01H 59/0009 335/78 |
| 2006/0277997 | A1 | 12/2006 | Foster et al. | |
| 2008/0165457 | A1 | 7/2008 | Premerlani et al. | |
| 2017/0126229 | A1 | 5/2017 | Tan et al. | |
| 2018/0059185 | A1 | 3/2018 | Martin et al. | |
| 2018/0127267 | A1 | 5/2018 | Winkler et al. | |
| 2019/0081478 | A1 | 3/2019 | Vinot et al. | |
| 2019/0318893 | A1 | 10/2019 | Kamijima et al. | |
| 2021/0356328 | A1 | 11/2021 | Ferraro et al. | |
| 2023/0082203 | A1 | 3/2023 | Kadlec et al. | |
| 2023/0204640 | A1 | 6/2023 | Henwood et al. | |

FOREIGN PATENT DOCUMENTS

| | | | |
|---|---|---|---|
| WO | WO 2023/121979 | A2 | 6/2023 |
| WO | WO 2025/133012 | A1 | 6/2025 |

OTHER PUBLICATIONS

Yeatman, E. M. Applications of MEMS in Power Sources and Circuits, Journal of Micromechanics And Microengineering, vol. 17, pp. S184-S188, 2007.

C. Giovanniello, MEMS Power Relay for High-Power AC/DC Applications, EE world online, in 5 pages, Mar. 2019. (https://www.eeworldonline.com/mems-power-relay-for-high-power-ac-dc-applications/).

J. Shepard, How to Implement Galvanic Isolation for Power and Signal Lines in High-Voltage Systems, Contributed by DigiKey's North America Editors, published online Jan. 27, 2023. (https://www.digikey.com/en/articles-blogs?t=How%20to%20Implement%20Galvanic%20).

D. Hanser, Power MEMS Development, Final Report for the Contract N00014-09-C-0252 sponsored by Office of Naval Research, report date May 31, 2011.

Zhang et al. Design of a High-Power MEMS Relay with Zero Voltage Switching and Isolated Power and Signal Transfer, IEEE Applied Power Electronics Conference and Exposition (APEC), Mar. 2018. (published in IEEE Xplore on Apr. 19, 2018).

Corty, E. et al. The fundamentals of analog Devices' Revolutionary MEMS Switch Technology, Analog Devices in 4 pages, 2016. (www.analog.com/en/signals.html).

* cited by examiner

200

1100

CIRCUIT BREAKER CIRCUITRY WITH MICRO-ELECTROMECHANICAL SYSTEMS SWITCH AND OPTICAL ISOLATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to U.S. Provisional Application No. 63/614,081, filed Dec. 22, 2023, U.S. Provisional Application No. 63/626,428, filed Jan. 29, 2024, U.S. Provisional Application No. 63/705,960, filed Oct. 10, 2024, U.S. Provisional Application No. 63/706,442, filed Oct. 11, 2024, U.S. Provisional Application No. 63/709,987, filed Oct. 21, 2024, U.S. Provisional Application No. 63/720,719, filed Nov. 14, 2024, U.S. Provisional Application No. 63/725,883, filed Nov. 27, 2024, U.S. Provisional Application No. 63/711,622, filed Oct. 24, 2024, and U.S. Provisional Application No. 63/725,468, filed Nov. 26, 2024. The entire content of each of the applications referenced in this paragraph is hereby incorporated by reference herein in its entirety for all purposes and made a part of this specification.

BACKGROUND

Field

The disclosed technology generally relates to micro-electromechanical systems (MEMS) switches, and more particularly to MEMS switches configured for high voltage and high current applications, and circuits and systems including the same.

Description of the Related Art

MEMS switches, such as cantilever-based MEMS switches, are used in various electrical circuits to control electrical connections between different parts of the circuit. The MEMS switch can be configured as part of a circuit between input and output terminals to a switchable conductive path between the input and output terminals and to pass current through the conductive path when it is in ON state. MEMS switches that can reliably operate between input and output terminals having a large voltage difference for extended periods can be difficult, for example, because the MEMS switch structure may degrade over time as a result of repeated switching operations for an extended period.

SUMMARY

In some aspects, the techniques described herein relate to a micro-electromechanical (MEMS) switch, including: a conductive beam anchored over a substrate by a conductive post serving simultaneously as a mechanical pivot and a conductive path between the conductive beam and a middle electrode on the substrate; and a pair of contact electrodes formed on the substrate at opposite lateral sides of the conductive post; wherein upon activation of the MEMS switch, the conductive beam is configured to tilt such that one side of the conductive beam contacts one of the pair of contact electrodes to form a further conductive path, and wherein the conductive post is closer to a first end of the conductive beam relative to a second end of the conductive beam opposite the first end.

In some aspects, the techniques described herein relate to a micro-electromechanical (MEMS) switch, including: a conductive beam anchored over a substrate by a conductive post serving simultaneously as a mechanical pivot and a conductive path between the conductive beam and a middle electrode on the substrate; and a pair of contact electrodes formed on the substrate at opposite lateral sides of the conductive post; wherein upon activation of the MEMS switch, the conductive beam is configured to tilt such that one side of the conductive beam contacts one of the pair of contact electrodes to form a further conductive path, and that the conductive path and the further conductive path become electrically shorted to each other.

In some aspects, the techniques described herein relate to a micro-electromechanical (MEMS) switch, including: a conductive beam anchored over a substrate by a conductive post serving simultaneously as a mechanical pivot and a conductive path between the conductive beam and a middle electrode on the substrate; a pair of contact electrodes formed on the substrate at opposite lateral sides of the conductive post; and a mechanical stopper formed at a bottom surface of the conductive beam and extending towards the substrate, wherein upon activation of the MEMS switch, the conductive beam is configured to tilt such that one side of the conductive beam contacts one of the pair of contact electrodes to form a further conductive path, and the mechanical stopper is configured to substantially suppress an elastic deformation of one or both of the conductive beam and the conductive post.

In some aspects, the techniques described herein relate to a circuit breaker circuitry, including: an input terminal and an output terminal; a micro-electromechanical systems (MEMS) switch electrically connected therebetween, including: a conductive beam pivoted over a substrate by a conductive post to tilt in opposite directions; first and second contact electrodes formed on the substrate at opposite lateral sides of the conductive post, wherein the first contact electrode is electrically shorted with the conductive post, and first and second control electrodes formed on the substrate at opposite lateral sides of the conductive post, wherein each of the first and second control electrodes is disposed laterally between the conductive post and a respective one of the first and second contact electrodes, wherein the input terminal, the first contact electrode and the conductive post are commonly electrically connected, wherein upon activation of the MEMS switch, the conductive beam tilts in a first direction to cause: a first side of the conductive beam to electromechanically couple to the first contact electrode, and a second side of the conductive beam to mechanically decouple from the second contact electrode, thereby open circuiting a path between the input terminal and the output terminal.

In some aspects, the techniques described herein relate to a circuit breaker circuitry, including: an input terminal and an output terminal; a micro-electromechanical systems (MEMS) switch electrically connected therebetween, including: a conductive beam pivoted over a substrate by a conductive post to tilt in opposite directions, wherein the conductive post is closer to a first end of the conductive beam relative to a second end of the conductive beam opposite the first end; first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause: a first side of the conductive beam to electromechanically couple to the first contact electrode, thereby commonly electrically connecting the input terminal to the first contact electrode, and a second side of the conductive beam to electromechanically decouple from the second contact electrode, thereby open circuiting a path between the input terminal and the output terminal.

In some aspects, the techniques described herein relate to a circuit breaker circuitry, including: an input terminal and an output terminal; a pair of serially connected micro-electromechanical systems (MEMS) switches electrically connected therebetween, wherein each of the MEMS switches includes: a conductive beam pivoted over a substrate by a conductive post to tilt in opposite directions; first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the output terminal, wherein the first contact electrodes of the pair of MEMS switches are electrically shorted to each other.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit including a first transformer configured to provide an activation voltage as an isolated voltage to the first control electrode for the activation of the MEMS switch.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit including a plurality of transformers and configured to maintain a substantially constant voltage difference between the first control electrode and the conductive beam with a changing voltage at the input terminal connected to the conductive post.

In some aspects, the techniques described herein relate to a circuit breaker system, including: an input terminal and an output terminal; a pair of serially connected micro-electromechanical systems (MEMS) switches electrically connected therebetween, wherein each of the MEMS switches includes: a conductive beam pivoted over a substrate by a conductive post to tilt in opposite directions; first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause: a first side of the conductive beam to electromechanically couple to the first contact electrode, thereby electrically connecting the input or output terminal to the respective conductive post, and a second side of the conductive beam to electromechanically decouple from the second contact electrode, thereby open circuiting a path between the input or output terminal and the second contact electrode, an isolation circuit including a plurality of transformers and configured to maintain a substantially constant voltage difference between the first and second control electrodes and the respective conductive beams with a changing voltage at the input terminal connected to the first contact electrode.

In some aspects, the techniques described herein relate to a circuit breaker circuitry, including: an input terminal and an output terminal; a micro-electromechanical systems (MEMS) switch electrically connected between the input and output terminals, the MEMS switch including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction, thereby open circuiting a path between the input terminal and the output terminal; and a protective switch electrically connected in parallel to the MEMS switch between the input and output terminals, wherein the protective switch is configured to shunt at least a portion of a current flowing between the input and output terminals during activation of the MEMS switch and prior to a completion of open circuiting the path.

In some aspects, the techniques described herein relate to a circuit breaker circuitry, including: an input terminal and an output terminal; a micro-electromechanical systems (MEMS) switch electrically connected between the input and output terminals, the MEMS switch including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction, thereby open circuiting a path between the input terminal and the output terminal over a time period of 0.1-10 microseconds until the MEMS switch reaches an open circuit condition; and a protective switch electrically connected in parallel to the MEMS switch between the input and output terminals.

In some aspects, the techniques described herein relate to a circuit breaker circuitry, including: an input terminal and an output terminal; a plurality of micro-electromechanical systems (MEMS) switches electrically connected in parallel between the input and output terminals, each of the MEMS switches including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the each of the MEMS switches, the conductive beam tilts in a first direction, thereby open circuiting a path between the input terminal and the output terminal; and a protective switch electrically connected in parallel to the MEMS switches between the input and output terminals.

In some aspects, the techniques described herein relate to a circuit breaker circuitry, including: an input terminal and an output terminal; a micro-electromechanical systems (MEMS) switch electrically connected between the input and output terminals, the MEMS switch including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and an electrical overstress (EOS) protection device electrically connected to the MEMS switch between the input and output terminals, wherein in response to an EOS event, the EOS protection device is configured to be activated to provide a shunt current path.

In some aspects, the techniques described herein relate to a circuit breaker circuitry, including: an input terminal and an output terminal; a micro-electromechanical systems (MEMS) switch electrically connected between the input and output terminals, the MEMS switch including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and a spark gap device electrically connected to the MEMS switch and including a pair of conductive arcing electrodes separated by a gap.

In some aspects, the techniques described herein relate to a circuit breaker circuitry, including: an input terminal and an output terminal; a micro-electromechanical systems (MEMS) switch electrically connected between the input and output terminals, the MEMS switch including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and an electrical overstress (EOS) protection device electrically to the MEMS switch between the input and output terminals, wherein the MEMS switch and the EOS protection device are fabricated on a common substrate using a semiconductor fabrication process.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit including a first optical isolator configured to provide an activation voltage as an isolated voltage to the first control electrode for the activation of the MEMS switch.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit including a plurality of optical isolators and configured to maintain a substantially constant voltage difference between the first control electrode and the conductive beam with a changing voltage at the input terminal connected to the conductive post.

In some aspects, the techniques described herein relate to a circuit breaker system, including: an input terminal and an output terminal; a pair of serially connected micro-electro-mechanical systems (MEMS) switches electrically connected therebetween, wherein each of the MEMS switches includes: a conductive beam pivoted over a substrate by a conductive post to tilt in opposite directions; first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause: a first side of the conductive beam to electromechanically couple to the first contact electrode, thereby electrically connecting the input or output terminal to the respective conductive post, and a second side of the conductive beam to electromechanically decouple from the second contact electrode, thereby open circuiting a path between the input or output terminal and the second contact electrode, an isolation circuit including a plurality of optical isolators and configured to maintain a substantially constant voltage difference between the first and second control electrodes and the respective conductive beams with a changing voltage at the input terminal connected to the first contact electrode.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; a current sensor serially connected to the MEMS switch between the input and output terminals; and a microcontroller communicatively coupled to the MEMS switch and the current sensor, wherein upon the microcontroller determining that a current sensed from the current sensor exceeds a predetermined threshold value, the microcontroller is configured to activate the MEMS switch by tilting the conductive beam in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; a temperature sensor in thermal communication with the MEMS switch; and a microcontroller communicatively coupled to the MEMS switch and the temperature sensor, wherein upon the microcontroller determining that a temperature sensed from the temperature sensor exceeds a predetermined threshold value, the microcontroller is configured to activate the MEMS switch by tilting the conductive beam in a first direction to cause: a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode.

In some aspects, the techniques described herein relate to a circuit breaker system, including: an input terminal and an output terminal; a micro-electromechanical systems (MEMS) switch electrically connected therebetween, including: a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and one or more thin film-based sensors co-fabricated on a same substrate to have at least one common physical dimension with a layer of the MEMS switch to have at least one physical dimension common.

BRIEF DESCRIPTION OF THE DRAWINGS

Embodiments of this disclosure will now be described, by way of non-limiting example, with reference to the accompanying drawings.

DETAILED DESCRIPTION

Figure 1B:
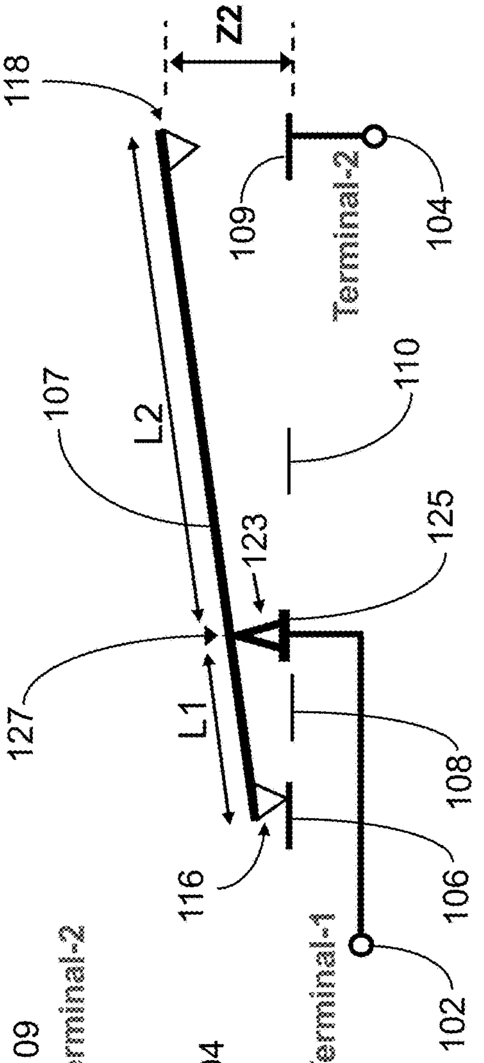
FIG. 1B is a schematic diagram illustrating an asymmetric micro-electromechanical systems (MEMS) teeter-totter switch.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Switches are integral to a wide variety of applications in a variety of industry sectors including telecommunications, aerospace, healthcare and consumer electronics, to name a few. Different switching technologies have different advantages and drawbacks. Desirable switching technology characteristics for some applications include wide bandwidth, fast switching speed, reliability, scalability and high-volume manufacturability. For example, drawbacks of electromechanical relay technologies can include narrow bandwidths, limited actuation lifetimes and large package sizes. In comparison, microelectromechanical systems (MEMS) switch technology has the potential to deliver higher bandwidth, higher reliability and smaller form factor, among other advantages, compared to electromechanical relays. Central to the MEMS switch technology is a micromachined beam switching element that is electrostatically actuated using metal-to-metal contacts via electrostatics.

One example application of the MEMS switch technology, is in circuit breakers. Circuit breakers are used in a wide variety of applications, including electric vehicle charging, secondary battery management, motor drives and industrial power supplies, to name a few. A circuit breaker uses a switch to interrupt power to a sensitive electronic load in the event of an over-current and/or over-voltage condition. The inventors have realized that MEMS switches have the potential to improve upon traditional electromechanical circuit breakers with respect to the above-mentioned drawbacks. However, existing MEMS switch technologies still face challenges for application in circuit breaker technologies due to, among other reasons, limited current and voltage handling capabilities. For example, some MEMS switches may be prone to rapid wear out or arcing of the beam switching element under high voltage and current conditions. To address these and other needs, disclosed herein are MEMS switches configured for high voltage and high current applications, and various systems and applications incorporating such MEMS switches.

MEMS Switches for High Current and/or High Power

Aspects of the present disclosure provide micro-electromechanical systems (MEMS) switches having a teeter-totter configuration, as well as methods of operating and fabricating such switches.

In some implementations, a MEMS switch (e.g., a cantilever-based switch) may comprise a conductive beam that is connected to a post formed on or over a substrate and can be configured to be pulled toward the substrate upon actuation. When the MEMS switch is not actuated, an elastic restoring force of the beam (or a hinge) may restore a predefined separation between a free end of the conductive beam and a contact electrode formed on the substrate, such that the MEMS switch becomes open or goes to an OFF state. In some cases, when the MEMS switch is actuates the free end of the conductive beam is pulled into contact with the contact electrode (e.g., by an electric force) such that the switch becomes closed (goes to an ON state) and establishes an electrical path between the contact electrode and the post. In some applications, the MEMS switch may be employed to controllably connect or disconnect two terminals of an electric circuit (e.g., a circuit breaker circuitry) connected to the MEMS switch.

In some embodiments, a MEMS switch may comprise a beam anchored to a substrate via a middle point of the beam such that both ends of the beam can be actuated to move toward the substrate. Such MEMS switch, herein referred to as teeter-totter switch may comprise a beam (e.g., a conductive beam) mechanically connected to an underlying substrate by a post (e.g., a conductive post) that supports the beam at a point between two opposite ends (e.g., free ends) of the beam. In some cases, the beam may be connected to the post by a hinge or hinge structure that may allow the beam to rotate with respect to the post. In some embodiments, the post may be symmetrically located with respect to two opposite ends of the beam. In some such embodiments, regardless of which one of the two ends are actuated (e.g., pulled toward the substrate), a vertical separation between the other end and the substrate can be substantially independent of which of the two ends is actuated. In some embodiments, the post may be asymmetrically located with respect to two opposite ends of the beam. For example, the post can be closer to a first end of the beam relative to a second end of the beam opposite the first end. In some such embodiments, when the post is closer to one end of the beam, actuating different ends may result in different vertical separations between the other end and the substrate.

In some cases, the post may serve as one or both of a mechanical pivot and a conductive path between the conductive beam and a middle conductive electrode (herein referred to as the middle electrode) formed on or within the substrate. In some embodiments, the beam may be configured to controllably pivot or tilt with respect to the substrate, e.g., by an electrostatic actuation mechanism to electromechanically couple one end of the beam to one of a pair of contact electrodes formed on the substrate. For example, an end of the beam may include a contact tip and upon actuation of that end, the contact tip can make electrical contact with a respective contact electrode on the substrate. In some cases, the middle electrode and one of the contact electrodes can be electrically connected to two different terminals of an electric circuit.

In some cases, in an ON state the second end of the beam may contact (be electromechanically coupled to) a contact electrode of the pair of contact electrodes to establish a conductive path between the contact electrode and the middle electrode via the beam and, in some cases, a contact tip disposed at the second end. In some cases, in an OFF state, the teeter-totter switch can be in a neutral state where one or both ends of the beam are disconnected from the respective contact electrodes. In some examples in the OFF state a vertical distance between an end of the beam and the respective contact electrode may be configured to prevent electric discharge or arcing at a target electric potential difference between that end and the respective contact electrode.

In some embodiments, a teeter-totter switch may be used as a two-port switch, e.g., by electrically shorting the middle electrode and one of the contact electrodes. For example, a first contact electrode of the teeter-totter switch can be electrically connected to its middle electrode and the teeter-totter switch may be configured to control electric connection between a second contact electrode of the teeter-totter switch and the middle electrode (and the post). In some such embodiments, in the OFF state, a second end of the beam may be disconnected from a second contact electrode and a first end of the beam can be in contact with the first contact electrode. In some embodiments, e.g., when the first electrode is shorted to the middle electrode, the teeter-totter switch may be actuated from the OFF state to the ON state by actuating the beam (e.g., by pulling the second end toward the substrate) to electromechanically disconnect its first end from the first contact electrode and to electromechanically connect its second end to the second contact electrode. In these embodiments, the teeter-totter switch may be actuated from the ON state back to the OFF state by actuating the beam (e.g., by pulling the first end toward the substrate) to electromechanically disconnect its second end from the second contact electrode and electromechanically connecting its first end to the first contact. In some embodiments, e.g., when the teeter-totter switch is used in a circuit breaker between two terminals, the middle electrode may be electrically connected to a first terminal and the second contact electrode may be electrically connected to a second terminal. In these embodiments, the OFF state may be referred to as activated state of MEMS switch where the electric connection between the two terminal is disconnected by the circuit breaker. Accordingly, in these embodiments, the ON state may be referred to as deactivated state of MEMS switch where an electric connection is established between the two terminals via the beam of the teeter-totter switch.

In some examples, when the post is asymmetrically positioned respect to the first and second ends of the beam and the teeter-totter switch is in OFF state, the vertical distance between the second end of the beam and the second contact electrode, herein referred to as an OFF state gap, can be larger than a corresponding vertical distance for a teeter-totter switch having a post symmetrically positioned with respect to the first and second ends of the beam. Advantageously, a larger OFF-state gap may allow the teeter-totter switch to be used for high voltage switching, as a larger vertical separation between the second end and the respective contact electrode in the OFF state (e.g., when the switch is activated) can provide electrical isolation at a higher voltage by increasing the breakdown voltage at which electric arcing may occur. As such, an asymmetric teeter-totter switch can be used for higher voltage applications, compared to some of the existing symmetric teeter-totter switches. In some cases, an upper bound for a voltage that may be switched by a teeter-totter switch may be referred to as the operating voltage ($V_m$) of the teeter-totter switch. The OFF-state gap for a teeter-totter switch, which is configured as a two-port device, may be further increased by positioning the post closer to an end of the beam (e.g., the second end) closer to the contact electrode that is shorted to the middle electrode and/or increasing the length of the beam. The inventors have found that, by tuning the OFF-state gap, operational voltage of the teeter-totter switch may be increased.

In some embodiments, a larger OFF state gap, provided by a longer beam or position the post closer to one end of the beam, can increase the stress on the hinge, the post and/or the beam, in particular when the teeter-totter switch in the OFF state. In some cases, the excessive stress may reduce the lifetime of the teeter-totter switch and increase the complexity of a reliable mechanical design for anchoring of the beam to the substrate (e.g., the complexity of a hinge that connected the beam to the post). The inventors have discovered that the stress transferred to the beam, post, and/or the hinge, may be reduced by forming a mechanical stopper under the beam. In some implementations, upon actuation of the teeter-totter switch, the mechanical stopper contacts the substrate and allows the beam to tilt or pivot around a contact point between the mechanical stopper and the substrate, thereby reducing the stress on the beam, hinge and/or the post. In some implementations, the mechanical stopper may be disposed close to or at the longitudinal position of the post with respect to the two ends of the beam. In some implementations, the mechanical stopper may be disposed in a longitudinal position between the post and one end of the beam, e.g., the first end when the first contact electrode is shorted to the middle electrode. In various implementations, a teeter-totter switch may comprise two mechanical posts (e.g., at the same longitudinal position and different lateral positions with respect to the beam).

In some embodiments, the electrostatic actuation mechanism used for controlling or actuating a teeter-totter switch may comprise electrostatic forces applied on the beam by two capacitors formed on the opposite sides of the post, each capacitor comprising a conductive control electrode (herein referred to as control electrode) formed on the substrate and a portion of the beam above the control electrode. As such, to change the state of the teeter-totter switch from the OFF state to an ON state (e.g., to put the second end of the beam in contact with the respective contact electrode), and vice versa, a sufficiently large voltage (herein referred to as switching voltage, $V_s$) may be applied across one of the two capacitors.

Figure 1A:
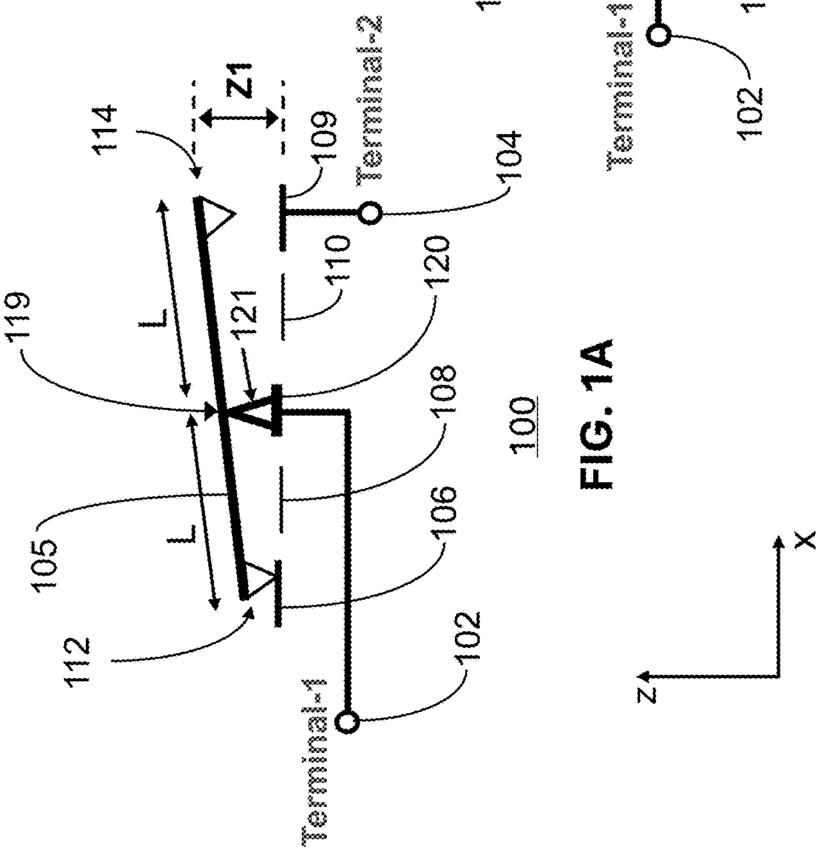
FIG. 1A is a schematic diagram illustrating a symmetric micro-electromechanical systems (MEMS) teeter-totter switch.

FIG. 1A is a schematic diagram of a symmetric MEMS teeter-totter switch 100. In some embodiments, the symmetric MEMS teeter-totter switch 100 may comprise a beam 105, a post 121, two contact electrodes 106, 109, two control electrodes 108, 110, and a middle electrode 120 formed over a substrate (not shown).

In some embodiments, the beam 105 may be extended from a first end (or a first edge) 112 to a second end 114 (or a second edge) and a have width (w) in a transverse direction normal the longitudinal direction (e.g., normal to the x and z-axes). In some embodiments, the beam 105 may be positioned to form one or more mechanical connections (e.g., via one or more hinges) with the anchor or post 121, which may be disposed on the substrate (e.g. a silicon substrate). In some cases, the anchoring point or region 119 of the beam 105, which is mechanically connected to the post 121, may be symmetrically positioned with respect to the first and second ends 112, 114, of the beam 105, such that a first distance (L) between the anchoring point or region 119 and the first end 112 is substantially equal to a second distance (L) between the anchoring point or region 119 and the second end 114.

In some embodiments, the beam 105 and the post 121 may comprise a conductive material, such as gold, aluminum, copper, nickel, a metal alloy or any other suitable electrically conductive material. In some cases, a structural material of the beam (e.g., the conductive material) may be selected to provide a desired level of stiffness to the beam 105, for example to avoid bending when subjected to a force or torque (e.g., electrostatic force or torque used to actuate the beam) during operation of the teeter-totter switch. In some embodiments, the beam 105 may comprise a single material or a uniform material composition (e.g., a single alloy). In other embodiments, the beam 105 may comprise a multilayer structure where at least two layers are composed of different materials. For example, the beam 105 may comprise a first structural material that provides mechanical stiffness and a second structural material that provides electric conductivity. In some cases, the beam 105 may comprise two separate regions having different material compositions.

In some cases, the beam 105 may be constructed to substantially resist bending during operation of the teeter-totter switch 100, while the hinge(s) that connect the beam 105 to the post 121 may be constructed to allow for rotation of the beam about the post 121.

In some embodiments, the middle electrode 120 may be electrically connected with the post 121. In some such embodiments, the middle electrode 120 may be formed between the post 121 and the substrate (not shown) and can be in direct contact with the post 121. In some embodiments, the middle electrode 120 can be electrically connected to a first terminal 102 (e.g., an input terminal) and one of the first and second contact electrodes 106, 109 (the second contact electrode 109 in the example shown), may be electrically connected to a second terminal 104 (e.g., an output terminal) of an electronic circuit (e.g., a circuit breaker). In some implementations, the first and second terminals 102, 104, can be high voltage input and low voltage outputs of a circuit breaker, respectively. In some embodiments, the teeter-totter switch 100 may be configured to control an electrical connection between the first and second terminals 102, 104, by closing and opening an electrical path between the first and second terminals 102, 104 via the beam 105 and the post 121. In some examples, when the teeter-totter switch is in an ON state, the second end 114 of the beam 105 can be in electrical contact with the second contact electrode 109 to establish a conductive path between the first and second terminals 102, 104. In some examples, when the teeter-totter switch 100 is in an OFF state, the first end of the beam 105 can be in electrical contact with the first contact electrode 106, and the second end 114 of the beam 105 can be at a vertical distance (Z1, along z-axis) from the second contact electrode 109 to electrically isolate the first and second terminals 102, 104. In some implementations, contact tips may be formed on either end of the beam 105 to improve electrical contact between the beam 105 and the respective contact electrodes 106, 109.

In some embodiments, the teeter-totter switch 100 may include a pair of control electrodes 108, 110, configured to form two capacitive actuators on opposite sides of the post 121 with respect to lateral direction (x-axis) where each capacitive actuator is formed between a control electrode and a portion of the beam 105 above the control electrode and is configured to exert an attractive force to the receptive portion of the beam 105 to pull down an end of the beam closer to the control electrode. In some examples, a first control electrode 108 may be formed between the first contact electrode 106 and the middle electrode 120 and/or the post 121 and a second control electrode 110 may be formed between the second contact electrode 109 and the middle electrode 120 and/or the post 121. In some cases, to change the state of the teeter-totter switch 100 from the OFF state to the ON state (e.g., to put the second end 114 of the beam 105 in contact with the second contact electrode 109), a sufficiently large voltage (herein referred to as switching voltage, $V_s$) may be applied across the second capacitor formed between the beam 105 and the second control electrode 110, and to change the state of the teeter-totter switch 100 from the ON state to the OFF state (e.g., to disconnect the first end 114 of the beam 105 from second contact electrode), a sufficiently large voltage (equal or larger than $V_s$) may be applied across the first capacitor formed between the beam 105 and the first control electrode 108. In some cases, in the OFF state, the first end 112 of the beam 105 can be in contact with the first contact electrode 106 (e.g., to maximize the OFF-state gap size Z1 and further to close the electric loop between the beam 105 and the post 121 when the middle electrode 120 is electrically connected to the first contact electrode 106). In some cases, the teeter-totter switch 100 can be in a neutral state when both ends of the beam 105 are disconnected from the respective contact electrodes.

In some embodiments, in the ON state, when the second contact electrode 109 is in contact with the second end 114, the resistance of an electrical path established by the teeter-totter switch 100, e.g., between the first and second terminals 102, 104, may change as a function of the electrostatic force applied on the beam 105, e.g., by providing a electric potential difference between the second control electrode 110 and the beam 105. As such, in some cases, a switching voltage, $V_s$, provided to the control electrode 110 may be larger than a voltage that not only puts the second end 114 in contact with the second contact electrode 109 but also provides a conductive path with a resistance lower than a desired value. In some cases, a switching voltage $V_s$ for actuating a MEMS switch from the OFF state to the ON state may be an actuation voltage that establishes a conductive path via the MEMS switch with a resistance equal or below a specified ON state resistance.

In some embodiments, when the teeter-totter switch 100 is in OFF state, a voltage difference provided between the first and second terminals 102, 104, may be limited by the vertical distance Z1, or the OFF-state gap of the teeter-totter switch 100, and the corresponding breakdown voltage between the second end 114 of the beam 105. As such it can be advantageous to increase the vertical distance Z1 such that the teeter-totter switch 100 can switch at larger voltages. In various implementations, Z1 can be increased by increasing one or both of the height of the post 121 (e.g., along the z-axis), the total length (2L) of the beam 105, and/or by bringing the post 121 closer to the first end 112 (making the teeter-totter switch asymmetric).

FIG. 1B schematically illustrates an asymmetric MEMS teeter-totter switch 150 according to embodiments. The teeter-totter switch 150 comprises a conductive post 123 positioned closer to a first end 116 of a conductive beam 107, relative to a second end 118 of the conductive beam 107 opposite the first end 116. In some embodiments, the teeter-totter switch 150 may comprise one or more features described above with respect to the teeter-totter switch 100. In some examples, a first distance (L1) between the anchoring point or region 127 of the beam 107 (where the beam 107 is mechanically connected to the post 123) and the first end 116 is smaller than a second distance (L2) between the anchoring region 127 of the beam 107 and the second end 118 by at least 3%, at least 5%, at least 7%, at least 10%, at least 15%, or at least 20%, or a value in a range defined by any of these values, of the total length of the conductive beam (e.g., L1+L2). In some embodiments, the post 123 can be disposed closer to the first end 116 relative to the second end 118 of the beam 107 by at least 3%, at least 5%, at least 7%, at least 10%, at least 15%, or at least 20% of the length of the conductive beam 107 (e.g., L1+L2). Advantageously, when the total lengths of the beams 105 and 107, and the heights of the posts 121 and 123 are substantially equal, and the teeter-totter switches 100 and 150 are in the OFF state, the vertical distance Z2 can be larger than the vertical distance Z1. As a result, the dielectric (air) gap between the second contact electrode 109 and second end 118 of beam 107 (OFF-state gap of the asymmetric teeter-totter switch 150) can have a larger breakdown voltage compared to the dielectric (air) gap between the second contact electrode 109 and the second end 114 of the beam 105 (OFF-state gap of the symmetric teeter-totter switch 100). As such, in some embodiments, an upper limit for the operating voltage ($V_m$) of the asymmetric teeter-totter switch 150 (FIG. 1B) can be greater than that of the symmetric teeter-totter switch 100 (FIG. 1A). Advantageously, the asymmetric teeter-totter switch 150 can be used in high voltage electronic circuits (e.g., high voltage circuit breakers) to control electrical connection between terminals having voltage differences greater than 100 volts, 150 volts, 200 volts, 300 volts, 400 volts, 500 volts, or a voltage in a range defined by any of these values, or larger values.

As disclosed herein, the first contact electrode 106 of the asymmetric teeter-totter switch 150, which is closer to the post 123, may be referred to as the back contact electrode of the asymmetric teeter-totter switch 150 and the second contact electrode 109 of the asymmetric teeter-totter switch 150, which is farther from the post 123 (compared to the first contact electrode 106), may be referred to as the front contact electrode of the asymmetric teeter-totter switch 150. In some cases, the terminals of an electronic circuit (e.g., a circuit breaker circuitry) may be electrically connected to the middle electrode 125 and the front contact electrode 109 of the asymmetric teeter-totter switch 150, such that in the OFF state, the electric isolation is provided by the gap between the second end 118 of the beam 107 and the front contact electrode 109 that is larger, thereby allowing for tolerance against a larger voltage difference. In some such cases, the teeter-totter switch 150 may be configured as a two-port device and the middle electrode 125 can be electrically connected to the first contact electrode 106.

As disclosed herein, a MEMS switch such as an asymmetric teeter-totter switch may be referred to as being activated when the end of the conductive beam that is farther away from the conductive post is lifted and not in electrical contact with the respective contact electrode. For example, the asymmetric teeter-totter switch 150 as illustrated in FIG. 1B may be referred to as being in the activated state, with the second contact electrode 109 and the second end 118 of the beam 107 are electrically disconnected from each other. Conversely, a MEMS switch such as an asymmetric teeter-totter switch may be referred to as being deactivated when the end of the conductive beam that is closer to the conductive post is lifted and not in electrical contact with the respective contact electrode. For example, the asymmetric teeter-totter switch 150 may be referred to as being in the deactivated state when the first contact electrode 106 and the first end 116 of the beam 107 are electrically disconnected from each other.

In some various implementations, MEMS teeter-totter switches 100 and 150 may be used to disable/enable the electrical connection between two circuit elements, or to route signals to/from one of two circuit elements. In yet other embodiments, multiple teeter-totter switches may be used to perform more complex functions.

Figures 2A, 2B, 2C:
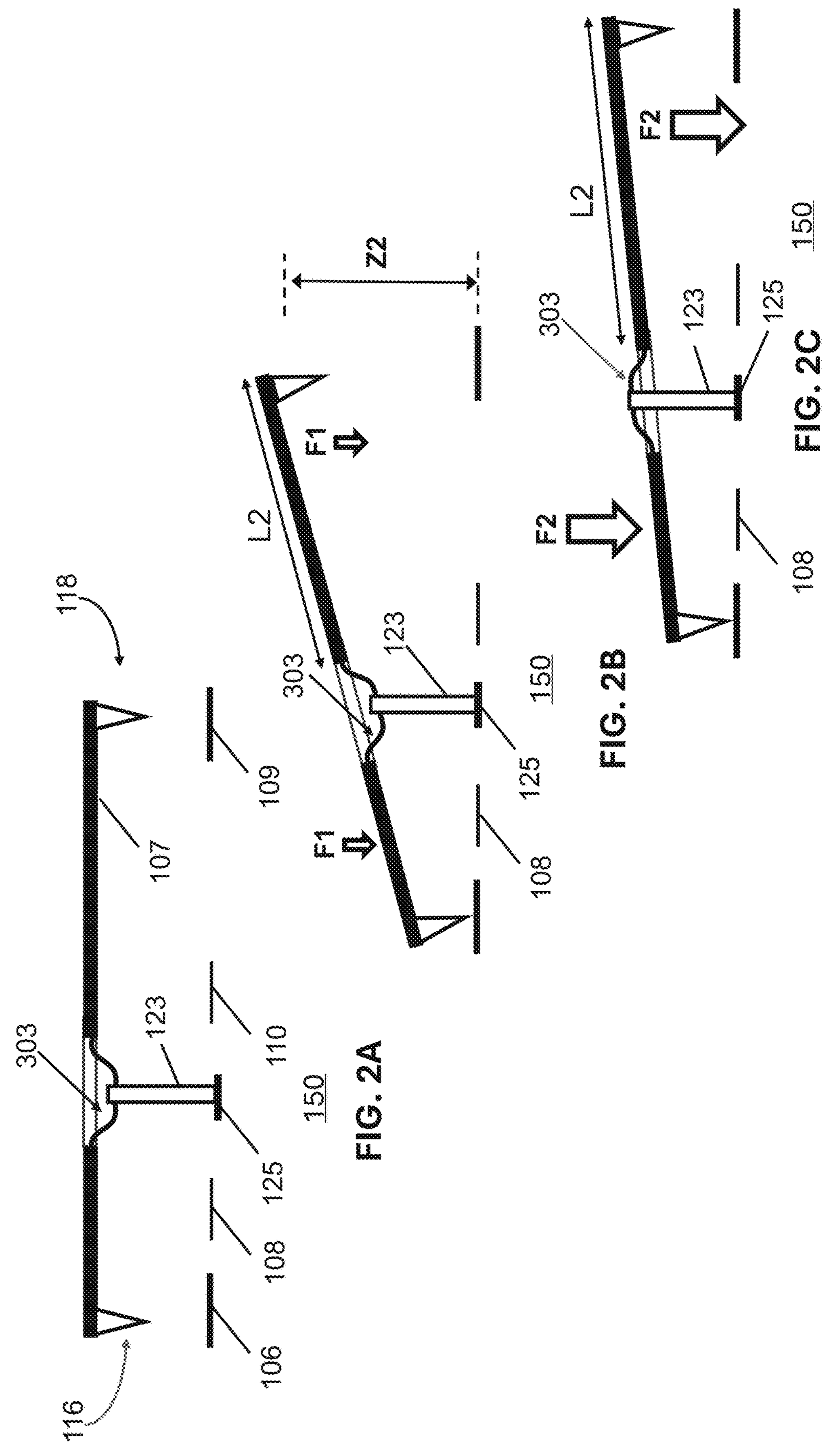
FIGS. 2A-2C schematically illustrate the asymmetric MEMS teeter-totter switch shown in FIG. 1B in a neutral state (FIG. 2A), in a first OFF state (FIG. 2B) actuated by a first actuation voltage, and a second OFF state (FIG. 2C) actuated by a second actuation voltage greater than the first actuation voltage.

FIGS. 2A-2C schematically illustrate the asymmetric MEMS teeter-totter switch 150 in a neutral state (FIG. 2A), when the voltage difference between the control electrodes 108 and 110, and the beam 107 is substantially zero (FIG. 2A), and when first and second voltage differences, V1 and V2, are applied between the control electrode 108 and the beam 107 (FIGS. 2B and 2C, respectively), to actuate the teeter-totter switch into the OFF state (e.g., the state in which the first end 116 of the beam 107 is in contact with the first contact electrode 106). In some cases, V1 and V2 may be configured to counter electrostatic forces exerted between the second end 118 and the second contact electrode 109 (e.g., due to the voltage difference between the middle electrode 125 and the second contact electrode 109) and to maintain the OFF-state gap (e.g., Z2). In some cases, the voltage difference between the second end 118 of the beam 107 and the front contact electrode 109 can be larger in FIG. 2C compared to FIG. 2B. As such V2 may be greater than V1 to counter the larger attractive electrostatic force between the second end 118 and the front contact electrode 109 and maintain vertical distance Z2 between them. As shown in FIGS. 2A-2C, actuating and tilting the beam 107 can induce mechanical stress in the hinge 303 that connects the beam 107 to the post 123, and a larger electrostatic force (F2) applied closer to the first end 116 (via the control electrode 108), e.g., to counter the electrostatic force pulling the second end 118, may result in significant clastic deformation of the hinge 303 (as shown in FIG. 2C). In some examples, the elastic deformation of hinge 303 may reduce the vertical distance Z2 and reduce the corresponding breakdown voltage. In some embodiments, the mechanical stress and deformation induced in hinge 303, beam 107 may increase when length L2 is increased to increase the operational voltage of the teeter-totter switch.

The inventors have discovered that the mechanical stress and deformation induced in the hinge 303, post 123, and/or the beam 107 can be reduced by providing a mechanical stopper between beam 107 and the substrate on which the teeter-totter switch is formed, such that a major portion of the mechanical load resulting from the electrostatic forces applied on the teeter-totter switch structure is carried by the mechanical stopper and is transferred to the substrate. In some embodiments, the mechanical stopper may be formed at a bottom surface of the beam 107 and extend towards the substrate. In some cases, the mechanical stopper may not be connected to the substrate and may freely move or rotate with respect to the substrate while being in contact with the substrate via a bottom surface (e.g., a curved surface). In some cases, upon actuation (e.g., activation or deactivation) of the MEMS switch, the mechanical stopper may contact the substrate to serve as a fulcrum and to substantially limit an elastic deformation of one or more of the beam 107, the post 123, or the hinge 303.

Figures 3A, 3B, 3C:
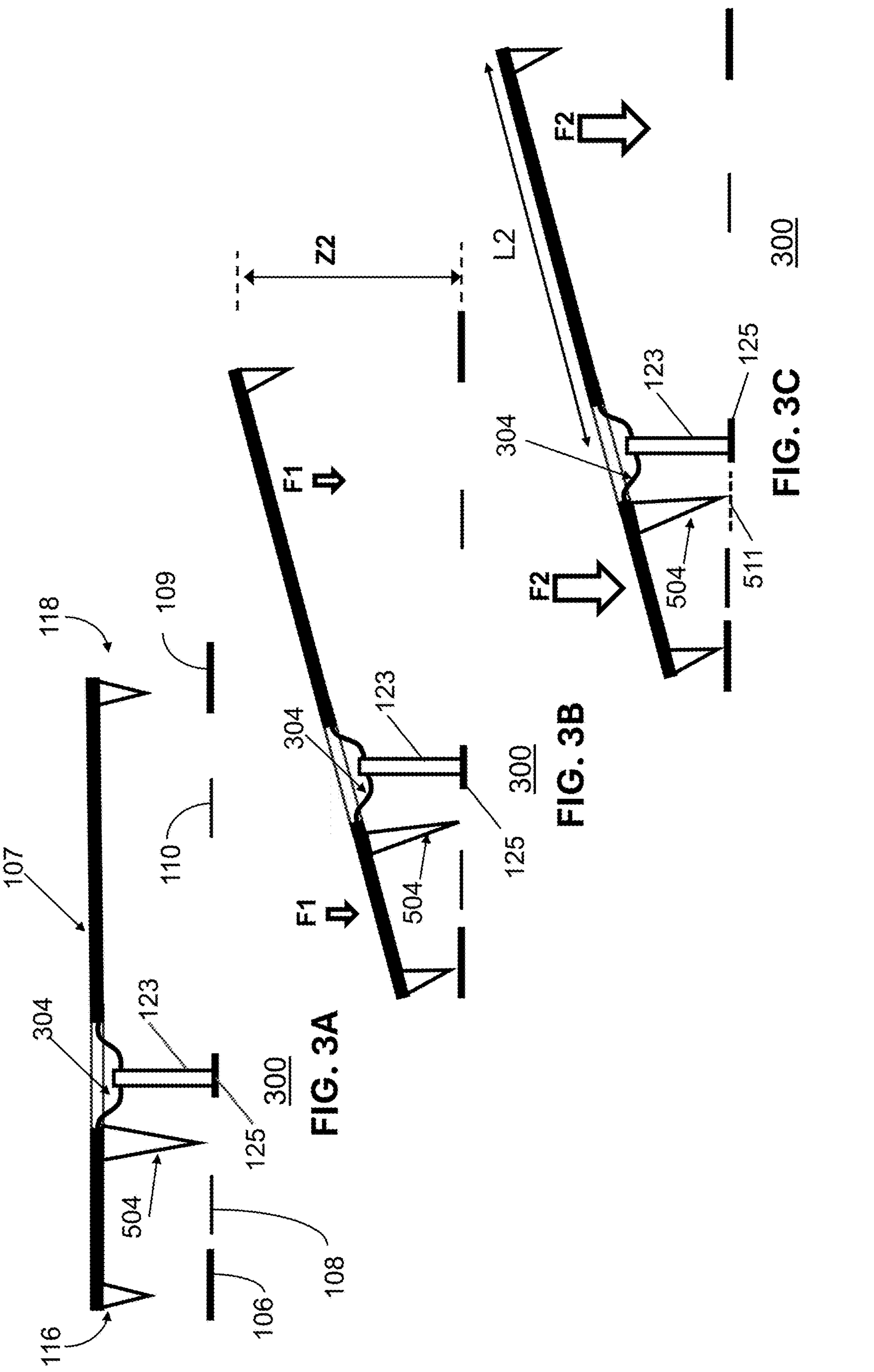
FIGS. 3A-3C schematically illustrate an example asymmetric MEMS teeter-totter switch having a stopper, in a neutral state (FIG. 3A), in a first OFF state (FIG. 3B) actuated by a first actuation voltage, and a second OFF state (FIG. 3C) actuated by a second actuation voltage greater than the first actuation voltage.

FIGS. 3A-3C schematically illustrate an asymmetric MEMS teeter-totter switch 300 having a mechanical stopper 504 in a neutral state (FIG. 3A), when the voltage difference between the control electrodes 108 and 110, and the beam 107, is substantially zero, and when first and second voltage differences, V1 and V2, are applied between the control electrode 108 and the beam 107 (FIGS. 3B and 3C, respectively) to actuate the teeter-totter switch into the OFF state (e.g., put the first end 116 of the beam 107 in contact with the first contact electrode 106). Similar to FIGS. 2A-2C, the voltage difference between the second end 118 of the beam 107 and the front contact electrode 109 can be larger in FIG. 3C compared to FIG. 3B. In some embodiments, the teeter-totter switch 300 shown in FIGS. 3A-3C may comprise one or more features described above with respect to the teeter-totter switch 150 shown in FIGS. 1B, and 2A-2C. In some embodiments, the mechanical stopper 504 may be formed at a bottom surface of the beam 107 and extend towards the substrate (not shown). In some cases, when the teeter-totter switch is in neutral state (FIG. 3A), the mechanical stopper 504 may not be in contact with the substrate. In some embodiments, when the teeter-totter switch is actuated and the beam 107 tilts (FIG. 3B), e.g., by applying a voltage difference between the first control electrode 108 and the beam 107, the mechanical stopper 504 may contact the substrate to limit (e.g., substantially limit) the stress an elastic deformation generated in the hinge 304, and in some cases, in the post 123 and/or beam 107. In some embodiments, when the MEMS teeter-totter switch 300 is actuated, the mechanical stopper 504 may serve as a mechanical pivot (or fulcrum) and the post 123 may serve as conductive path between the beam 107 and the middle electrode 125, and as an anchor that provides a mechanical connection between the beam 107 and the substrate (via the hinge 304). In some cases, the hinge 304 may be configured to provide mechanical connection between the post 123 and the beam 107 without significantly limiting the motion (e.g., rotational motion) of the beam 107 with respect to the post 123. For example, the hinge 304 can be thinner, narrower, or otherwise have smaller dimensions compared to the hinge 303 of the teeter-totter switch 150 that does not have a mechanical stopper. For example, the hinge 303 may comprise multiple segments connecting the post 123 to the beam 107 and the hinge 304 may comprise a single segment connecting the post 123 to the beam 107.

As shown in FIGS. 3A-3C, actuating and tilting the beam 107 can put the stopper 504 in contact with the substrate and once the stopper 504 contacts the substrate it may serve as a mechanical pivot to reduce mechanical stress in the hinge 304 such that the larger electrostatic force (F2) applied close to the first end 116 (via the control electrode 108), does not result in a significant deformation of the hinge 304 (as shown in FIG. 3C). In other words, the mechanical stopper 504 can significantly reduce or essentially eliminate the elastic deformation of the hinge 304 and can maintain the vertical distance Z2 at a desired value (or within a desired range) as the force exerted on the beam 107 increase (e.g., to switch a greater voltage). In some cases, the stopper 504 may allow for increasing of the length L2, and thereby the operating voltage ($V_m$) of the teeter-totter switch.

In some embodiments, the mechanical stopper 504 may comprise a conductive material. In some such embodiments, the mechanical stopper 504 may simultaneously serve as the mechanical pivot and as a conductive path or a supplemental conductive path between the beam 107 and the middle electrode 125. In some examples, an additional middle electrode 511 may be formed on the substrate below the stopper 504 such that when the teeter-totter switch 300 is actuated, the stopper 504 contacts the additional middle electrode 506 and establishes a conductive path between the beam 107 and the additional middle electrode 506. In some embodiments, the additional middle electrode may be electrically connected to the middle electrode 125. As such, in some implementation, the mechanically stopper 504 may provide conductive paths parallel to the conductive path provided by the post 123 to reduce a resistance between the beam 107 and the middle electrode 125 and thereby increase the current handling limit of the teeter-totter switch 300.

In various implementations, the mechanical stopper 504 can be positioned at the same or different longitudinal positions as the post 125 with respect to the beam 107. For example, the mechanical stopper can be closer to the first end 116, e.g., to provide a larger OFF-state gap (Z2) and/or support more mechanical load during the OFF state. It should be understood that in the OFF state, a larger actuating force may be applied on the beam 107 to counter the attractive force generated by the voltage between the beam 107 and the front contact electrode 109, compared to the ON state where the actuating force does not counter any opposing electrostatic force.

In addition to high voltage enabling features such as the asymmetrically positioned post and mechanical stoppers, the teeter-totter switches can further be configured for high current applications by dividing the current flow between the beam and multiple contact electrodes (e.g., multiple electrically connected contact electrodes distributed below an end of the beam).

Figure 4B:
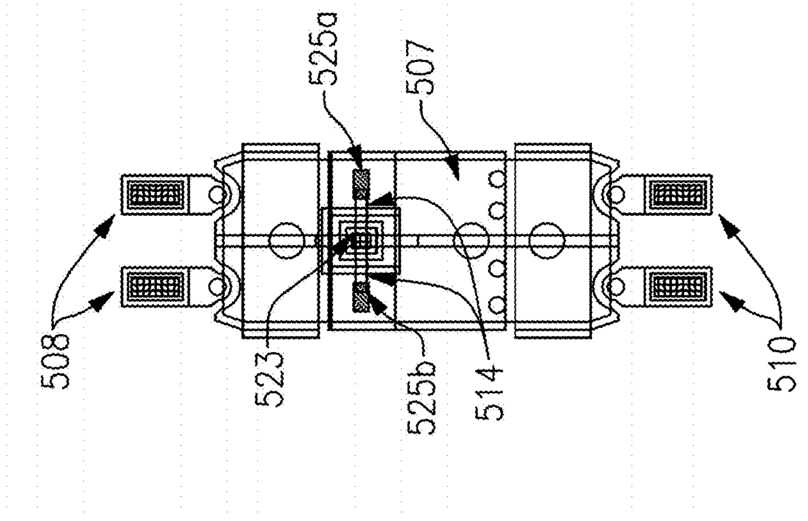
FIG. 4B is a schematic diagram illustrating a top-view of an example asymmetric MEMS teeter-totter switch having two mechanical stoppers.
Figure 4A:
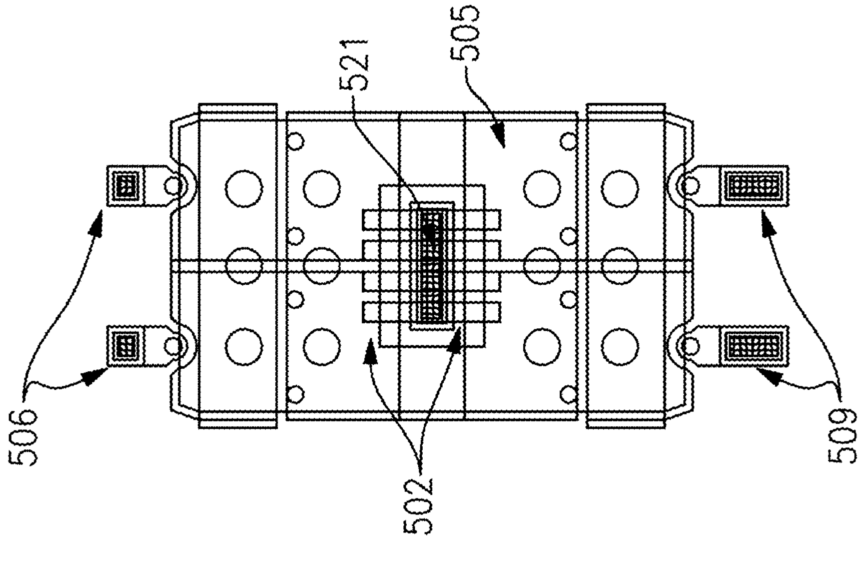
FIG. 4A is a schematic diagram illustrating a top-view of an example symmetric MEMS teeter-totter switch.

FIG. 4A is a schematic diagram illustrating top-view of a symmetric MEMS teeter-totter switch (similar to MEMS teeter-totter switch 100) comprising a conductive beam 505 connected to a rectangular post 521 by a multi-segment hinge 502 where the post 521 anchors the beam 107 to a substrate, via the multi-segment hinge 502, and serves as a mechanical pivot. In the example shown, the symmetric MEMS teeter-totter switch includes a first pair of contact electrodes 506 below a first longitudinal end (edge) of the beam 505 and a second pair of contact electrodes 509 below a second longitudinal end (edge) of the beam 505.

FIG. 4B is a schematic diagram illustrating top-view of an asymmetric MEMS teeter-totter switch comprising a conductive beam 507 connected to a square shape post 523 by a hinge 514, and two mechanical stoppers 525*a*, 525*b*, formed at opposite sides (e.g., opposite lateral sides) of the post 523 under the beam 507. In some cases, the hinge 514 can be a single segment hinge and/or can be thicker than the multi-segment hinge 502 in FIG. 4A. In some cases, the post 523 may have a smaller cross-sectional area compared to the rectangular post 521. In some embodiments, the post 523 may anchor the beam 507 to the substrate and may electrically connect the beam 507 to a middle electrode formed on the substrate (not shown). In some cases, the mechanical stoppers 525*a*, 525*b*, under the beam 507 may function as a mechanical pivot when the beam 507 rotates with respect to the post 523. In some such cases, the hinge 514 may stabilize the beam 507 by maintaining lateral and longitudinal positions of the beam 507 with respect to the post 523 as the beam 507 pivots. The asymmetric MEMS teeter-totter switch shown in FIG. 4B may include a first pair of contact electrodes 508 below a first longitudinal end (edge) of the beam 507 and a second pair of contact electrodes 510 below a second longitudinal end (edge) of the beam 507.

Figure 5A:
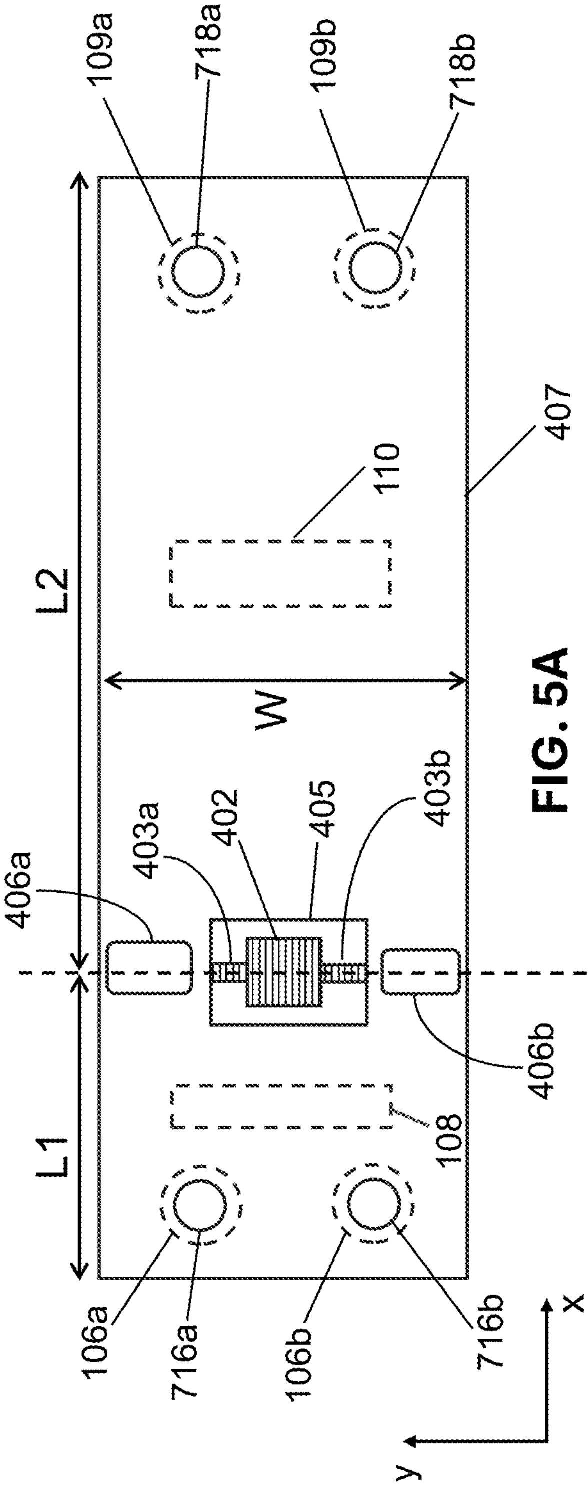
FIGS. 5A-5B are schematic diagrams illustrating a top-view (FIG. 5A) and a side cross-sectional view (FIG. 5B) of an example asymmetric MEMS teeter-totter switch having two mechanical stoppers.
Figure 5B:
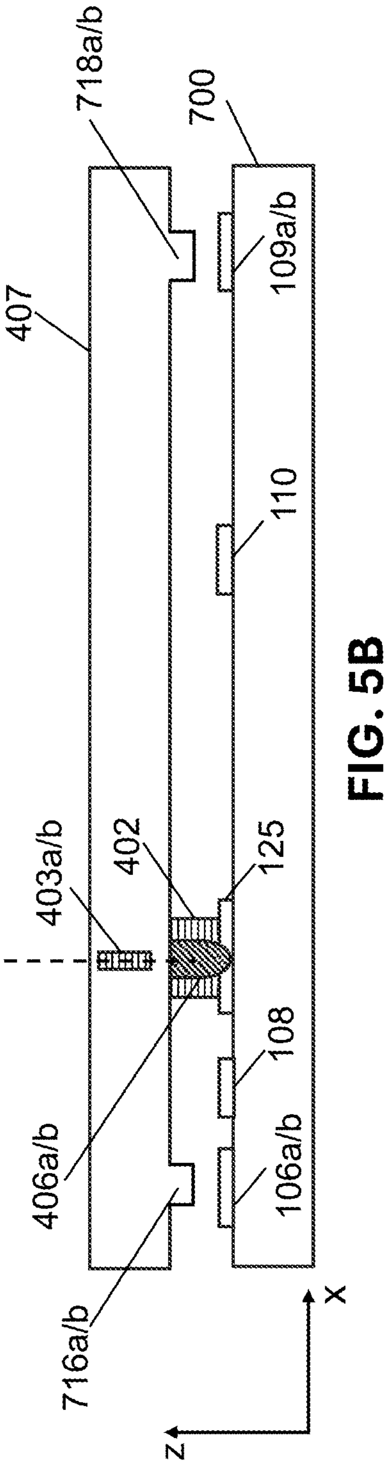

FIGS. 5A-5B are schematic diagrams illustrating a top-view (FIG. 5A) and a side cross-sectional view (FIG. 5B) of an example asymmetric MEMS teeter-totter switch according to some embodiments disclosed herein. In the example shown the teeter-totter switch shown in FIGS. 5A-5B may comprise a rectangular beam 407 mechanically connected to a substrate 700 via two hinges 403*a*, 403*b*, and a post (anchor) 402. In some cases, the post 402 may be formed on the substrate 700 and the two hinges 403*a*, 403*b*, may connect a region of the beam 407 closer to a first end of the beam 407 to the post 402. In some embodiments, the post 402 may be configured to electrically connect the beam 407 to the middle electrode 125. In some cases, the post 402 may be formed from a conductive material or at least comprise a conductive path extending from the hinges 403*a*, 403*b*, to the middle electrode 125 and electrically connection g the middle electrode 125 to the post 402, e.g., via the hinges 403*a*, 403*b*. In some examples the post 402 may comprise gold, doped gold, nickel, doped nickel, platinum, ruthenium, or an alloy formed by these materials or other conductive materials.

In some embodiments, the teeter-totter switch shown in FIGS. 5A-5B may comprise two mechanical stoppers 406*a*, 406*b* disposed at opposite lateral sides of the post 402 and configured to mechanically support the beam 407, e.g., when it is actuated and rotates with respect to the post 402 and the substrate 700. In some embodiments, the mechanical stoppers may be formed on a bottom surface of the beam 407 (facing the substrate 700) and can be vertically extended toward the substrate 700. In some cases, the stoppers 406, 406*b* may be configured to provide additional mechanical connection between the beam 407 and the substrate 700, allow the beam 407 to pivot around a contact point between the stopper 504 and the substrate 700, and reduce the mechanical stress on the hinges 403*a/b* and the post 402 when the teeter-totter switch is actuated. In some examples, bottom surfaces of one or both mechanical stoppers 406*a*, 406*b*, may be shaped to allow each mechanical stopper to pivot around a contact point between the mechanical stopper and the substrate 700. For example, the bottom surface of a mechanical stopper may comprise a round shape. In some examples the mechanical stoppers 406*a*, 406*b*, may comprise gold, doped gold, nickel, doped nickel, platinum, ruthenium, or an alloy formed by these materials or other conductive materials. In some cases, the hinges 403*a*, 403*b*, may be configured to allow the beam 407 tilt with respect to the substrate 700 while maintaining mechanical connection between the beam 407 and the post 402. In some examples, the region of the beam 407 connected to the post 402 may comprise an opening 405 configured to allow rotation of the beam 407 within a specified angular range without touching the post 402. In some embodiments, at least a portion of each of one the beam 407, the post 402, and the hinges 403*a*, 403*b* may comprise conductive material and may be configured to provide a conductive path between the end regions of beam 407, above the respective contact electrodes, and a contact electrode 125 formed on the substrate 700. In various implementations, the hinges 403*a*, 403*b* may comprise gold, doped gold, nickel, platinum, ruthenium, or other conductive materials. In some cases, the middle electrode 125 may be formed between the post 402 and the substrate 700. In some embodiments, the width (e.g., along x-axis) of the hinges 403*a*, 403*b*, can be from 1 to 3 microns, from 3 to 5 microns, from 5 to 10 microns or any ranges formed by these values or larger or smaller values. In some embodiments, the length (e.g., along y-axis) of the hinges 403*a*, 403*b*, can be from 1 to 5 microns, from 5 to 10 microns, from 10 to 15 microns, 15 to 20 microns or any ranges formed by these values or larger or smaller values.

In some embodiments, the post 402, the opening 405, and the mechanical stoppers 406*a*, 406*b*, can be closer to the first end or edge (e.g., back end) of the beam 407. For example, a longitudinal distance L1 (e.g., along the length of the beam 407) between the post 402 and the back end of the beam 407 can be greater than a longitudinal distance L2 between the post 402 and the front end of the beam 407. In some implementations, a ratio between L2 and L1 (L2/L1) can be larger than 1.05, larger than 1.1, larger than 1.2, larger than 1.3, larger than 1.5, larger than 1.7, larger than 2 or larger values. In some embodiments, L2 can be larger than L1 by at least 3%, at least 5%, at least 7%, at least 10%, at least 15%, or at least 20% of total length of the beam 407 (e.g., L1+L2). In some embodiments, the post 402 can be disposed closer to the first end relative to the second end of the beam 407 by at least 3%, at least 5%, at least 7%, at least 10%, at least 15%, or at least 20% of the length of the conductive beam 407 (e.g., L1+L2).

In various implementations, at least a portion of the beam 407 may comprise a conductive material. In some examples, the beam 407 may comprise a conductive region providing electrical connection between contact tips 716*a*, 716*b*, disposed car the first edge of the beam 407, the hinges 403*a*, 403*b*, and thereby the post 402, and the contact tips 718*a*, 718*b*, disposed near the second edge of the beam 407. In various implementations, the beam 407 may comprise gold, doped gold, nickel, doped nickel, platinum, ruthenium, or an alloy comprising these materials or other conductive materials.

With continued reference to FIGS. 5A-5B, in some cases, the beam 107 may comprise a first pair of conductive contact tips 716*a*, 716*b* near a first end or end region (e.g., back end) of the beam 407 and a second pair of conductive contact tips 718*a*, 718*b* near a second end or end region (e.g., front end) of the beam 407 opposite to the first end. In some examples, the beam 107 and the contact tips 716*a*/716*b* or 718*a*/718*b* may comprise a conductive material. In some cases, the contact tips 716*a*/716*b* or 718*a*/718*b*, may be electrically connected to the post 402 via a conductive region of the beam 407 and the two hinges 403*a*, 403*b*.

In some cases, the first pair of the contact tips 716*a*/716*b* may be positioned above a first pair of contact electrodes 106*a*/106*b* formed on the substrate 700 and the second pair of the contact tips 718*a*/718*b*, may be positioned above a second pair of front contact electrodes 109*a*/109*b* to allow electrical contact between the first pair of the contact electrodes 106*a/b* and the first pair of contact tips 716*a/b*, or between the second pair of the contact electrodes 109*a/b* and the second pair of contact tips 718*a/b*, when the teeter-totter switch is actuated.

In some cases, first (front) and second (back) control electrodes 108, 110 formed on the substrate 700 may be configured to capacitively actuate the teeter-totter switch and pivot the beam 407 around the contact points between the stoppers 406*a*, 406*b*, and the substrate 700. In some cases, a bottom surface of the stoppers 406*a*, 406*b*, that become in contact with the substrate 700 may comprise a curved surface having a radius of curvature from 0.5 to 1 micron, from 1 to 5 microns, from 5 to 10 microns or any ranges formed by these values or larger or smaller values. In some cases, the width of the stoppers 406*a*, 406*b* (e.g., along x-axis) can be from 0.5 to 1 micron, from 1 to 5 microns, from 5 to 10 microns or any ranges formed by these values or larger or smaller values. In some embodiments, e.g., when the teeter-totter switch is configured as a two-port device, e.g., in a circuit breaker, the teeter-totter switch may be deactivated from the OFF state to the ON state by providing a voltage difference between the front control electrode 110 and the beam 407 to pull the front end of the beam 407 toward the substrate 700 to bring the contact tips 718*a*/718*b*, into contact with the respective front contact electrodes 109*a*/109*b*. In some such embodiments, the teeter-totter switch may be activated from the ON state to the OFF state by providing a voltage difference between the back control electrode 108 and the beam 407 to pull the back end of the beam 407 toward the substrate 700 to bring the contact tips 716*a*/716*b*, into contact with the respective back contact electrodes 106*a*/106*b*. It should be understood that in the contest of a circuit breaker circuitry activation (e.g., activation of the circuit breaker and the MEMS switch therein) may comprise breaking an electrical connection between two terminals and deactivation (may comprise an electrical connection between two terminals and deactivation may comprise establishing an electrical connection between the two terminals.

In some embodiments, the back contact electrodes 106*a*/106*b* may be electrically connected to the middle electrode 125 and the post 402, e.g., via one or more conductive lines formed over or in the substrate 700.

It should be understood that the embodiment shown in FIGS. 5A-5B is a non-limiting example of an asymmetric teeter-totter switch having a stopper and other configurations are possible. For example, the beam 407 may include one or more than two contact tips near each edge (end), number of contact tips near the two edges can be different, the contact tips of a pair of contact tips near the same edge may be positioned at two different distances from the post 402, the opening 405 may have different geometries, more than two hinges may secure the beam 407 to the post 402, multiple posts may be used to anchor the beam 107 to the substrate 700, the stopper 504 may have different geometries; other variations are possible, e.g., thickness of respective layers, shape of stopper, shape of the post, and the like, may vary in different examples.

In some embodiments, the width (W) of a teeter switch (e.g., teeter-totter switch shown in FIG. 5A) can be from 20 microns to 50 microns, from 50 to 70 microns, from 70 to 100 microns, from 100 to 150 microns, from 150 to 200 microns, or a value that is in a range defined by any of these values or larger or smaller. In some embodiments, the length (L=L1+L2) of a teeter switch (e.g., teeter-totter switch shown in FIG. 5A) can be from 30 to 60 microns, from 60 to 100 microns, from 100 to 150 microns, from 150 to 200 microns, from 200 to 250 microns, from 250 to 300 microns, a value that is in a range defined by any of these values or larger or smaller. In some embodiments, the width (e.g., along y-axis) of the opening 405 can be from 10 to 50 microns, from 50 to 100 microns, from 100 to 150 microns, or a value that is defined in a range defined by any of these values or larger or smaller. In some embodiments, the length (e.g., along x-axis) of the opening 405 can be from 10 to 50 microns, from 50 to 100 microns, from 100 to 150 microns, or a value that is in range defined by any of these values or larger or smaller.

Figure 6B:
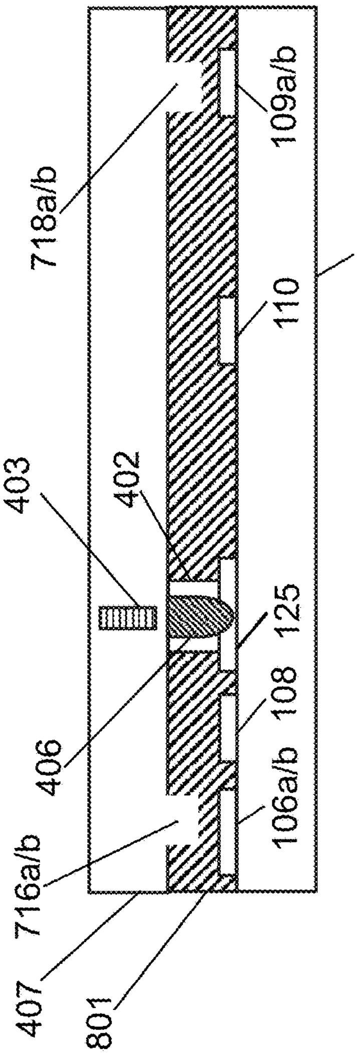
FIGS. 6A-6C illustrate side cross-sectional views of intermediate structures at various stages of fabricating the asymmetric MEMS teeter-totter switch shown in FIG. 5A-5B.
Figure 6A:
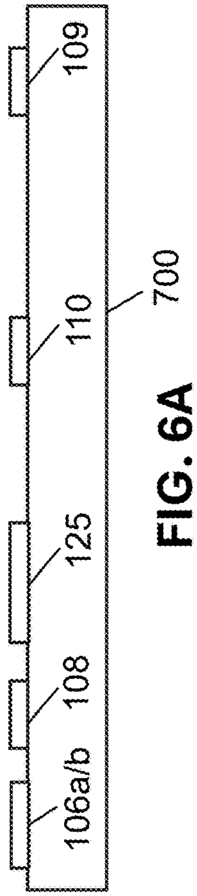
Figure 6C:
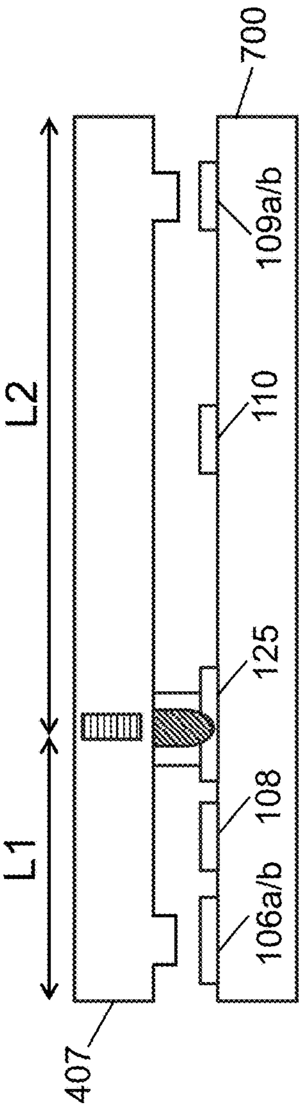

FIGS. 6A-6C illustrate side cross-sectional views of intermediate structures at various stages of fabricating of the asymmetric MEMS teeter-totter switch described above with respect to FIGS. 5A-5B.

Referring to FIG. 6A, the substrate 700 may be provided and back and front contact electrodes 106/*a/b*, 109*a/b*, middle electrode 125, and control electrodes 108 and 110, may be formed on a major top surface of the substrate 700, e.g., by forming (e.g., depositing) and patterning a conductive layer over the substrate 700. In some embodiments, the major top surface of the substrate 700 may comprise a layer of silicon dioxide (or another dielectric layer) and the electrodes 106, 109, 125, 108, 110 may be formed on the silicon dioxide layer. In some cases, the conductive layer may comprise a metallic layer and patterning the conductive layer may comprise photolithography patterning of a photoresist layer deposited on the contrive layer and etching the uncovered portions of the conductive layer. In some embodiments, the substrate 700 may comprise silicon, alumina, and/or silicon dioxide, or another other suitable material or combination of materials. In some embodiments, the metallic layer may comprise gold, aluminum, copper, or an alloy comprising these other metals.

Referring to FIG. 6B, a sacrificial layer 801 may be formed on the substrate 700 and the electrodes thereon 106, 108, 125, 110 and 109, and the beam 407 may be formed on the sacrificial layer 801, e.g., by depositing and patterning a structural material (e.g., a metal). In some implementations, the sacrificial layer 801 may comprise silicon dioxide, polymer, and/or a metal. In some examples, the thickness of the sacrificial layer 801 can be from 50 nm to 5 μm. In some cases, the thickness of the sacrificial layer 801 may define the vertical separation between the beam 407 and the top major surface of the substrate 700 when the teeter-totter switch is in the neutral state.

In some cases, the structural material of the beam 407 may comprise a conductive material (e.g., a metal). In some cases, forming the beam 407 may comprise patterning the sacrificial layer such that deposition of a metallic layer (or another structural material) over the patterned sacrificial layer results in formation of at least two conductive contact tips 716*a/b*, 718*a/b*, and a stopper 406 under the beam 407. For example, the sacrificial layer 801 may be patterned and/or fully etched to form one or more openings and a metal may be deposited in the openings to form the conductive contact tips 716*a/b*, 718*a/b*, the stopper 406 under beam 407. In some examples, the contact tips 716*a/b*, 718*a/b*, and the stopper 406 may be connected to the main bottom surface of the beam 407. Additionally, in some implementations, formation of the beam 407 may comprise formation of one or more posts 402 on the substrate 700 and one or more hinges 403 that mechanically connect the beam 407 to the post 402.

In some cases, the sacrificial layer 801 may be fully etched in a region where the post (anchor), which mechanically supports and connects the beam 407 to the substrate 700. In some embodiments, sacrificial layer 801 may be partially etched in regions corresponding to form conductive contact tips 716*a/b*, 718*a/b* and the stopper 406.

In some embodiments, the metal may be deposited as a blanket on the sacrificial layer 801, and the conductive contact tips 716*a/b*, 718*a/b*, stopper 406, or the post 402 may be formed by etching the metal outside the desired regions.

In some cases, at least the conductive beam 407, the contact tips 716*a/b*, 718*a/b*, and the stopper 406 can be different portions of a single structure formed over the sacrificial layer 801. In some embodiments, the two contact tips 716*a/b*, 718*a/b* may be formed above the back and front contact electrodes 106, 109, and the post 402, may be formed above the middle electrode 125. In some embodiments, a thin portion of sacrificial layer may exist between the stopper 406 and substrate 700. In some examples, the stopper 406 can be in contact with but not connected to the substrate 700 such that in the absence of the sacrificial layer it can move away from the substrate 700. In some embodiments, the middle electrode 125 may be formed under the post 402, where the post 402 mechanically connects the beam 407 to the substrate 700.

Referring to FIG. 6C, the sacrificial layer 801 may be removed to release the beam 407 and the stopper 406 connected to the beam 407 and to form a large gap between the beam 407 and, in some cases, a small gap between the stopper 504 and the substrate 700. In some embodiments, sacrificial layer 801 may be removed through a wet etch process.

It should be appreciated that FIGS. 6A-6C illustrate an example fabrication sequence for fabricating an asymmetric MEMS teeter-totter switch using a single sacrificial layer and two electroplating steps; however, asymmetric MEMS teeter-totter switches according to at least some aspects of the present application may be fabricated using a different number of sacrificial layers and/or electroplating steps and also combining structures and materials chosen depending on the specific requirements of the application.

Circuit Breaker Circuitry Including MEMS Switch

In some embodiments, various MEMS switches disclosed herein, including e.g., the symmetric teeter-totter switch 100 (FIG. 1A) or the asymmetric teeter-totter switches 150 (FIG. 1B and FIGS. 2A-2C), 300 (FIGS. 3A-3C) may be used as part of a circuit breaker circuitry to electrically connect or disconnect two terminals thereof. In various implementations, the state of the teeter-totter switch may be controlled by a user or an electronic circuit configured to change the state of the teeter-totter switch from ON state to OFF state upon receiving a sensor signal indicative of a malfunction (e.g., excessive voltage or current) in the circuit.

In some embodiments, two terminals (e.g., input and output terminals) of a circuit (e.g., a circuit breaker circuitry) may be electrically connected to the middle electrode 120, 125 (and thereby to the post 121, 123) and one of the two contact electrodes of a teeter-totter switch (e.g., symmetric teeter-totter switch 100 or the asymmetric teeter-totter switches 150, 300). In some embodiments, a high voltage terminal (e.g., high voltage input terminal) may be electrically connected to the middle electrode 120, 125, and a low voltage terminal (e.g., a low voltage output terminal) may be connected to contact electrode. In some of these embodiments, the middle electrodes 120, 125 may be electrically connected to the other contact electrode of the teeter-totter switch and the teeter-totter switch may be configured as a two-port MEMS switch. Advantageously, in some cases, such teeter-totter switch configured as a two-port MEMS switch may be controlled using smaller actuation voltages, may be used to switch larger voltages, and may be less prone to mechanical failures, compared to a cantilever-based MEMS switch.

As described above, a first contact electrode 106 of the asymmetric teeter-totter switch 150 (or 300), herein referred to as the back contact electrode, can be closer to the post 123, and a second contact electrode 109 of the asymmetric teeter-totter switch 150 (or 300), herein referred to as the front contact electrode, can be farther from the post 123 (compared to the back contact electrode). In some embodiments, when an asymmetric teeter-totter switch is configured as a two-port switch, the middle electrode 125 (and thereby the post 123) can be electrically connected to a high voltage terminal of a circuit (e.g., a circuit breaker circuitry) and the front contact electrode 109 of the asymmetric switch may be electrically connected to a low voltage terminal of the circuit. However, the embodiments are not so limited and in some cases, when the asymmetric teeter-totter switch is configured as a two-port switch, the middle electrode 125 (and thereby the post 123) can be electrically connected to a low voltage terminal of the circuit and the front contact electrode 109 may be electrically connected to a high voltage terminal of the circuit. In some such embodiments, the back contact electrode 106 may be electrically shorted to the middle electrode 125 and the conductive post 123. Advantageously, using the front contact electrode 109 (instead of the back contact electrode 106) and the middle electrode 125 of an asymmetric teeter-totter switch 150 as the port, to control the electrical connection between the two terminals of a circuit, can increase the operating voltage for the teeter-totter switch since in the OFF state the voltage drops over the larger gap (Z2) between the second end 118 of the teeter-totter switch 150, 300 and the front contact electrode 109.

In some embodiments, multiple MEMS teeter-totter switches may be combined to form a MEMS switch network or circuit configured to switch voltages greater than the operating voltages of individual switches. In some implementations, the MEMS switch network or circuit may comprise any MEMS teeter-totter switch disclosed herein, e.g., the MEMS teeter-totter switches 100, 150, or 300. In some examples, a MEMS switch network or circuit may comprise at least one MEMS teeter-totter switch. In some examples, the at least one teeter-totter switch may be configured as a two-port device by electrically connecting its middle electrode 125 to one of its contact electrodes (e.g., the back contact electrode 106 for an asymmetric teeter-totter switch) as described above.

In some embodiments, two MEMS teeter-totter switches (e.g., symmetric or asymmetric teeter-totter switches) may be connected in series to control electric connection between two terminals of an electronic circuit, (e.g., two terminals of a circuit breaker) to increase the upper limit for the voltage difference between the two terminals. For example, when two teeter-totter switches (e.g., two identical teeter-totter switches) each can switch off voltages up to the corresponding operating voltage ($V_m$), they can be combined in series to switch off voltages up to $2V_m$, where the voltage drop across each teeter-totter switch, does not exceed $V_m$. It will be appreciated that embodiments are not so limited, and in some implementations, the two teeter-totter switches, which are combined in series, may be different (e.g., may have different operating voltages), and/or more than two teeter-totter switches can be connected in series for even higher voltage applications.

Figure 7:
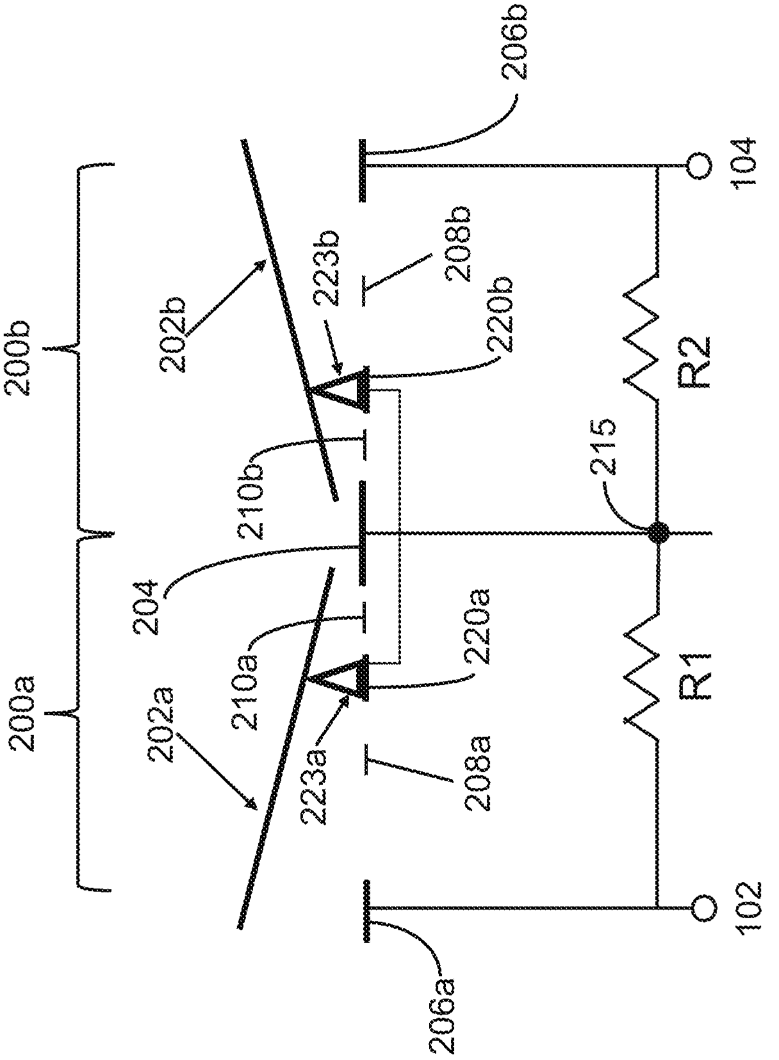
FIG. 7 is a schematic diagram illustrating an example MEMS switch circuit (e.g., a circuit breaker circuit) formed by connecting two teeter-totter switches.

FIG. 7 is a schematic diagram illustrating an example MEMS switch circuit (e.g., a circuit breaker) comprising a MEMS switch network formed by connecting two teeter-totter switches in series. By way of example, in the illustrated embodiment, two asymmetric teeter-totter switches 200*a*, 200*b* (e.g., similar to teeter-totter switch 150 in FIG. 1B) are electrically in series between the first and second terminals 102, 104 (e.g., the two terminals of a circuit breaker). However, embodiments are not so limited, and in some implementations, one or both of the two teeter-totter switches may be symmetric teeter-totter switches connected in series. In some cases, the teeter-totter switches 200*a*, 200*b* may comprise one or more features described above with respect to the asymmetric teeter-totter switch 150, 300. In some examples, two resistors R1, R2, may be connected in series between the first and second terminals 102, 104, to divide a voltage $V_{12}$ between the two terminals 102, 104, to a first voltage $V_{12,1}$ between the first terminal 102 and a middle node 215, and a second voltage $V_{12,2}$ between the middle node 215 and the second terminal 104. In some embodiments R1 or R2 can be from 1 to 10 kΩ, 10 to 100 kΩ, 0.1 to 1 MΩ, from 1 to 50 MΩ, from 50 to 100 MΩ, from 100 to 500 MΩ, from 500 MΩ to 1 GΩ, or have a value that is in any ranges formed by these values or larger or smaller.

In some embodiments, the first asymmetric teeter-totter switch 200*a* may be configured to electrically connect/disconnect the first terminal 102 and the middle node 215, and the second asymmetric teeter-totter switch 200*b* may be configured to connect/disconnect the second terminal 104 and the middle node 215. In various implementations, the first and second resistors R1, R2, can be substantially equal or different. Accordingly, the first and second teeter-totter switches 200*a*, 200*b*, may have the same or different operating voltages. In one example where R1=R2=R, $V_{12,1}=V_{12,2}=V_{12}/2$ and, in an OFF state, the voltage drop across each teeter-totter switch can be $V_{12}/2$.

In some embodiments, the first teeter-totter switch 200*a* may comprise a first front contact electrode 206*a* electrically connected to the first terminal 102 and a first post 223*a* electrically connecting a first conductive beam 202*a* to a first middle electrode 220*a*, where the first middle electrode 220*a* is electrically connected to the middle node 215. In some embodiments, the second teeter-totter switch 200*b* may comprise a second front contact electrode 206*b* electrically connected to the second terminal 104 and a second post 223*b* electrically connecting a second conductive beam 202*b* to a second middle electrode 220*b*, where the second middle electrode 220*b* is electrically connected to the middle node 215. As such, the first and second middle electrodes 220*a*, 220*b*, are electrically connected to each other and the middle node 215. In some cases, first and second back contact electrodes of the first and second teeter-totter switches 200*a*, 200*b* may be electrically connected to each other and to the middle node 215, and thereby to the first and second middle electrodes 220*a*, 220*b*. In some embodiments, the first and second teeter-totter switches 200*a*, 200*b* may share a common back electrode 204 where the common back electrode 204 can be electrically connected to the middle node 215 and the first and second middle electrodes 220*a*, 220*b*.

In some embodiments, a first pair of control electrodes 208*a*, 210*a*, may be configured to control the first beam 202*a* of the first teeter-totter switch 200*a* and thereby change the state of the first teeter-totter switch 200*a*, and a second pair of control electrodes 208*b*, 210*b*, may be configured to control the second first beam 202*b* of the second teeter-totter switch 200*b* and thereby change the state of the second teeter-totter switch 200*b*. In various implementations, the first and second teeter-totter switches 200*a*, 200*b* may be controlled by the same or different control signals and resulting actuation voltages.

In some embodiments, the front control electrodes 208*a*, 208*b* of the first and second teeter-totter switches 200*a*, 200*b*, may be electrically connected and receive a first common actuation voltage, and the back control electrodes 210*a*, 210*b*, of the first and second teeter-totter switches 200*a*, 200*b*, may be electrically connected and receive a second common actuation voltage. As such, in these embodiments, the first and second teeter-totter switches 200*a*, 200*b*, may simultaneously be in ON state or OFF state. In some cases, when both teeter-totter switches 200*a*, 200*b*, are in ON state an electrical path may be established between the first terminal 102 and the second terminal 104 through the first beam 202*a*, first post 223*a*, first middle electrode 220*a*, second middle electrode 220*b*, second post 223*b*, and the second beam 202*b*. In some embodiments, when both switches are in OFF state the electrical path between the first terminal 102 can be electrically disconnected from the second terminal 104. In some such cases the OFF state gaps between the first and second front contact electrodes 206*a*, 206*b*, and the respective front ends of the first and second beams 202*a*, 202*b* may be configured to maintain electric isolation under voltage drops substantially equal to V×R1/(R1+R2) and V×R2/(R1+R2), respectively, where V is the voltage difference between the first and second terminals 102, 104 and thereby between the first and second front contact electrodes 206*a*, 206*b*. As such, in some implementations, the L2/L1, L1, L2, L (=L1+L2), and the OFF state gap, can be different for the first and second teeter-totter switches 200*a*, 200*b*. Advantageously, by connecting the front contact electrodes 206*a*, 206*b*, of the two illustrated asymmetric teeter-totter switches 200*a*, 200*b*, to the first and second terminals 102, 104, a larger voltage may be isolated relative to analogous symmetric switches having the same beam length, since a gap (e.g., OFF state gap) formed above a front contact electrode, in the OFF state, is larger relative to that of a gap formed above a front contact electrode of a symmetric teeter-totter switch.

As disclosed herein, in a similar manner as discussed above, a MEMS switch such as an asymmetric teeter-totter switch, in the context of a MEMS switch circuit, may be referred to as being activated when the end of the conductive beam that is farther away from the conductive post is lifted and not in electrical contact with the respective contact electrode. For example, the asymmetric teeter-totter switch 200*a*, 200*b* as illustrated in FIG. 7 may be referred to as being in the activated state, with the front contact electrodes 206*a*, 206*b* and the second end of the beam 107 farther away from the post 223*a*, 223*b* are electrically disconnected from each other. Conversely, a MEMS switch such as an asymmetric teeter-totter switch, in the context of a MEMS switch circuit, may be referred to as being deactivated when the end of the conductive beam that is closer to the conductive post is lifted and not in electrical contact with the respective contact electrode. For example, the asymmetric teeter-totter switch 200*a*, 200*b* may be referred to as being in the deactivated state when the back contact electrode 204 and the first end of the beam 107 closer to the post 223*a*, 223*b* are electrically disconnected from each other.

Figure 8:
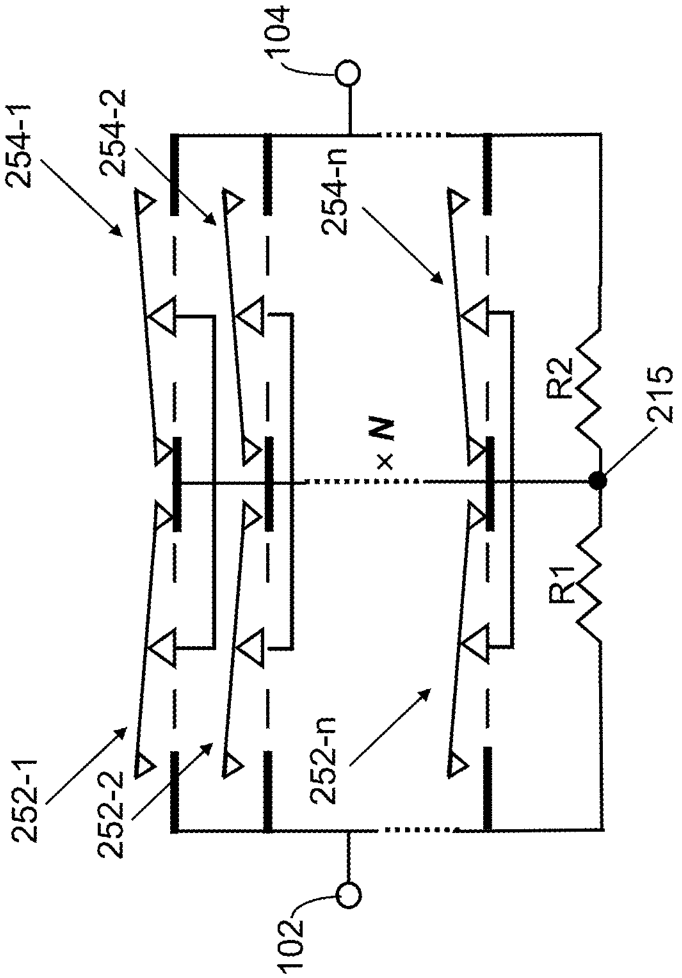
FIG. 8 schematically illustrates an example MEMS switch circuit (e.g., a circuit breaker) comprising a plurality of MEMS teeter-totter switches configured to connect/disconnect the terminals of an electronic circuit and allow high current and high voltage connection between the terminals.

In some embodiments, two or more MEMS switch networks may be connected in parallel such that a larger current can be allowed to flow between the first and second terminals 102, 104. In some examples, at least one of the MEMS switch networks may comprise the configuration shown in FIG. 7. FIG. 8 schematically illustrates an example circuit breaker 200, or a MEMS switch network, comprising a plurality of MEMS teeter-totter switches configured to connect/disconnect the terminals 102, 104 and allow high current and high voltage connection between these terminals. The teeter-totter switches in this circuit breaker 200 may be symmetric or asymmetric as described above. In some cases, the circuit breaker 200 may comprise N pairs of teeter-totter switches connected in parallel, where an individual pair comprises two teeter-totter switches connected in series between the first and second terminals 102, 104 (e.g., the MEMS switch network shown in FIG. 7). Similar to the configuration show in FIG. 7, two resistors, R1, R2, connected in series between the first and second terminals 102, 104, may divide a voltage $V_{12}$ between the two terminals 102, 104, to a first voltage $V_{12,1}$ between the first terminal 102 and a middle node 215, and a second voltage $V_{12,2}$ between the middle node 215 and the second terminal 104. By way of one example, R1=R2=R, $V_{12,1}=V_{12,2}=V_{12}/2$ and, in an OFF state, the voltage drop across each teeter-totter switch can be $V_{12}/2$.

As such, in some cases, the operating voltage of a first teeter-totter switch 252-1, 252-2, . . . 252-*n* of each pair may be equal of smaller than $V_{12,1}$ and the operating voltage of a second teeter-totter switch 254-1, 254-2, . . . 254-*n* of each pair may be equal of smaller than $V_{12,21}$.

In some examples, when the circuit breaker 200 is in an OFF state all teeter-totter switches 252-1, 252-2, . . . 252-*n* and 254-1, 254-2, . . . 254-*n*, can be in OFF state and the first terminal 102 can be electrically disconnected from the second terminal 104. In some examples, when the circuit breaker 200 is in an ON state all teeter-totter switches 252-1, 252-2, . . . **252-*n* and 254-1, 254-2, . . . 254-*n*, can be in ON state and the first terminal 102 can be electrically connected to the second terminal 104**.

In various implementations, the two teeter-totter switches of a pair of switches (e.g., 252-1 and 254-1, 252-2 and 254-2, . . . ) in the circuit breaker 200 can be substantially identical or different. In various implementations, at least one the two teeter-totter switches of a pair of switches (e.g., 252-1 and 254-1, 252-2 and 254-2, . . . ) in the circuit breaker 200 can be an asymmetric teeter-totter switch (e.g., the teeter-totter switch 150 or 300). In various implementations, the at least two pairs of switches in the circuit breaker 200 can be substantially identical.

In some cases, all the teeter-totter switches 252-1, 252-2, . . . **252-*n* and 254-1, 254-2, . . . 254-*n*, of the circuit breaker 200 can be substantially identical. In some such cases, an upper limit for the voltage difference between the first and second terminals 102, 104, can be substantially equal to two times the operating voltage of an individual teeter-totter switch and upper limit for the electrical current flowing between the first and second terminals 102, 104**, can be substantially equal to N times the operating current of an individual teeter-totter switch, where the operating current of an individual teeter-totter switch is the largest electric current that can pass through a teeter-totter switch in ON state without damaging the beam, post, hinge, the contacting end of the beam, and/or the front contact electrode of the teeter-totter switch.

In some embodiments, when the electric potential of the control electrodes and the middle electrodes of the teeter-totter switch are controlled with respect to a common reference voltage (e.g., a ground potential), the switching voltage ($V_s$) may vary based on a voltage applied between the middle electrode and the respective contact electrode (e.g., the operating voltage, $V_m$, of the teeter-totter switch). For example, when a teeter-totter switch is used to provide an electrical connection between two terminals having a potential difference of $V_m$, $V_s$ may be substantially equal to $V_m+V_0$, where $V_0$ is switching voltage (or actuation voltage) for an isolated teeter-totter switch (e.g., when no voltage is applied between middle electrode and the one of the contact electrodes). As such, when a teeter-totter switch is used for high voltage switching (e.g., when $V_m$ is larger than 100, 300, or 500 volts), a large $V_s$ may be required to change the state of the teeter-totter switch (from ON to OFF state and vice versa). Moreover, as the voltage applied across the teeter-totter switch varies (e.g., the voltage provided to the first and second terminals 102, 104), the control voltage (e.g., the switching voltage $V_s$) provided to a control electrode to activate or deactivate the teeter-totter switch may vary with the applied voltage (e.g., proportionally).

In various implementations, $V_0$ can be from 20 to 40 volts, from 40 to 60 volts, from 60 to 80 volts, from 80 to 100 volts, or any ranges formed by these values or larger or smaller.

In various implementations, the number (N) of the pair of MEMS teeter-totter switches connected in parallel can be from 5 to 10, from 10 to 20, from 20 to 30, from 30 to 40, from 40 to 50, from 50 to 60, from 60 to 80, from 80 to 100, or a value in any of the ranges formed by these values or larger or smaller values.

In some cases, an individual MEMS teeter-totter switch (e.g., an asymmetric MEMS teeter-totter switches) may have an operating voltage $V_m$ from 20 to 40 volts, from 40 to 60 volts, from 60 to 80 volts, from 80 to 100 volts, from 100 to 150 volts, from 150 volts to 200 volts, or a value in any of the ranges formed by these values or larger or smaller values.

In some cases, an upper limit for electric current passing through an individual MEMS teeter-totter switch can be from 10 to 40 milliamps, from 40 to 60 milliamps, from 60 to 80 milliamps, from 80 to 100 milliamps, from 100 to 150 milliamps, from 150 to 200 milliamps, or a value in any of the ranges formed by these values or larger or smaller values.

In some cases, the characteristics and the number of individual MEMS teeter-totter switches used in the circuit breaker 200 may be selected to allow a voltage difference between the first and second terminals 102, 103, to be greater than 100 volts, 200 volts, 300 volts, 400 volts, 500 volts, or larger values, and the a current passing through the circuit breaker 200 (when all MEMS switches are in ON state) to be greater than 0.5 amps, 1 amps, 2 amps, 3 amps, 4 amps, 5 amps, 8 amps, 10 amps, or larger values.

For example, when $V_m$ and the upper current limit for an individual teeter-totter switches of the circuit breaker 200 are 65 milliamp and 200 volts, respectively, and N=60, the circuit breaker 200 may be used to switch voltages up to 400 volts and currents up to 4 amps.

In some embodiments, the circuit breaker 200 may be fabricated on single chip by forming N rows of MEMS switch pairs formed on a common substrate and connecting them using in parallel by two conductive lines formed on the common substrate. In some cases, in order to limit the voltage across each MEMS switch (e.g., each asymmetric MEMS teeter-totter switch) to the respective $V_m$, a grading network, e.g., a potential divider, may be formed on the substrate to divide the voltage applied between the first and second terminals. In other words, the resistors R1 and R2 in FIG. 200 may comprise a grading network (e.g., a plurality of resistors or resistive electric paths configured to distribute the applied voltage according to operating voltages of the individual MEMS switches).

Figures 9A, 9B, 9C:
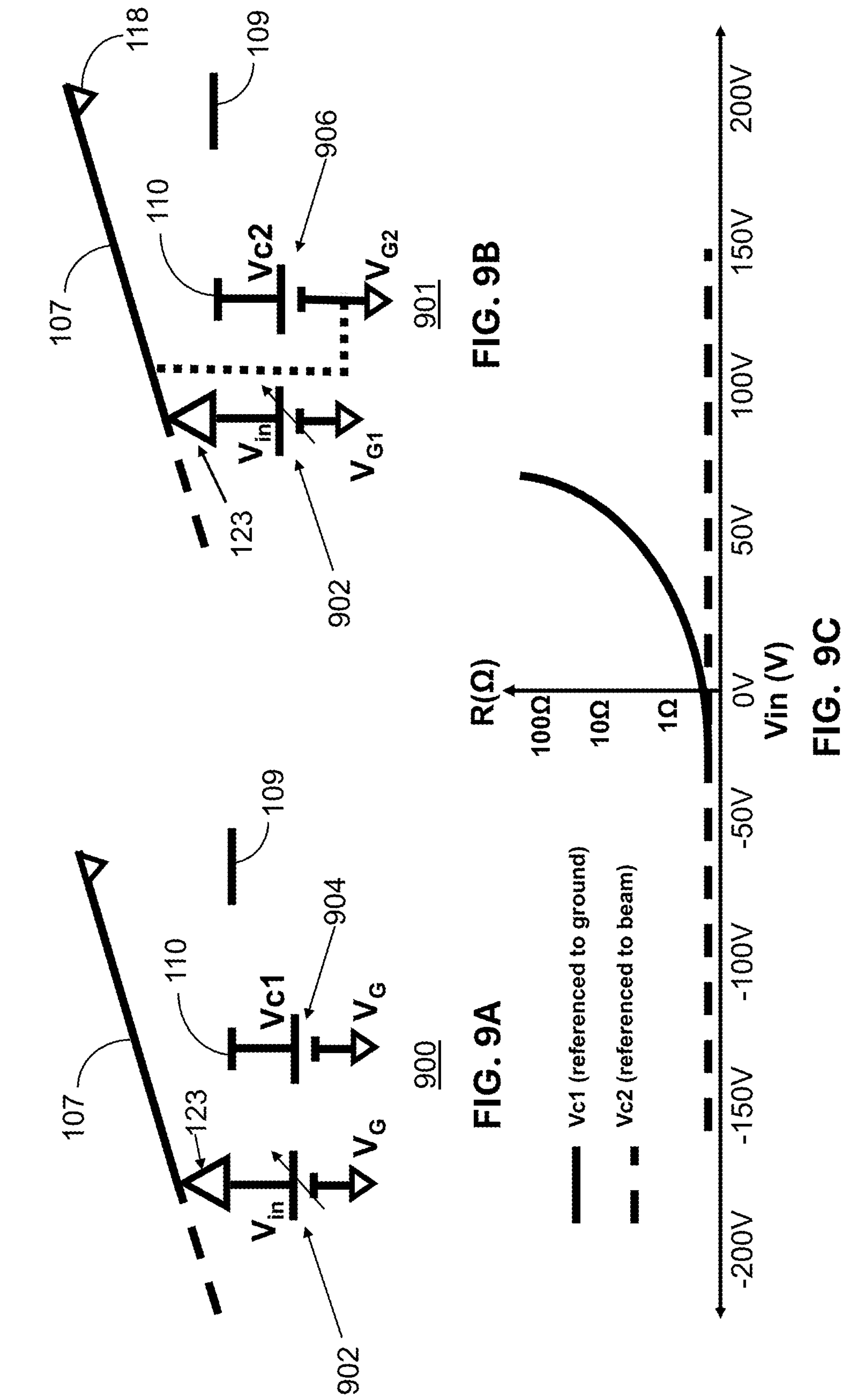
FIG. 9A schematically illustrates a MEMS teeter-totter switch configured to electrically connect a contact electrode to an input voltage applied to the middle electrode with respect to a reference voltage when a control voltage is provided to a control electrode of the teeter-totter switch with respect to the same reference voltage.
FIG. 9B schematically illustrates a MEMS teeter-totter switch configured to electrically connect a contact electrode to an input voltage applied to the middle electrode with respect to a first reference voltage when a control voltage is provided to a control electrode of the teeter-totter switch with respect to a second reference voltage different from the first reference voltage.
FIG. 9C is a plot schematically illustrating the resistance of a conductive path established between the post and a contact electrode by the teeter-totter switch shown in FIG. 9A (solid line) and the teeter-totter switch shown in FIG. 9B (dashed line), as a function of the input volage provided to the middle electrode.

FIG. 9A schematically illustrates a teeter-totter switch 900 configured to electrically connect/disconnect a front contact electrode 109 to/from an input voltage source 902 that is configured to provide a voltage $V_{in}$ with respect to a reference voltage ($V_G$). In some cases, when the teeter-totter switch 900 is in the ON state, a conductive path between the input voltage source 902 and the front contact electrode 109 may be established via the post 123, the beam 107, an electrical connection between the post 123 and the front contact electrode 109. In some embodiments, to change the state of the teeter-totter switch 900 from OFF state to ON state, the front control electrode 110 may be connected to a control voltage source 904 that is configured to provide a first control voltage $V_{C1}$ (e.g., greater than or equal to the switching voltage $V_s$) with respect to the same reference voltage ($V_G$) used by the input voltage source 902. In some such cases, when $V_{C1}$ is constant, the resistance of the conductive path may vary as $V_{in}$ changes (e.g., when $V_{in}$ is time dependent). In some cases, as $V_{in}$ changes (e.g., when $V_{in}$ is time dependent) $V_s$ may change as the potential difference between the beam 107 and the control electrode 110 depends on the voltage (e.g., $V_{in}$) applied to the beam 107. In other words, in the configuration shown in FIG. 9A, $V_s$ can be a function of $V_{in}$. In some examples, such time varying resistance or time varying $V_s$ may adversely affect the performance of an electronic circuit (e.g., a circuit breaker) that use the teeter-totter switch for voltage and/or current switching. In various implementations, an input voltage value provided by the input voltage source 902 can be from 10 to 100 volts, from 100 to 300 volts, from 300 to 500 volts, from 500 to 1000 volts, or have a voltage value that is in a range defined by any of these values or larger or smaller. In various implementations, an electric current value provided by the input voltage source 902 can be from 1 to 5 Amps, from 5 to 10 Amps, from 10 to 20 Amps, from 20 to 40 Amps, or have a current value that is in a range defined by any of these values or larger or smaller.

The inventors have discovered that by providing a control voltage with reference to the voltage of the beam (e.g., $V_{in}$), the switching voltage ($V_s$) may remain substantially independent of the voltage, $V_{in}$, applied between the terminals of a corresponding electronic circuit (e.g., a breaker circuitry) such that the control voltage can remain unchanged when $V_{in}$ varies.

FIG. 9B schematically illustrates a teeter-totter switch 901 configured to electrically connect/disconnect the front contact electrode 109 to/from an input voltage source 902 that is configured to provide a voltage $V_{in}$ with respect to a first reference voltage ($V_{G1}$). In some embodiments, to change the state of the teeter-totter switch 901 from OFF state to ON state, the front control electrode 110 may be connected to a control voltage source 906 configured to provide a second control voltage $V_{C2}$ with respect to a second reference voltage ($V_{G2}$). In some cases, $V_{G2}$ can be a voltage provided (e.g., $V_{in}$) to the beam 107. For example, $V_{G2}$ can be substantially equal to $V_{in}-V_{G1}$ and the control voltage source 906 may actuate the teeter-totter switch from the OFF state to ON state by providing $V_{C2}=V_s=V_0$ (where $V_0$ is the switching or actuation voltage for the isolated teeter-totter switch), substantially independent of $V_{in}$. In some embodiments, the control voltage source 906 may comprise an electronic circuit configured to receive a control signal from a control circuit and provide the second control voltage $V_{C2}$ substantially equal to $V_S$ to the front control electrode 110. As described above, $V_S$ can be a voltage that applies sufficient force between the second end 118 of the beam 107 to establish an electric contact between the front contact electrode 109 and the second end 118, having an electric resistance lower than a threshold value.

FIG. 9C is a plot schematically illustrating the resistance of a conductive path established between the post 123 and the front contact electrode 109 by the teeter-totter switch 900 (solid line) and the teeter-totter switch 901 (dashed line), as a function of the voltage ($V_{in}$) provided to the beam 107 for a constant $V_{C1}=V_{C2}=V_C$ provided by voltage sources 902, 904 to teeter-totter switches 900, and 901, respectively. In some cases, when $V_{in}$ is near zero, a voltage difference between the beam 107 and the front control electrode 110 can be substantially equal to $V_s$ for both teeter-totter switches 900, 901, resulting in a conductive path between the front contact electrode 109 and the post 123 having a sufficiently low resistance (e.g., less than 5 oms). In some cases, when $V_{in}$ increases, the voltage difference between the beam 107 and the front control electrode 110 of the teeter-totter switch 900 may decrease below $V_s$ (since $V_{C1}$ and $V_{in}$ are applied with respect to a common reference $V_G$) while the voltage difference between the beam 107 and the front control electrode 110 of the teeter-totter switch 901 may remain substantially equal to $V_s$ (since $V_{C2}$ and $V_{in}$ are applied with respect to different reference voltages $V_{G1}$ and $V_{G2}$). In some cases, a resistance of the electrical connection between the second end 118 of the beam 107 the front contact electrode 109 can be proportional to the electrostatic force applied on the beam 107 and the electrostatic force applied on the beam 107 can be proportional to the square of the voltage difference between the beam 107 and the control electrode 110. As such, when $V_{in}$ increases, the resistance of the conductive path established between the front contact electrode 109 and the post 123 may increase above the desired value for the teeter-totter switch 900 (solid line in FIG. 9C) and stay constant for the teeter-totter switch 901 (dashed line in FIG. 9C).

Advantageously, the actuation configuration of the teeter-totter switch 901 may keep $V_s$ substantially constant (e.g., close or equal to $V_0$) and may allow maintaining the resistance of conductive path between the post 123 and the front contact electrode 109, when the switch is in ON state, below a threshold value using a constant $V_C$ close or substantially equal to $V_s$, substantially independent of magnitude and/or temporal variation of $V_{in}$.

In should be understood that the electrical actuation configuration shown in FIG. 9B, which makes the switching voltage $V_s$ applied provided to a control electrode substantially independent from $V_{in}$, may be used for actuating both symmetric and asymmetric MEMS teeter-totter switches, and cantilever-based MEMS switches.

Circuit Breaker Circuitry with Isolation Circuit

Figure 10:
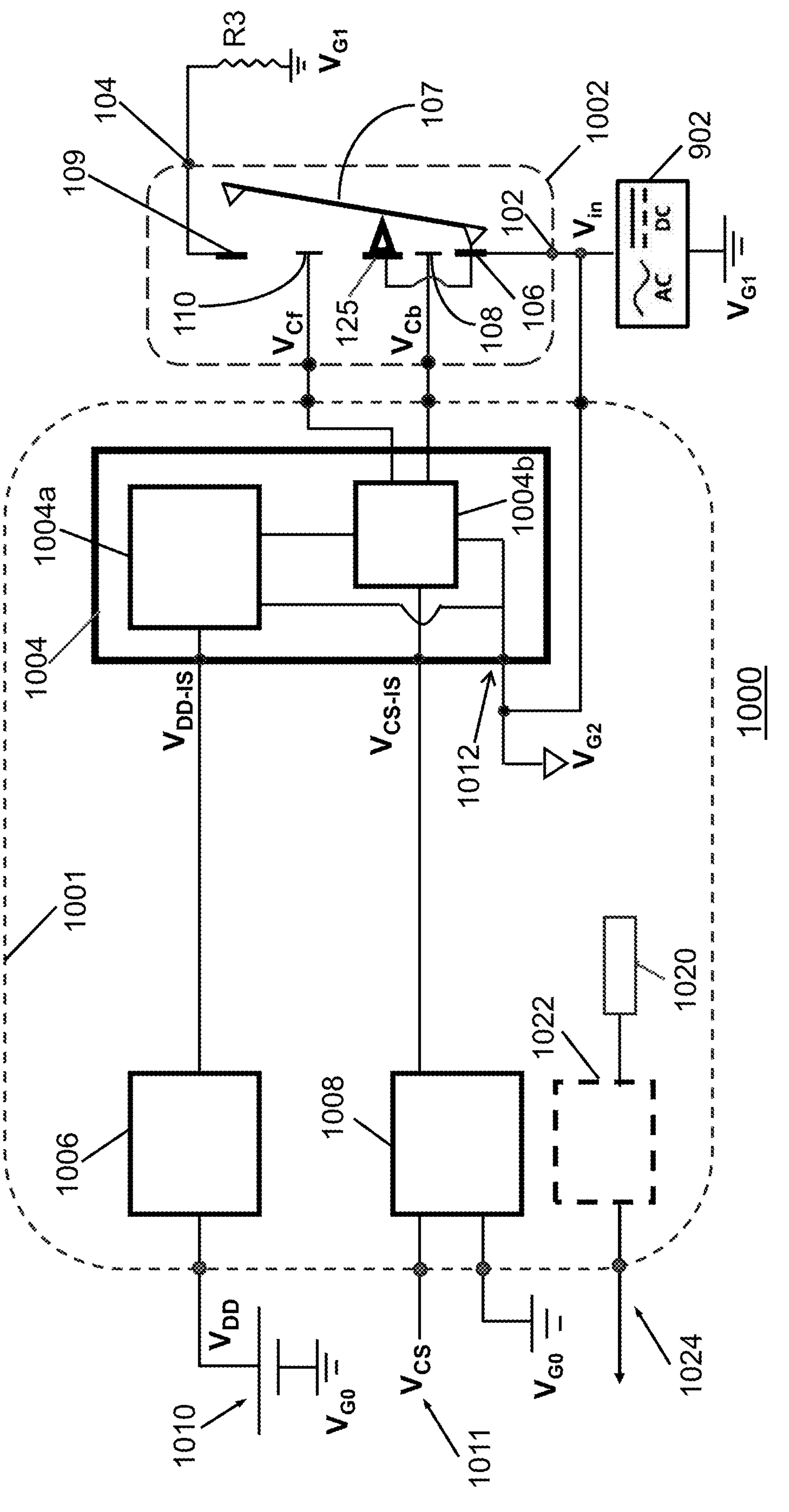
FIG. 10 schematically illustrates an example switching circuit comprising a MEMS switch and a control circuit configured to control the state of the MEMS switch.

FIG. 10 schematically illustrates an example switching circuit 1000 (e.g., circuit breaker circuitry) comprising a MEMS switch 1002 and a control circuit 1001 configured to control the state of the MEMS switch 1002 based on a control signal 1011 and an input voltage $V_{in}$ provided to the MEMS switch 1002 by an input voltage source 902, according to the electrical configuration described above with respect to FIG. 9B. In some embodiments, the magnitude of the control voltage $V_C$ provided to the MEMS switch 1002 can be substantially independent of $V_{in}$. In some cases, control signal 1011 may comprise digital control data. In some examples, the control signal 1011 may comprise a deactivation signal indicative of ON state or an activation signal indicative of OFF state.

In various implementations, the MEMS switch 1002 may comprise a teeter-totter switch (e.g., the teeter-totter switch 100, 150, or 300) or a cantilever-based switch.

In the illustrated example, the MEMS switch 1002 comprises, without limitation, an asymmetric switch having a back contact electrode 106 electrically connected a first terminal 102 (e.g., an input terminal), a front contact electrode 110 electrically connected to a second terminal 104 (e.g., an output terminal), a middle electrode 125 electrically connected to the back contact electrode 106, and a beam 107, where the beam 107 is electrically connected to the middle electrode 125 by a conductive post that anchors the beam 107 to a substrate, as described herein. In some embodiments, the first terminal 102 may be electrically connected to an input voltage source 902 that provides an input voltage $V_{in}$ to the first terminal 102 with respect to a first reference voltage ($V_{G1}$), e.g., ground potential, and the second terminal 104 may be electrically connected the first reference voltage (or another reference voltage) via a resistor R3.

In some implementations, the teeter-totter switch 1002 may comprise a front control electrode 110 and a back control electrode 106 configured to control the position of the beam 107 (and thereby the state of the MEMS switch 1002) upon receiving front and back control voltages $V_{Cf}$ and $V_{Cb}$ from the control circuit 1001. In some examples, the control circuit 1001 may be configured to receive $V_{in}$ from the input voltage source 902, receive a control signal 1011 from an electronic circuit, and an actuation voltage $V_{DD}$ from an actuation voltage source, and generate the front and back control voltages $V_{Cf}$, $V_{Cb}$ using $V_{DD}$, and based on the control signal 1011 and $V_{in}$. In some cases, the control circuit 1001 may generate an deactivation voltage for deactivating the MEMS switch 1002 from OFF state to ON state, or an activation voltage for activating the MEMS switch 1002 from ON state to OFF state. In some cases, activation and deactivation voltages may be collectively referred to as actuation voltages. In some examples, a deactivation voltage may comprise providing front and back control voltages configured to electromechanically couple to the beam 107 to the front contact electrode 109 and decouple it from the back contact electrode 106. In some examples, an activation voltage may comprise providing front and back control voltages configured to electromechanically couple to the beam 107 to the back contact electrode 106 and decouple it from the front contact electrode 109. In some cases, a deactivation voltage may comprise a voltage provided to the front control electrode 110 and the activation voltage may comprise a voltage provided to the back control electrode 108.

In some cases, the control circuit 1001 may amplify $V_{DD}$ (e.g., using a DC-to-DC converter) to the switching voltage $V_S$ of the teeter-totter switch 1002 with respect to $V_{in}$, and in response to receiving a control signal 1011 indicative of an ON state (or OFF state), generate $V_{Cf}$ (or $V_{Cb}$) with a magnitude substantially equal to $V_S+V_{in}$. In such cases, the control circuit 1001 may comprise at least a first isolator 1006 that electrically isolates $V_{DD}$ provided by the actuation voltage source 1010 with respect to an initial reference signal $V_{G0}$ from the electronic circuitry (e.g., a voltage converter) of control circuit 1001. In some examples, the isolator 1006 may allow amplifying $V_{DD}$ to a fixed voltage (e.g., $V_S$) with respect to $V_{in}$. In some embodiments, the control circuit 1001 may comprise a second isolator 1008 that electrically isolates the control signal 1011 from the electronic circuitry (e.g., a driver circuit) of the control circuit 1001. Advantageously, by isolating the voltage amplification and control circuitry from the actuation voltage source 1010 and a source of the control signal 1011, the control circuit 1001 can effectively bootstrap $V_{Cf}$ and $V_{Cb}$ to $V_{in}$ such that the voltage of the respective control electrode (e.g., the front control electrode 110 in ON state the back control electrode 108 in OFF state), is greater than a voltage applied on the beam 107 by $V_s$.

In some embodiments, the control circuit 1001 may comprise a actuation and control circuit 1004 and the first and second isolators 1006, 1008. In some embodiments, the actuation and control circuit 1004 may comprise a DC-to-DC converter **1004*a* and a driver 1004*b*. In some cases, the first isolator 1006 may be configured to receive the actuation voltage $V_{DD}$ from the actuation source 1010 and provide an isolated actuation voltage $V_{DD\text{-}IS}$ to the DC-to-DC converter 1004*a*. In some cases, the second isolator 1008 may be configured to receive the control signal 1011 comprising a control signal voltage $V_{CS}$ and provide an isolated control signal voltage $V_{CS\text{-}IS}$ to the driver 1004*b*. In some implementations, the DC-to-DC converter 1004*a* and the driver 1004*b* may be configured to receive the input voltage $V_{in}$ from the input voltage source 902 and use $V_{in}$ as an operating reference voltage provided to a reference voltage port/terminal 1012 of the actuation and control circuit 1004. In some cases, a voltage connected to the port/terminal 1012 may be referred to as the second reference voltage $V_{G2}$, with respect to which the DC-to-DC converter 1004*a* and the driver 1004*b* may operate. In some embodiments, the DC-to-DC converter 1004*a* may be configured to amplify the isolated actuation voltage $V_{DD\text{-}IS}$ by a voltage amplification factor M to generate a control voltage substantially equal to $M\times V_{DD\text{-}IS}$ with respect to $V_{G2}$ ($=V_{in}$) and thereby substantially equal to $M\times V_{DD\text{-}IS}+V_{in}$ with respect to $V_{G1}$. In some embodiments, $M\times V_{DD\text{-}IS}$ can be substantially equal to or greater than $V_s=V_0$. In some embodiments, the driver 1004*b* may be configured receive the amplified voltage from the DC-to-DC converter 1004*a* and provide the front control voltage $V_{Cf}$ to the front control electrode 110 or to the back control electrode 108, based on the isolated control signal voltage $V_{CS\text{-}IS}$ received from the second isolator 1008. For example, when $V_{CS\text{-}IS}$ is indicative of an OFF state, the driver 1004*b* may provide the amplified voltage as $V_{Cb}$ ($=M\times V_{DD\text{-}IS}+V_{in}$) to the back control electrode 108 to electrically disconnect the beam 107 from the front contact electrode 109. Analogously, when $V_{CS\text{-}IS}$ is indicative of an ON state the driver 1004*b* may provide the amplified voltage as $V_{Cf}$ ($=M\times V_{DD\text{-}IS}+V_{in}$) to the front control electrode 110 to electrically connect the beam 107 to the front contact electrode 109. In some embodiments, when $V_{CS\text{-}IS}$ is indicative of OFF state, $V_{Cf}$ can be substantially equal to $V_{in}$ with respect to $V_{G1}$ (or zero with respect to $V_{G2}$) and when $V_{CS\text{-}IS}$ is indicative of ON state, $V_{Cb}$ can be substantially equal to $V_{in}$ with respect to $V_{G1}$ (or zero with respect to $V_{G2}$). As such, using the first and second isolators 1006, 1008, and by setting the second reference voltage $V_{G2}$ to $V_{in}$, the control circuit 1001** can bootstrap $V_{Cf}$, $V_{Cb}$, to $V_{in}$ and control them based on $V_{CS}$.

In some embodiments, in addition to the first and second isolators 1006, 1008, the control circuit 1001 may comprise a third isolator 1022 configured to receive a sensor signal from a sensor 1020 and output an isolated sensor signal 1024. In some implementations, the sensor 1020 may comprise a temperature sensor, a current sensor, or other types of sensors that may generate sensor signals indicative of an operating condition or parameter of the teeter-totter switch 1002 or the electric circuitry (e.g., a circuit breaker) controlled by the teeter-totter switch 1002. In some cases, the isolated sensor signals 1024 output by the control circuit 1001, may be used by signal processing circuit to control the control signal 1011 and/or the actuation voltage source 1010. In some embodiments, the control circuit 1001 may comprise a readout circuit (not shown) configured to receive sensor signals from the senor 1020 and provide processed sensor signals to the third isolator 1022. In some examples, the sensor signal may comprise an analog signal, the readout circuit may comprise an analog-to-digital converter (ADC), and the processed sensor signal may comprise a digital signal.

Figure 11A:
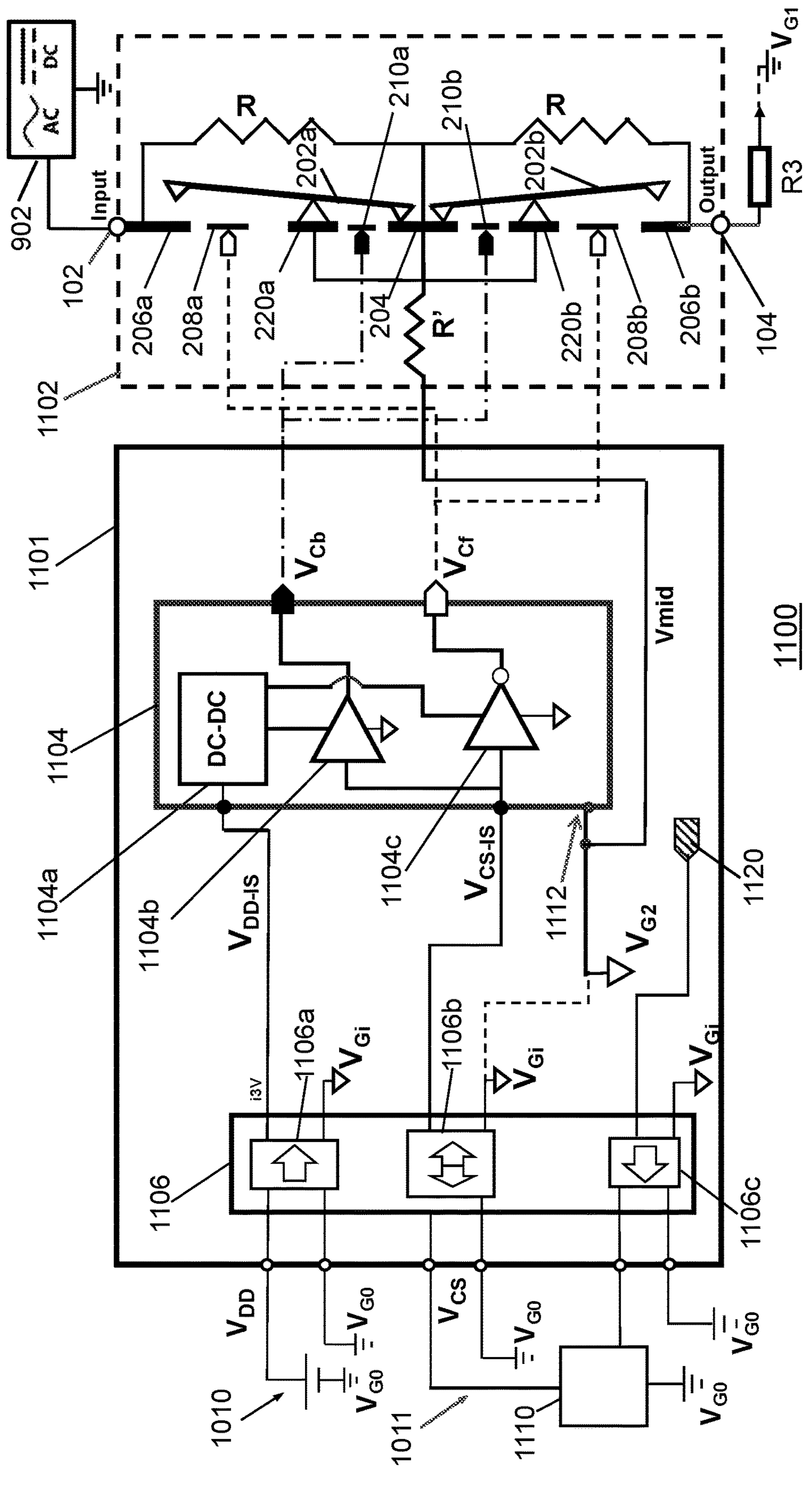
FIG. 11A schematically illustrates another example switching circuit comprising a control circuit and a MEMS switch network comprising two or more MEMS switches.

FIG. 11A schematically illustrates another example switching circuit 1100 (e.g., a circuit breaker circuitry) comprising a control circuit 1101 and a MEMS switch network 1102 comprising two or more MEMS switches. In various implementations, the MEMS switch network 1102 may comprise any one of the teeter-totter switch 100, 150, 300, a cantilever-based switch, or combination thereof. For illustrative purposes, the MEMS switch network 1102 includes two teeter-totter switches (e.g., each similar to the teeter-totter switch 100, 150, or 300) connected in series between the input and output terminals 102, 104 of an electronic circuit (e.g., an electronic circuit protected/controlled by switching circuit 1100 formed by the control circuit 1101 and the MEM switch network 1102). In some embodiments, the MEMS switch network 1102 may comprise one or more features described above with respect to MEMS switch circuit shown in FIG. 7. In some embodiments, the control circuit 1101 may comprise one or more features analogous to those described above with respect to control circuit 1001 (FIG. 10), the details of which may not be repeated herein for brevity.

In some embodiments, the control circuit 1101 may be configured to provide a front control voltage $V_{Cf}$ to the first and second front control electrodes 208*a*, 208*b* of the first and second teeter-totter switches of the switch network 1102, and a back control voltage $V_{Cb}$ to the first and second back control electrodes 210*a*, 210*b* of the first and second teeter-totter switches of the switch network 1102. In some embodiments, the control circuit 1101 may be configured to receive a midpoint voltage $V_{mid}$ from a common back contact electrode 204 shared between the two teeter-totter switches of the MEMS switch network 1102. In some embodiments, the input terminal 102 may be connected to the input voltage source 902, and the output terminal 104 may be connected to a first reference voltage $V_{G1}$, e.g., a ground voltage, via a resistor R3. In some embodiments, the first front contact electrode 206*a* of the first teeter-totter switch may be connected to the input terminal 102, the second front contact electrode 206*b* of the second teeter-totter switch may be connected to the output terminal 104, and the two teeter-totter switches may share the common back contact electrode 204. In some examples, a first resistor may be connected in parallel with the first teeter-totter switch between the first front contact electrode 206a and the common back contact electrode 204 and a second resistor may be connected in parallel with the second teeter-totter switch between the common back contact electrode 204 and the second front contact electrode 206*b*. In some implementations, the first and second resistors may have substantially equal resistances and thereby equally dividing the input voltage $V_{in}$ between the first and second teeter-totter switches. In some such implementations, the midpoint voltage $V_{mid}$ of the common back contact electrode 204 can be substantially equal to $(V_{in}-V_{G1})/2$. In some embodiments, the common back contact electrode 204 and first and second middle electrodes 220*a*, 220*b*, of the first and second teeter-totter switches can be electrically connected (e.g., shorted). In some embodiments, the first and second resistors may be different and the midpoint voltage $V_{mid}$ of the common back contact electrode 204 can be different from $(V_{in}-V_{G1})/2$. In some embodiments, the MEMS switches of the MEMS switch network 1102 can be different (e.g., have different switching voltages, different OFF state gaps, operating voltages and the like).

In some embodiments, the control circuit 1101 may comprise an isolator circuit 1106 and a actuation and control circuit 1104, where isolator circuit 1106 is configured to receive one or more voltages from external circuits and provide isolated voltages to the actuation and control circuit 1104. In some embodiments, the actuation and control circuit 1104 may be configured to receive the midpoint voltage $V_{mid}$ from the common back contact electrode 204 and generate the front and back control voltages $V_{Cf}$, $V_{Cb}$ using $V_{mid}$ and the isolated voltage received from the isolator circuit 1106, such that $V_{Cf}$, $V_{Cb}$ are generated with respect to $V_{mid}$ and thereby with respect to the voltage of the beams of the first and second teeter-totter switches that are connected to the respective first and second middle electrodes 220*a*, 220*b*.

In some embodiments, the isolator circuit 1106 may comprise a first isolator 1106*a* configured to receive an actuation voltage $V_{DD}$ from the actuation source 1010 with respect to an initial reference signal $V_{G0}$ and provide an isolated actuation voltage $V_{DD\text{-}IS}$ and an isolated reference signal $V_{G\text{-}IS}$ with respect to an isolated reference voltage $V_{G\text{-}IS}$ to a DC-to-DC converter 1104*a* of the actuation and control circuit 1104. In some embodiments, the control circuit 1104 may be configured to use the isolated actuation voltage $V_{DD\text{-}IS}$ to provide activation or deactivation voltages to the control electrodes of the MEMS switch network 1102 to electrically connect to disconnect the input and the output terminals 102, 104.

In some embodiments, the isolator circuit 1106 may comprise a second isolator 1106*b* configured to receive a control signal 1011 from a microcontroller 1110 and provide an isolated control signal voltage $V_{CS\text{-}IS}$ with respect to an isolated reference voltage $V_{G\text{-}IS}$ to first and second drivers 1104*b*, 1104*c*, of the actuation and control circuit 1104.

In some embodiments, the DC-to-DC converter 1104*a*, the first driver 1104*b*, and the second driver 1104*c* may be configured to use $V_{DD\text{-}IS}$ and $V_{CS\text{-}IS}$ to generate $V_{Cf}$ and $V_{Cb}$ with respect to $V_{mid}$ that may be provided to the actuation and control circuit 1104 as the reference operating voltage, e.g., by electrically connecting the common back contact electrode 204 to a reference voltage port/terminal 1112 of the actuation and control circuit 1104.

In some embodiments, the DC-to-DC converter 1104*a* may be configured to amplify the isolated control voltage $V_{DD\text{-}IS}$ by a voltage amplification factor M to generate a control voltage substantially equal to $M\times V_{DD\text{-}IS}$ with respect to $V_{G2}$ ($=V_{in}$) (or equal to $M\times V_{DD\text{-}IS}+V_{in}$ with respect to $V_{G1}$), where $M\times V_{DD\text{-}IS}$ can be substantially equal to $V_0$. In some embodiments, the first and second drivers 1104*b*, 1104*c* may be configured receive the amplified voltage from the DC-to-DC converter 1104*a* and provide the control voltage $V_{Cf}$ to the first and second front control electrodes 208*a*, 208*b*, or the control voltage $V_{Cb}$ to the first and second back control electrodes 210*a*, 210*b*, based on the isolated control signal voltage $V_{CS\text{-}IS}$ received from the second isolator 1106*b*. For example, when $V_{CS\text{-}IS}$ is indicative of an OFF state the first driver 1104*b* may provide the amplified voltage as $V_{Cb}$ ($=M\times V_{DD\text{-}IS}+V_{in}$) to the back control electrode first and second back control electrodes 210*a*, 210*b* to electrically disconnect the respective beams from the first and second front contact electrodes 206*a*, 206*b*. Analogously, when $V_{CS\text{-}IS}$ is indicative of an ON state the second driver 1104*c* may provide the amplified voltage as $V_{Cf}$ ($=M\times V_{DD\text{-}IS}+V_{in}$) to the first and second front control electrodes 208*a*, 208*b* to electrically connect the respective beam to the first and second front contact electrodes 206*a*, 206*b*.

In some embodiments, in addition to the first and second isolators 1106*a*, 1106*b*, the control circuit 1101 may comprise a third isolator 1106*c* configured to receive a sensor signal from a sensor 1120 and output an isolated sensor signal. In some implementations, the sensor 1120 may comprise a temperature sensor, a current sensor, or other types of sensors that may generate sensor signals indicative of an operating condition of the teeter-totter switch network 1102. In some cases, the isolated sensor signals output by the control circuit 1101 may be used by the microcontroller 1110 to control the control signal 1011 and/or the actuation voltage source 1010. Additionally, or alternatively, the third isolator 1106*c* may be configured to receive a data signal (e.g., from the microcontroller 1110 and provide an isolated data signal to one or the sensor, the control circuit 1104, or to another circuit that is directly or indirectly connected to MEMS switch network.

In various implementations, the first, second, and third isolators 1006, 1008, 1022 of the switching circuit 1000 (FIG. 10), or the first, second, and third isolators 1106*a*, 1106*b*, 1106*c* of the switching circuit 1100 (FIG. 11), may comprise galvanic isolators (e.g., capacitive, inductive, radiative, optical, acoustic). In some cases, at least one of the first, second, and third isolators 1006, 1008, 1022 (FIG. 10)

or the first, second, and third isolators 1106$a$, 1106$b$, 1106$c$ may comprise a transformer (e.g., an inductive isolator comprising magnetically coupled coils). In some examples, the transformer may comprise an integrated circuit comprising two coils (e.g., spiral coils) formed (e.g., monolithically formed) on opposite sides of a core layer through which the two coils are magnetically coupled. In some examples, the transformer may comprise an integrated circuit comprising laterally isolated primary and secondary coils wound around a winding axis parallel to a main surface of a core layer formed over substrate. In some cases, at least one of the first, second, and third isolators 1006, 1008, 1022 (FIG. 10) or the first, second, and third isolators 1106$a$, 1106$b$, 1106$c$ may not comprise a transformer. In some such cases, one of the isolators may comprise a coupler (isolation) circuit configured to provide a two-way isolated electrical connection.

Figure 11B:
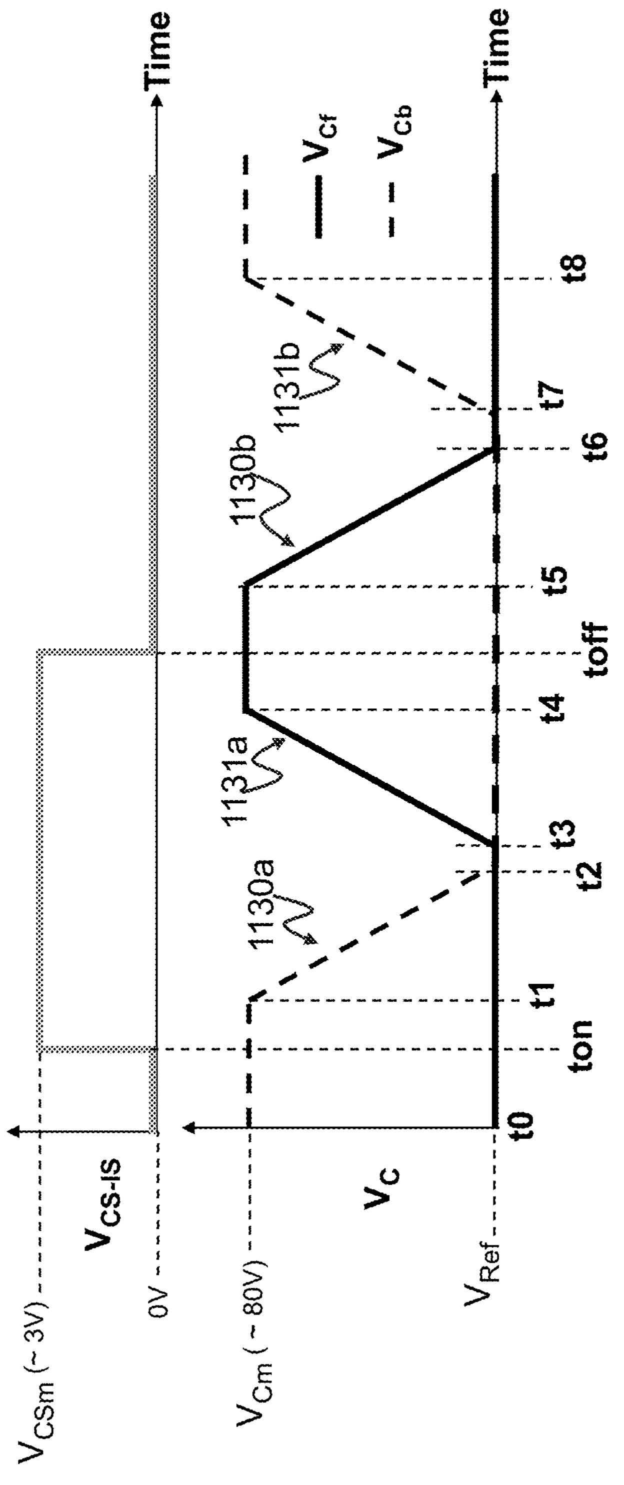
FIG. 11B schematically illustrates temporal variation of example control signal voltage and the control voltage provided to the teeter-totter switch or teeter-totter switch network shown in FIG. 10 and FIG. 11A depicting the temporal alignment between the control signal voltage and the corresponding front and back control voltages.

FIG. 11B schematically illustrates temporal variation of example control signal voltage (e.g., isolated control signal voltage $V_{CS\text{-}IS}$) and the front and back control voltages $V_{Cf}$ and $V_{Cb}$ provided to the teeter-totter switch or teeter-totter switch network shown in FIG. 10 and FIG. 11A depicting the temporal alignment between $V_{CS\text{-}IS}$ and $V_{Cf}$ and $V_{Cb}$. In some embodiments, at time $t_0$, $V_{CS\text{-}IS}$ can be zero or near zero (e.g., a logic level of 0), $V_{Cf}$ can be close or substantially equal to $V_{in}$ (or $V_{mid}$), $V_{Cb}$ can be close or substantially equal to $V_{in}+V_0$ (or $V_{mid}+V_0$), and the teeter-totter switch (or switch network) can be in the OFF state. At time $t_{on}$, $V_{CS\text{-}IS}$ transitions to maximum value $V_{CSm}$ (e.g., logic level of 1) and triggers the control circuits 1004 (or 1104) to generate front and back control voltages $V_{Cf}$ and $V_{Cb}$ for changing the state of the teeter-totter switch (or switch network) from the OFF state to the ON state. In some embodiments, to change the state of the teeter-totter switch (or switch network) from the OFF state to the ON state, the control circuits 1004 (or 1104) may decrease $V_{Cb}$ and increase $V_{Cf}$ to disconnect the beam 107 (or beams 202$a$, 202$b$) from the back contact pad (or contact pads) and connect it to the back contact pad (front contact pads). In some such embodiment, in order to change the state of the teeter-totter switch (or switch network) between the ON and OFF states, $V_{Cb}$ and $V_{Cf}$ may be changed in opposite directions with the same slope (or two different slopes). Further, in some cases, $V_{Cb}$ or $V_{Cf}$ may not be increased from $V_{Ref}$ (e.g., $V_{in}$ or $V_{mid}$), until the other one of $V_{Cb}$ and $V_{Cf}$ is decreased to $V_{Ref}$.

In the example shown in FIG. 11B, to turn ON the teeter-totter switch (or switch network) in response to the transition of $V_{CS\text{-}IS}$, at a time t1 (that can be delayed with respect to $t_{on}$) $V_{Cb}$ is decreased with a slope 1130$a$ until reaches (or close to) $V_{Ref}$ at time t2 and at time t3 (that may be delayed with respect to t2) $V_{Cf}$ is increased with a slope 1131$a$ until it reaches (or close to) $V_{Cm}=V_{Ref}+V_0$ at time t4. Similarly, as shown in FIG. 11B, to turn OFF the teeter-totter switch (or switch network) in response to the transition of $V_{CS\text{-}IS}$ from $V_{CSm}$ to zero (or near zero) at time $t_{off}$, at a time t5 (that can be delayed with respect to $t_{off}$) $V_{Cf}$ is decreased from $V_{Cm}$ with a slope 1130$b$ until reaches (or close to) $V_{Ref}$ at time t6 and at time t7 (that may be delayed with respect to t6) $V_{Cb}$ is increased from $V_{Ref}$ with a slope 1131$b$ until it reaches (or close to) $V_{Cm}=V_{Ref}+V_0$ at time t8. In some embodiments, the slopes 1130$a$, 1131$a$, 1130$b$, and 1131$b$ can be substantially equal. In some embodiments, the difference between t2 and t1, t4 and t3, t6 and t5, and/or 18 and t7 can be from 10 to 30 microseconds, from 30 to 50 microseconds, from 50 to 80 microseconds, from 80 to 100 microseconds, or any ranges formed by these values or larger or smaller values. In some examples, $V_{CSm}$ can be substantially equal to 3 volts. In some examples, $V_0$ ($=V_{Cm}-V_{Ref}$) can be substantially equal to 80 volts.

In some examples, when the teeter-totter switch is activated from the OFF state to the ON state a current flow through the teeter-totter switch may decrease over a time period from 0.1 to 1 microseconds, from 1 to 10 microseconds, from 10 to 20 microseconds, from 20 to 30 microseconds, from 30 to 40 microseconds, from 40 to 50 microseconds, from 50 to 60 microseconds, from 60 to 80 microseconds or any ranges formed by these values, ore larger or smaller values.

In some examples, when the teeter-totter switch is deactivated from the ON state to the OFF state a current flow through the teeter-totter switch may increase over a time period from 1 to 5 microseconds, from 5 to 10 microseconds, from 10 to 30 microseconds, from 30 to 50 microseconds, from 50 to 70 microseconds, from 70 to 90 microseconds, from 90 to 100 microseconds, from 100 to 150 microseconds, from 150 to 200 microseconds or any ranges formed by these values, ore larger or smaller values.

In various implementations, the first, second, and third isolators 1006, 1008, 1022 of the switching circuit 1000 (FIG. 10), or the first, second, and third isolators 1106$a$, 1106$b$, 1106$c$ of the switching circuit 1100 (FIG. 11), may be comprise magnetic isolators or other types of isolators. In some cases, a magnetic isolator may comprise two magnetically coupled coils, and in some cases, an electronic circuit configured to convert DC voltage to an AC voltage and/or AC voltage to an DC voltage, regulate the output voltage). In some embodiments, the first, second, and third isolators 1006, 1008, 1022 of the switching circuit 1000 (FIG. 10), or the first, second, and third isolators 1106$a$, 1106$b$, 1106$c$ of the switching circuit 1100 (FIG. 11), may include other types of isolators such as E-field based isolators such as capacitive isolators including discreet DC high voltage capacitors.

In various implementations, the first, second, and third isolators 1006, 1008, 1022 of the switching circuit 1000 (FIG. 10), or the first, second, and third isolators 1106$a$, 1106$b$, 1106$c$ of the switching circuit 1100 (FIG. 11), may be fabricated on separate substrates. In some examples, at least two isolators of the first, second, and third isolators 1006, 1008, 1022 of the switching circuit 1000 (FIG. 10), or the first, second, and third isolators 1106$a$, 1106$b$, 1106$c$ of the switching circuit 1100 (FIG. 11), may fabricated on a common substrate.

In some embodiments, the isolator circuit 1106 may comprise an integrated circuit enclosed in a single package. FIG. 12A schematically illustrates an example of such isolator circuit. In some such embodiments, the first, second, and third isolators 1106$a$, 1106$b$, 1106$c$ of the isolator circuit 1106 (FIG. 11) may comprise integrated transformers formed on a common substrate or separate substrates and included in a single package 1200. As shown in the inset of FIG. 12A, in some examples, an individual integrated transformer of the isolator circuit 1106 may comprise a pair of spiral shape conductive coils 1206 formed on the top and bottom surfaces of a core layer 1204 formed over a substrate 1208. The materials and geometries used for the substrate, core layers, and coils may be selected based on the specific requirements of an application. In some embodiments, laminate structures can be integrated with integrated circuits to provide a specific performance and/or functionality.

Figure 12B:
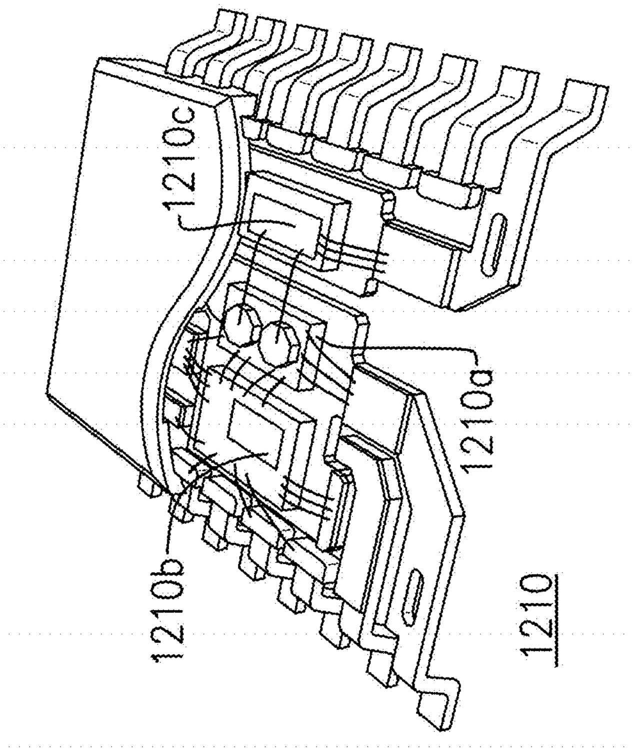
FIG. 12B schematically illustrates another example of a packaged integrated isolator circuit comprising a transformer chip and two integrated electronic circuits.
Figure 12A:
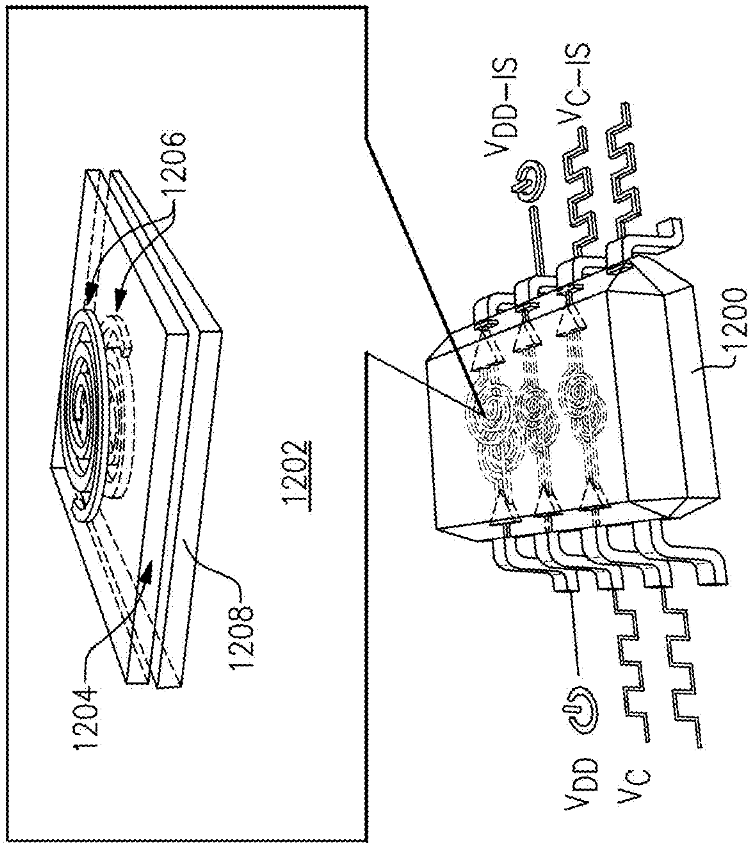
FIG. 12A schematically illustrates an example of a packaged isolator circuit used in a control circuit.

FIG. 12B schematically illustrates another example of a packaged integrated isolator circuit 1210 comprising a transformer chip 1210$a$ and transformer circuitry comprising two integrated electronic circuit chips 1210$b$, 1210$c$, where the transformer chip 1210$a$ and the first and second electronic circuit chips 1210*b*, 1210*c* are electrically connected to each other, and to the conductive pins of the package, via a plurality of wire bonds. In some examples, the first electronic circuit chip 1210*b* may comprise DC-to-AC converters configured to convert one or more input DC voltages (e.g., $V_{CS}$ and/or $V_{DD}$), to AC voltages that can be magnetically coupled from the primary coils to the secondary coils of the transformers formed on the transformer chip 1210*a*. In some examples, the second electronic circuit chip 1210*b* may comprise AC-to-DC converters (e.g., a rectifying circuits) configured to convert the AC voltages induced in the secondary coils of the transformers to isolated DC voltages (e.g., $V_{CS\text{-}IS}$ and/or $V_{DD\text{-}IS}$), that can be provided to the control circuit 1101 (FIG. 11). In some implementations, laminate structures can be integrated in the package construction along with integrated circuits where specific performance and/or functionality is required. For example, one or more coils of the transformer chip 1210*a* can be embedded in a laminate material (e.g., a rigid or flexible laminate layer disposed on a substrate).

Figure 12C:
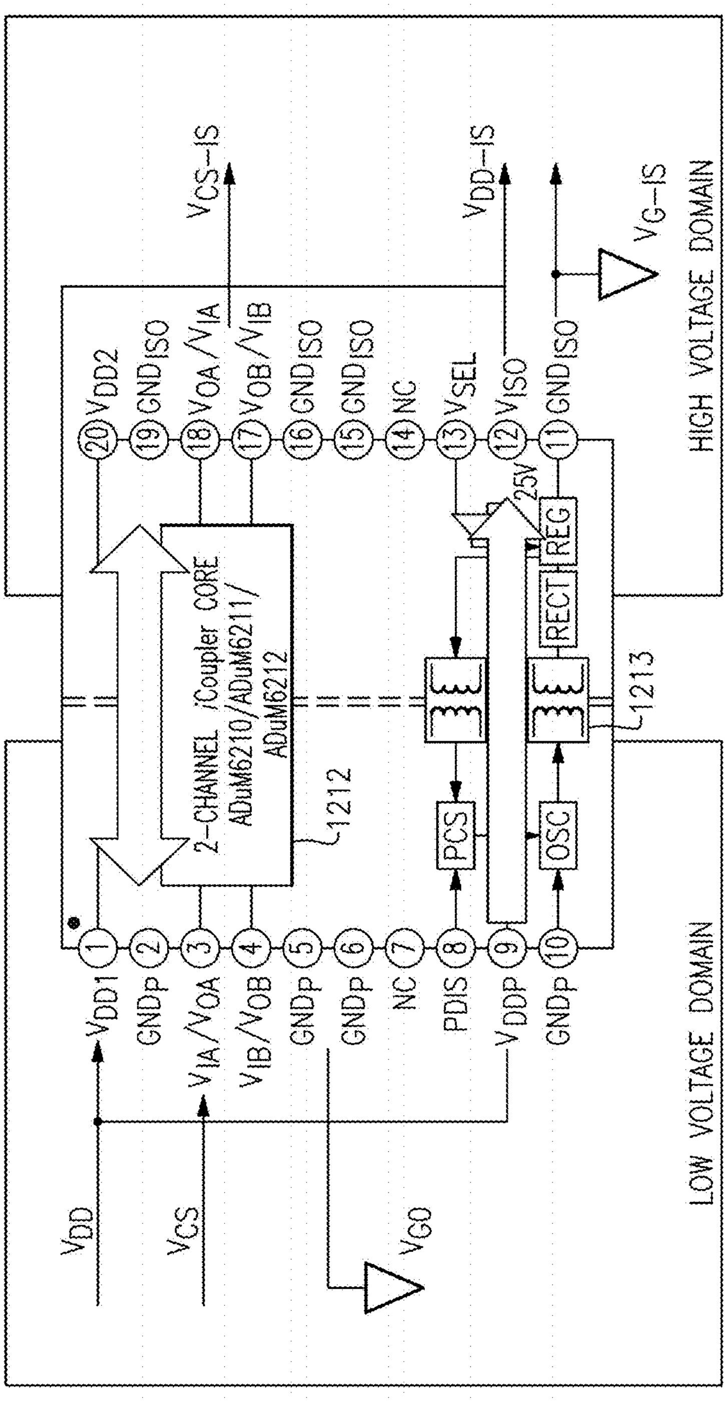
FIG. 12C schematically illustrates the internal circuitry of the packaged integrated isolator circuit shown in FIG. 12B.

FIG. 12C schematically illustrates the internal circuitry of the integrated isolator circuit 1210 illustrated in FIG. 12B comprising a coupler (isolation) circuit 1212 configured to provide a two-way isolated electrical connection for transmitting control signals $V_{CS}$ and a transformer 1213 and corresponding circuitry (described above) configured to receive the actuation voltage $V_{DD}$ and the initial reference voltage $V_{G0}$ and to generate the isolated actuation voltage $V_{DD\text{-}IS}$ and the isolated reference voltage $V_{G\text{-}IS}$. In some examples, the coupler (isolation) circuit 1212 may be configured for isolated signalling and may comprise a signal conditioning circuitry. In some examples, the transformer 1213 may comprise a power transformer that uses a voltage regulation circuitry combined with a transformer.

In some embodiments, the isolator circuit 1106 may comprise one or more optical isolators configured to generate isolated control, actuation, and reference voltages by converting input voltages to optical beams and detecting the optical beams to generate the isolated voltages.

Circuit Breaker Circuitry with Optical Isolation

In some implementations, one or more of the first, second, and third isolators 1006, 1008, 1022 of the control circuit 1000 (FIG. 10), or one or more of the first, second, and third isolators 1106*a*, 1106*b*, 1106*c* of the control circuit 1101 (FIG. 11), may comprise an optical isolator.

In some embodiments, the optical isolator may comprise at least one optical source or photon generation source (e.g., a semiconductor optical source such as a light emitting or laser diode) optically coupled to at least one opto-sensitive or photon detection device (e.g., a semiconductor photoconductive or photovoltaic device). In some cases, the optical source may be configured to receive an input voltage or signal (e.g., $V_{DD}$ or $V_{CS}$) and generate a light beam having optical power or intensity proportional to the magnitude of the input voltage or signal. As such, the optical isolator may electrically isolate external circuits and devices that generate or provide control signals and actuation voltages for a control circuit of a MEMS switch from the internal circuitry of the control circuit. Similar to transformer-based (magnetic) isolation described above, optical isolation may allow the control voltages provided to the control electrode of a MEMS switch (e.g., a teeter-totter switch) to be referenced to the input voltage switched by the MEMS switch.

Advantageously, replacing one or more magnetic isolators (transformers) of a control circuit with optical isolators may allow reducing the cost and size of the control circuit. Since an optical isolator can be smaller than a transformer, in some cases a large number of optical isolators may be integrated on a single chip to provide optical isolation for multiple control circuits, or for a multichannel control circuit that controls multiple MEMS switches.

Figure 13:
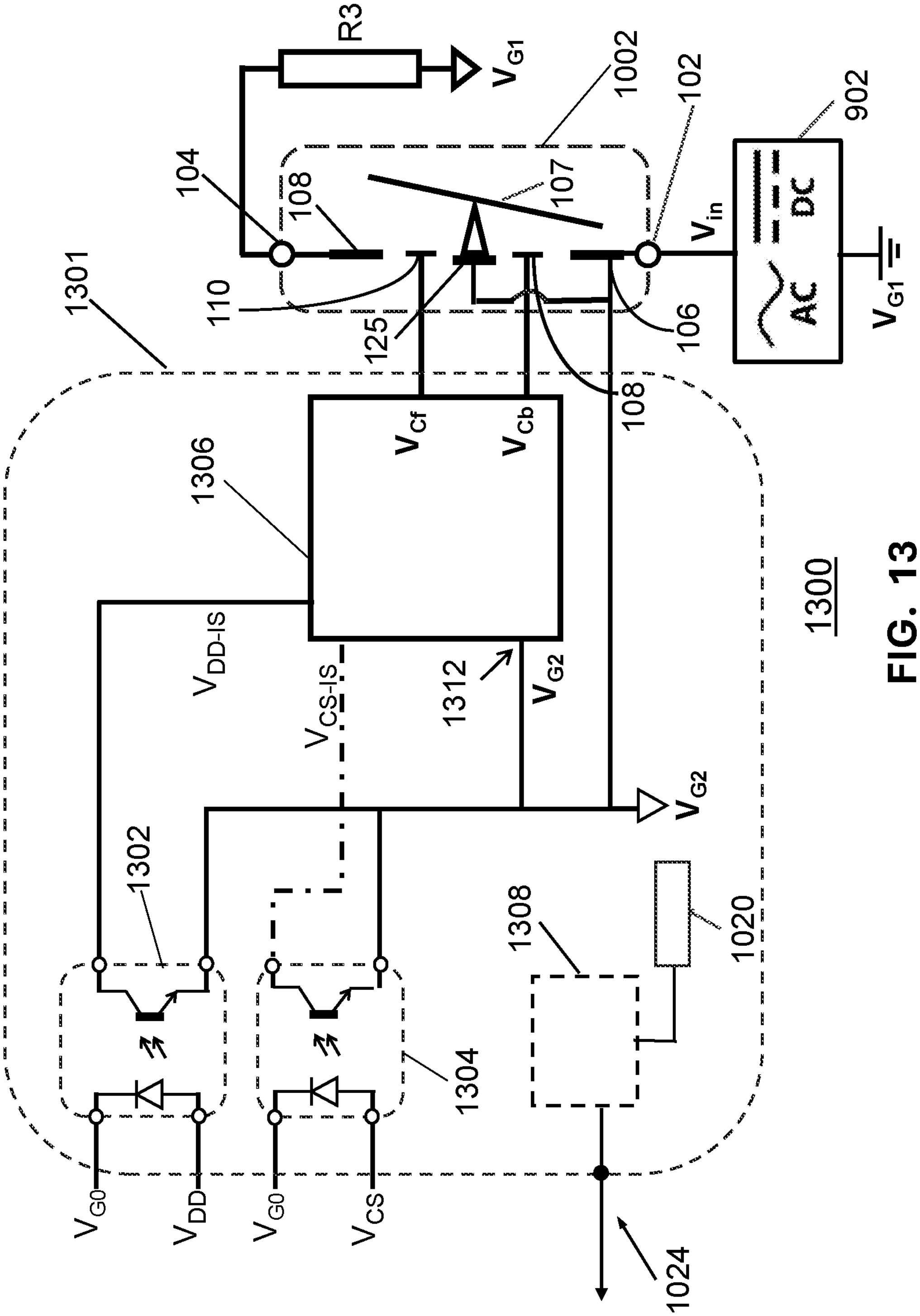
FIG. 13 schematically illustrates an example switching circuit (e.g., circuit breaker circuitry) comprising optical isolators.

FIG. 13 schematically illustrates an example switching circuit 1300 (e.g., circuit breaker circuitry) comprising a MEMS switch 1002 and a control circuit 1301 configured to control the state of the MEMS switch 1002 based on a control signal voltage $V_{CS}$ and an input voltage $V_{in}$ provided to the MEMS switch 1002 by an input voltage source 902, e.g., analogous the electrical configuration described above with respect to FIG. 9B. The control circuit 1301 may include some features that may have been described above with respect to the control circuit 1001 (FIG. 10) or 1101 (FIG. 11), the details of which may be omitted herein for brevity. Unlike the control circuits 1001, 1101, the control circuit 1301 may provide at least one of isolated actuation or control voltages ($V_{DD\text{-}IS}$ or $V_{CS\text{-}IS}$) from the respective actuation or control voltages ($V_{DD}$ or $V_{CS}$) using an optical isolator (c.f., a transformer). In some implementations, the control circuit 1301 may comprise a actuation and control circuit 1306 and first and second optical isolators 1302, 1304 configured to provide isolated actuation and control voltages ($V_{DD\text{-}IS}$ and $V_{CS\text{-}IS}$) to the actuation and control circuit 1306. In some embodiments, the control circuit 1301 may be configured to provide control voltages $V_{Cf}$ or $V_{Cb}$ to the front and back control electrodes 110, 108 of the MEMS switch 1002, with respect to the voltage of the middle electrode 125 (thereby with respect to the voltage of the beam 107), and substantially independent of the input voltage $V_{in}$ of the input voltage source 902.

In various implementations, the MEMS switch 1002 may comprise a teeter-totter switch (e.g., the teeter-totter switch 100, 150, or 300) or a cantilever-based switch. In the illustrated example, the MEMS switch 1002 comprises, without limitation, an asymmetric switch having a back contact electrode 106 electrically connected a first terminal 102 (e.g., an input terminal), a front contact electrode 110 electrically connected to a second terminal 104 (e.g., an output terminal), a middle electrode 125 electrically connected to a back contact electrode 106, and a beam 107, where the beam 107 is electrically connected to the middle electrode 125 by a conductive post that anchors the beam 107 to a substrate, as described herein. In some embodiments, the first terminal 102 may be electrically connected to an input voltage source 902 that provides an input voltage $V_{in}$ to the first terminal 102 with respect to a first reference voltage ($V_{G1}$), e.g., ground, and the second terminal 104 may be electrically connected the first reference voltage via a resistor R3. In some implementations, the teeter-totter switch 1002 may comprise a front control electrode 110 and a back control electrode 108 configured to control the position of the beam 107 (and thereby the state of the MEMS switch 1002) upon receiving front and back control voltages $V_{Cf}$ and $V_{Cb}$ from the control circuit 1001.

In some embodiments, the actuation and control circuit 1306 may comprise one or more features analogous to those described above with respect to the actuation and control circuits 1004 (FIG. 10) and 1104 (FIG. 11) of the control circuits 1001 and 1101, respectively, the details of which may be omitted herein for brevity. For example, the control circuit 1306 may be configured to receive the isolated actuation voltage $V_{DD\text{-}IS}$, an isolated control voltage $V_{CS\text{-}IS}$, and a reference voltage $V_{G2}$, and generate two control voltages $V_{Cf}$ and $V_{Cf}$ with respect to $V_{G2}$ using $V_{DD\text{-}IS}$ and based on $V_{CS\text{-}IS}$. For example, when $V_{CS\text{-}IS}$ indicates an ON state, $V_{Cf}$ can be substantially equal to $V_0$ and $V_{Cb}$ can substantially equal to zero (e.g., with respect to $V_{G2}$) and when $V_{CS-IS}$ indicates an OFF state, $V_{Cb}$ can be substantially equal to $V_0$ and $V_{Cf}$ can be substantially equal to zero. In some examples, the reference voltage port 1312 of the actuation and control circuit 1306 can be electrically connected (e.g., shorted) to the output of the input voltage source 902 and thereby to the back contact electrode 106, the middle electrode 125, and the beam 107, of the MEMS switch 107. In these examples, $V_{G2}$ can be substantially equal to $V_{in}$.

In some embodiments, the first optical isolator 1302 may be configured to receive the actuation voltage $V_{DD}$, with respect to an initial reference voltage, $V_{G0}$ from a voltage source external to the control circuit 1301 and provide the isolated actuation $V_{DD-IS}$ with respect to a first isolated reference voltage (e.g., an isolated ground), to the actuation and control circuit 1306.

In some embodiments, the second optical isolator 1304 may be configured to receive the control voltage $V_{CS}$, with respect to the initial reference voltage $V_{G0}$, from a signal source external to the control circuit 1301 and provide the isolated control voltage $V_{CS-IS}$, with respect to a second isolated reference voltage, to the actuation and control circuit 1306.

In some embodiments, isolated reference voltage ports (e.g., local output ground ports) of the first and second optical isolators 1302, 1304, can be electrically connected (e.g., shorted) to the reference voltage port 1312 of the actuation and control circuit 1306, such that the first and second isolated reference voltages are substantially equal to the reference voltage $V_{G2}$ of the actuation and control circuit 1306. In some such embodiments, the reference voltage port 1312 can be electrically connected (e.g., shorted) to the input voltage source 902 and the first and second isolated reference voltages of the first and second isolators, and $V_{G2}$ can be substantially equal to $V_{in}$. In these embodiments, the actuation and control circuit 1306 may be configured to amplify $V_{DD-IS}$ such that $V_{Cf}$ is greater than the voltage of the beam 107 ($V_{in}$) by $V_0$, which is the switching voltage for an isolated teeter-totter switch (e.g., when no voltage is applied between the middle electrode 125 and the one of the contact electrodes 106, 110, and $V_{Cb}$ is substantially equal to the voltage of the beam 107, when $V_{CS-IS}$ indicates an ON state, and that $V_{Cb}$ is greater than the voltage of the beam 107 ($V_{in}$) by $V_0$ and $V_{Cf}$ is substantially equal to the voltage of the beam 107, when $V_{CS-IS}$ indicates an OFF state.

In some embodiments, the actuation and control circuit 1306 may comprise a DC-to-DC converter configured to amplify $V_{DD-IS}$ and a driver configured to provide the amplified $V_{DD-IS}$ or $V_{G2}$ as control voltage to front or back control electrodes 108, 106, based on a switch state indicated by $V_{CS-IS}$.

In some implementations, at least one of the first and second optical isolators 1302, 1304, may comprise an optical source and an externally un-biased optical-to-electrical power converter configured to use light received from the optical source to generate a photovoltage and/or photocurrent proportional to received light and isolated from the electronic circuitry that drives the optical source. In some examples, the optical-to-electrical power converter may comprise an un-biased semiconductor diode and/or transistor (e.g., a photodiode and/or phototransistor) comprising a semiconductor junction such as a PN-junction and configured to operate in photovoltaic mode. In some embodiments, optical-to-electrical power converter may comprise a plurality of photodiodes connected in series and configured to generate an isolated voltage with respect to a reference voltage (e.g., $V_{G2}$) upon receiving light generated by the optical source. In some such embodiments, the isolated voltage may comprise a plurality of photovoltages generated along individual photodiodes and summed up in series to provide a large photovoltage proportional to the received light.

In some implementations, at least one of the first and second optical isolators 1302, 1304, may comprise an optical source and an externally biased opto-sensitive device (e.g., an optical detector such as a semiconductor photodiode or phototransistor) configured to use light received from the optical source and bias voltage to generate photovoltage and/or photocurrent proportional to received light and isolated from the electronic circuitry that drives the optical source. In some examples, the semiconductor photodiode may be configured to operate in photoconductive mode, generate a photocurrent and generate a photovoltage by passing the photocurrent through a resistor. In some embodiments, the optical detector may be biased by a voltage source of the control circuit 1301 isolated from electronic circuits that generate $V_{DD}$ and $V_{CS}$ to drive the optical sources of the first and second optical isolators 1302, 1304.

In some embodiments, in addition to the first and second optical isolators 1302, 1304, the control circuit 1301 may comprise a third isolator 1308 configured to receive a sensor signal from a sensor 1020 and output an isolated sensor signal 1024. In some implementations, the sensor 1020 may comprise a temperature sensor, a current sensor, or other types of sensors that may generate sensor signals indicative of an operating condition of the teeter-totter switch 1002. In some cases, the isolated sensor signal 1024 output by the control circuit 1301 may be used by a signal processing circuit to control the $V_{DD}$ and $V_{CS}$ provided to the control circuit 1301. In some embodiments, the third isolator 1308 of the control circuit 1301 can be an optical isolator comprising an optical source optically coupled to the optical detector or the optical-to-electrical converter. In some cases, the optical source may be configured to receive an electric signal from the sensor 1020 and generate light having optical intensity or power proportional to the electric signal, and the optical detector (or optical-to-electrical converter) may be configured to receive the light generated by the optical source and generate the isolated sensor signal 1024.

In some embodiments, at least one of the second and third isolators 1304, 1308 may comprise two pairs of optical source and optical detector, where the first pair electrically isolates incoming signals and data provided to the control circuit 1301 and a second pair electrically isolates outgoing signals and data output by the control circuit 1301.

In some embodiments, at least the first and second optical isolators 1302, 1304 may be fabricated on a common substrate and/or be included in a common package.

In some examples, at least one of the first, second, and third optical isolators 1302, 1304, 1308 may comprise an optocoupler, or an opto-isolator. In some such examples, the optocoupler may comprise a photo-transistor, a pair of photo-transistors (e.g., a photodarlington circuit), a photo-SCR, a photo-TRIAC, or a combination thereof. However, the embodiments are not so limited and other opto-sensitive devices may be used to form an opto-coupler to provide optical isolation between external circuits and the circuitry of the control circuit 1301.

In some embodiments, the control circuit 1301 may be configured to control the MEMS switch network 1102 similar to that described above with respect to FIG. 11A by providing the front control voltage $V_{Cf}$ to both front control electrodes 208$a$, 208$b$, and the back control voltage $V_{Cb}$ to both back control electrodes 208$a$, 208$b$.

Figure 14:
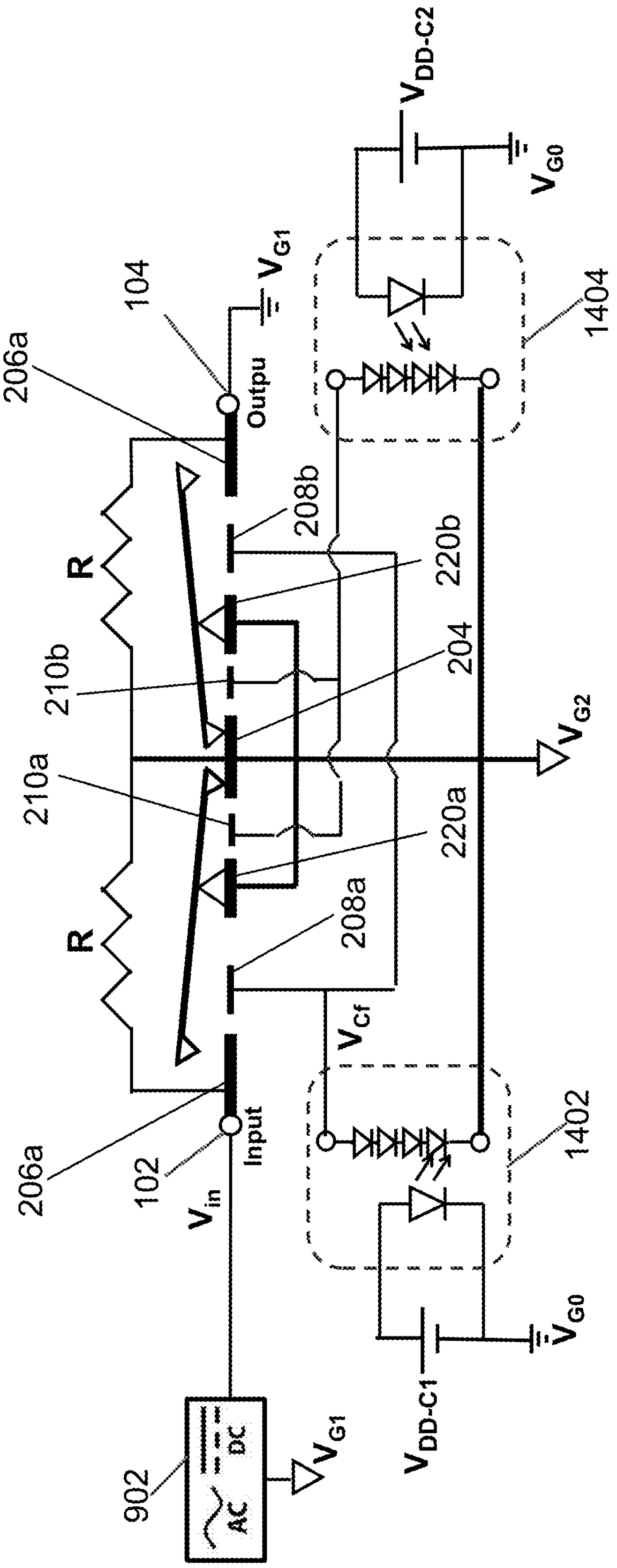
FIG. 14 schematically illustrates an example MEMS switch network controlled by optically isolated control voltages.

FIG. 14 is a schematic diagram illustrating a MEMS switch network comprising two MEMS switches connected in series and actuated by optically isolated control voltages provided by two optical isolators 1402, 1404. In various implementations, an individual MEMS switch of the MEMS switch network may comprise any one of the teeter-totter switch 100, 150, 300 described herein or a cantilever-based switch, or combination thereof. For illustrative purposes, the MEMS switch network in FIG. 14 includes two teeter-totter switches (e.g., each similar to the teeter-totter switch 100, 150, or 300) connected in series between the input and output terminals 102, 104 of an electronic circuit (e.g., an electronic circuit protected by the two MEMS switches). In some embodiments, the MEMS switch network shown in FIG. 14 may comprise one or more features described above with respect to the MEMS switch circuit shown, e.g., in FIG. 7 and the MEMS switch network 1102 shown in FIG. 11. In some embodiments, the MEMS switch network may be configured to receive an input voltage $V_{in}$ from a voltage source 902 with respect to a first reference voltage $V_{G1}$ via the input terminal 102 and controllably provide $V_{in}$ to the output terminal 104. In some cases, the beams of the MEMS switch network shown in FIG. 14 may be controlled by an optically isolated front control voltage $V_{Cf}$ provided to the front control electrodes 208$a$, 208$b$, and an optically isolated back control voltage $V_{Cb}$ provided to the back control electrodes 210$a$, 210$b$. In some examples, the front control voltage $V_{Cf}$ may be received from a first optical isolator 1402 and the back control voltage $V_{Cb}$ may be received from a second optical isolator 1404. In some embodiments, each of the first and second optical isolators 1402, 1404, may comprise an optical source and a high-voltage optical-to-electrical converter. In some embodiments, the high-voltage optical-to-electrical converter may be implemented as an array of photodiodes. In some embodiments, other types of optical-to-electrical converter may be used. In some embodiments, the first and second optical isolators 1402, 1404, may comprise multiple optical sources. In some examples, the number of optical sources and the number of optical-to-electrical converters in each one of the first and second optical isolators 1402, 1404, may be selected based on the switching voltage $V_0$ of the optical switches of the optical switch network. In some embodiments, the optical-to-electrical converter of the first optical isolator 1402 may be electrically connected between the first and second front control electrodes 208$a$, 208$b$, and a common back contact electrode 204 shared between the two switches of the MEMS switch network, which is electrically connected (e.g., shorted) to the first and second middle electrodes 220$a$, 220$b$. As such, the first optical isolator 1402 may provide the front control voltage $V_{Cf}$ with respect to the voltage of the common back electrode 204 that serves as a second reference $V_{G2}$, which is different from $V_{G1}$ and can be substantially equal to $(V_{in}-V_{G1})/2$. Similarly, the second optical isolator 1404 may provide the back control voltage $V_{Cf}$ with respect to the second reference voltage $V_{G2}$.

In some embodiments, the optical switch network may be deactivated from the OFF state to the ON state by providing an actuation voltage $V_{DD-C2}$ of substantially zero to the optical source of the second optical isolator 1404 and an actuation voltage $V_{DD-C1}$ to the optical source of the first optical isolator 1402, where magnitude of $V_{DD-C1}$ is configured to cause the first optical isolator 1402 to output a front control voltage $V_{Cf}$ substantially equal or larger than $V_s$ that can be substantially equal to $V_0$ (e.g., 80 volts) for an individual MEMS switch of the MEMS switch network, where $V_0$ is the switching voltage of the an isolated individual MEMS switch.

In some embodiments, the optical switch network may be activated from ON state to OFF state by providing an actuation voltage $V_{DD-C1}$ of substantially zero to the optical source of the first optical isolator 1402 and an actuation voltage $V_{DD-C2}$ to the optical source of the second optical isolator 1404, where magnitude of $V_{DD-C2}$ is configured to cause the second optical isolator 1404 to output a back control voltage $V_{Cb}$ substantially equal or larger than $V_0$.

In some embodiments, the control voltages $V_{Cf}$ (or $V_{Cb}$) provided by the optical-to-electrical converters of the first and second optical isolators 1402, 1404, can be larger than the $V_{DD-C1}$ (or $V_{DD-C2}$). For example, by illuminating the optical-to-electrical converter over an extended period optically generated charges accumulated on a control electrode may build up to generate a voltage difference larger than $V_{DD-C1}$ (or $V_{DD-C2}$) between the control electrode and the respective beam. As such, in some embodiments, the first and second optical isolators 1402, 1404 may be used to generate the voltages needed for actuating the beams of the two MEMS switches, and the corresponding MEMS switching system may not need additional electronic circuitry (e.g., DC-to-DC converters and drivers) and separate control signals for actuation. In some cases, MEMS switching systems of the types described with respect to FIG. 14 may lack high-voltage generators such as high-voltage power supplies (e.g., supplying more than 20V) and charge pumps. Removing charge pumps and/or high-voltage power supplies may provide significant noise reduction. In some examples, certain circuits having charge pumps and/or high-voltage power supplies can exhibit noise of up to 115 dBm. Removing the charge pumps and/or high-voltage power supplies may reduce the noise to less than −135 dBm or less than −157 dBm, for example.

Figure 15:
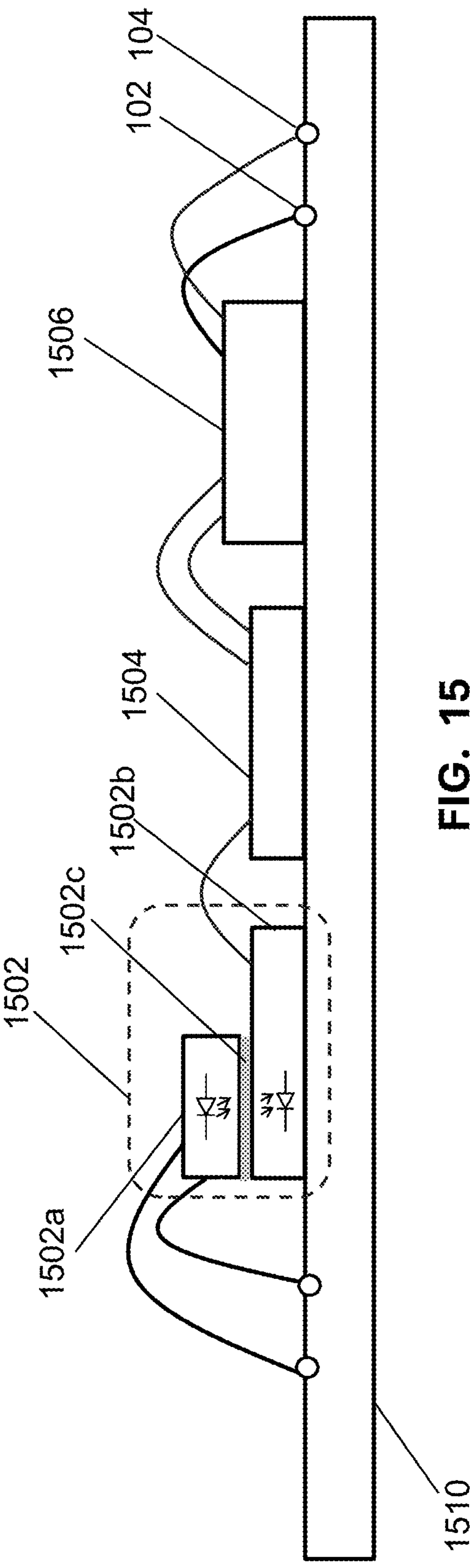
FIG. 15 schematically illustrates an example integrated MEMS switch system including a MEMS switch device, a voltage supply and a control circuit configured to control the MEMS switch device.

In some embodiments, an optical isolator (or at least a portion of the optical isolator) and actuation and control circuit of a MEMS control circuit MEMS switch may be integrated on a common substrate and/or be co-packaged, e.g., to reduce manufacturing costs and form factor. Additionally, in some implementations, a MEMS switch controlled by a control circuit may be integrated on a common substrate and/or be co-packaged with the control circuit or a portion of the control circuit (e.g., the optical isolators and/or the actuation and control circuit). FIG. 15 illustrates an example integrated MEMS switch system including a MEMS switch device 1506, a voltage supply and a control circuit 1504 configured to control the MEMS switch device 1506, and an optical isolator 1502 configured to electrically isolate the actuation and control circuit 1504 from another circuitry that provides $V_{DD}$ and $V_{CS}$ to the actuation and control circuit 1504. In various implementations, the MEMS switch device 1506 may comprise a teeter-totter switch (e.g., the teeter-totter switch 100, 150, or 300), a MEMS switch network (e.g., the MEMS Switch network 1102 or the MEMS Switch network show in FIG. 7), or another type of MEMS switch. In some embodiments, two or more of the MEMS switch devices 1506, the actuation and control circuit 1504, and the optical isolator 1502 may be disposed on a common substrate. In some embodiments, the MEMS switch device 1506, the actuation and control circuit 1504, and the optical isolator 1502 may fabricated on separate chips which are disposed and/or mounted on the common substrate 1510 after fabrication. In some cases, the MEMS switch device 1506 may be configured to control the electrical connection between an input terminal 102 and an output terminal 104 of an electronic circuit (e.g., an electronic circuit formed on the substrate 1510).

In some embodiments, the optical isolator 1502 may comprise an optical source and optical-to-electrical converter configured to receive light generated by the optical source. In some examples, the optical isolator 1502 may comprise a first layer 1502*a* comprising the optical source disposed over a second layer 1502*b* comprising the optical-to-electrical converter, and a middle layer 1502*c* (e.g., an optically transparent layer) configured to allow light generated by the optical source to be received by the optical-to-electrical converter or configured to redirect or guide light generated by the optical source to the optical-to-electrical converter. The optical source may comprise one or more light emitting diodes or laser diodes and the optical-to-electrical converter may comprise one or more photodiodes, phototransistors, or other photosensitive devices (e.g., photosensitive semiconductor devices). In some embodiments, the optical isolator 1502 may comprise multiple pairs of optical sources and optical-to-electrical converters each configured to isolate one of the signals or voltages provided to the actuation and control circuit 1504. In some cases, at least one pair of optical source and optical-to-electrical converter may use different wavelength compared other pairs. In some cases, the optical isolator 1502 may comprise a single optical source and a plurality of optical-to-electrical converters configured to receive light from the single optical source.

In various implementations, the middle layer 1502*c* may comprise an optically transparent medium such a clear adhesive, a paste, a film, having high optical transmission within wavelength range comprising the wavelengths generated by the optical source. In some cases, the middle layer 1502*c* may comprise an optical interposer configured to direct light generated by the optical source in the first layer 1502*a* to the optical-to-electrical converter (e.g., a photodetector) in the first layer 1502*b*. In some examples, the interposer may comprise a Fresnel lens (e.g., a planar Fresnel lens), a composite structure comprising a waveguide, a structure comprising an optical filter (e.g., a planar optical filter, such as, grating or multilayer coating), an optical waveguide, or combination thereof. Accordingly, in various embodiments, the middle layer 1502*c* may be fabricated (or integrated within the package/SIP construction) using different methods (e.g., layer deposition, photolithographic patterning, hybrid integration, bonding, and the like) and using different materials depending on a selected structure and requirements of an application.

In some embodiments, the optical isolator 1502 may comprise an optical source and an optical-to-electrical converter fabricated side-by-side over on a common surface (e.g., top surface of the substrate 1510) such that the optical-to-electrical converter can receive at least a portion of light generated by the optical source via an optical path extended substantially in a lateral direction over the common surface. In some examples, the optical path may be established by an intervening layer formed on or over the common surface between the laterally separated optical source and optical-to-electrical converter. The intervening layer may be configured to facilitate transmission of light from the optical source to the optical-to-electrical converter. In various implementations, the intervening layer may comprise a clear adhesive, a paste, a film, having high optical transmission within wavelength range comprising the wavelength of the optical source. In some cases, the intervening layer may comprise an optical interposer configured to direct or guide light generated by the optical source to the optical-to-electrical converter (e.g., a photodetector) via the optical path. In some examples, the interposer may comprise a Fresnel lens, a composite structure comprising a waveguide, a structure comprising an optical filter (e.g., a planar optical filter, such as, grating or multilayer coating), or combination thereof. Accordingly, in various embodiments, the intervening layer may be fabricated (or integrated within the package/SIP construction) using different methods (e.g., layer deposition, photolithographic patterning, hybrid integration, bonding, and the like) and using different materials depending on a selected structure and requirements of an application.

In some embodiments, the MEMS switch device 1506, the actuation and control circuit 1504, and the optical isolator 1502 may be electrically coupled to each other by wire bonds. In some embodiments, two or more of the MEMS switch device 1506, the actuation and control circuit 1504, and the optical isolator 1502 may be electrically coupled by conductive lines formed over or on the substrate 1510.

In some cases, the integrated MEMS switch system shown in FIG. 15 may comprise the switching circuit 1300.

In some cases, the MEMS switches of the MEMS switch network shown in FIG. 14 may be fabricated on a first chip and the first and second optical isolators 1402 and 1404 may be fabricated on a second chip, and corresponding MEMS system may be formed by disposing the first and second chips on a common substrate and electrically connecting them. For example, the MEMS device 1506 in FIG. 15 may comprise the first chip, the optical isolator 1502 may comprise the second chip and the voltage supply and the actuation and control circuit 1504 may be removed to directly electrically connect the optical isolator 1502 the MEMS device 1506.

MEMS Switch Protection with Field Effect Transistor

As described above, the behavior of the resistance of the conductive path established by a teeter-totter switch (or in general a MEMS switch) may change as a function of a voltage difference between the front control electrode (e.g., control electrode 110) and the conductive beam (e.g. the conductive beam 107). It has been observed that the electrical path between the front contact electrode (e.g. the front contact electrode 109) and the conductive beam may change between an ON-state resistance and an open circuit in a gradual manner (e.g., in a stepwise manner). Without being bound to any theory, such behavior can be attributed to a physical arrangement where the number of contact regions or points between the front contact electrode and the conductive beam gradually decrease. This may be due to, e.g., asperities or uneven contact surfaces between the contact electrodes and the beam. In addition, similar effects may be observed when the contact area depends on, e.g., proportional to, the amount of force applied between the contact electrodes and the beam. The inventors have discovered that such behavior may be understood by modeling the teeter-totter switch (or in general a MEMS switch), as a plurality of MEMS switch elements electrically connected in parallel where the electrical path established by an individual MEMS switch element can either have a very large resistance (e.g., resembling and open circuit) or an ON resistance (e.g., a low resistance between 5 to 10 Ohms). As such, when the voltage between the front control electrode and the conductive beam is increased to transition from the OFF state to the ON state, the number of MEMS switch elements that provide the ON resistance gradually increase and thereby the resistance of the conductive junction established by the MEMS switch gradually decreases. Similarly, when the voltage between the front control electrode and the conductive beam is decreased to transition from the ON state to the OFF state, the number of MEMS switch elements that provide the ON resistance gradually decrease and thereby the resistance of the remaining conductive junctions established by the MEMS switch gradually increases. In some cases, during such switching events, a very large amount of current may pass through the last one or few MEMS switch elements that transition from the ON resistance to an open circuit, and similarly a very large voltage drop may be generated across the first one or few MEMS switch elements that transition from an open circuit to the ON resistance. In some cases, when the MEMS switch (e.g., teeter-totter switch) is used in a circuit breaker to switch a large voltage (e.g., larger than 100, 200, or 300 volts), an electric discharge and/or a high current through few MEMS switch elements (each having ON resistance of few Ohms) during such transitions may cause severe damage to MEMS switch elements and, equivalently, to the contact regions of the conductive beam and front contact electrode of the MEMS switch, resulting in a high resistance ON state or, in some cases, a dysfunctional MEMS switch.

In some embodiments, to avoid the extreme voltage and current conditions that may occur at small and localized regions of contact surfaces of the front contact electrode and the conductive beam (equivalent to few MEMS switch elements of the plurality of MEMS switch elements), a protective switch (e.g., a transistor such as field effect transistor), which may referred to herein as a hot switch or protective switch, may be electrically connected in parallel with the teeter-totter switch to reduce the electric current flowing through the teeter-totter switch during transition from OFF state to ON state and reduce the voltage between the conductive beam and front contact electrode of the teeter-totter switch during transition from ON state to OFF state. In some such embodiments, a control voltage (e.g. gate voltage, Vg) provided to the transistor may be configured to turn on the protective switch before providing an activation or deactivation voltage to the teeter-totter switch and to turn off the protective switch when the teeter-totter switch completes the transition to ON or OFF state. In some cases, given that the transition period is relatively short, the current handled by the transistor may not impose extreme current/voltage handling requirements on the transistor allowing usage of transistors with reasonable size and cost.

It will also be appreciated that while the hot switching condition is described herein in reference to a model equivalent circuit with a plurality of MEMS elements electrically connected in parallel, the inventors have discovered that protective switches to protect against hot switching conditions are of particular utility in the context of high current applications of circuit breakers that may employ a plurality of MEMS switches in parallel to handle high currents. Thus, as disclosed herein, multiple MEMS elements depicted as being electrically in parallel may represent actual multiple MEMS switches or an equivalent circuit of a single MEMS switch.

Figure 16B:
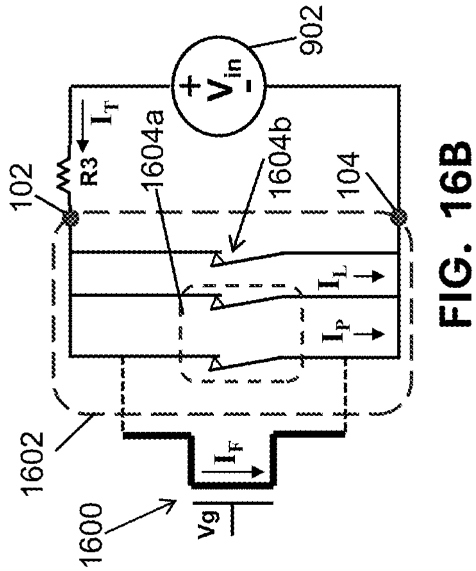
FIGS. 16A-16D schematically illustrate current flow through an equivalent circuit for a MEMS switch protected by a protective switch, during transition of the MEMS switch from ON state to OFF state.
Figure 16D:
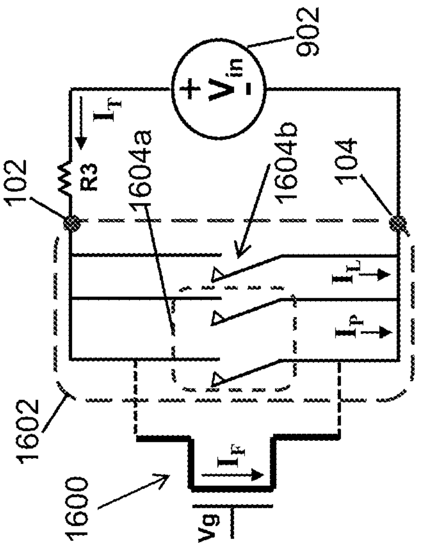

FIGS. 16A-16D schematically illustrate current flow through an equivalent circuit including one or more MEMS switches (e.g., a teeter-totter switch) 1602 protected by a protective switch (e.g., a field effect transistor, FET) 1600, during different stages of transition from the ON state to the OFF state. In this example, the MEMS switch 1602 is configured to control the electrical connection between a first terminal 102 (e.g., input terminal) and a second terminal 104 (e.g., output terminal) that are connected to a voltage source 902 through a resistor R3. As described above, the one or more MEMS switches 1602 can represent a plurality of MEMS switch elements or a single MEMS switch having multiple contact points. The one or more MEMS switches 1602 comprises a main group 1604*a* (e.g., having a total on resistance of about 66 milliohms for illustrative purposes only) and a single MEMS switch element 1604*b* having an on resistance (e.g., having a total on resistance of about 6 milliohms for illustrative purposes only), representing the last MEMS switch or a last region of a contact surface that will be disconnected during transition to the OFF state. In some cases, when the one or more MEMS switches 1602 is the ON state (FIG. 16A), the current Ip passing through the group 1604*a* can be, e.g., 2.96 A, the current $I_L$ passing through the single element 1604*b* can be 33 mA, and the protective switch 1600 is off (no current passes through the FET 1600). In some cases, before activating the one or more MEMS switches 1602, the FET 1600 is turned on by providing sufficient voltage (Vg) to the gate contacts (FIG. 16B). As a result, a portion of the current may be diverted to the protective switch 1600, which may have an ON resistance of 90 milliohms. By way of illustrative purposes only, 1.2 A (about 40% of the total current) may pass through the protective switch 1600, Ip can be about 1.8 A, Ip can be 2.96 A, $I_L$, can be 20 mA, and the protective switch 1600 can be in OFF state (e.g., Vg=0, and no or negligible current passes through the FET 1600). After all MEMS switch elements of the group 1604*a* transition to open circuit (FIG. 16C), about 2 A may pass through the protective switch 1600 and $I_L$, can be 45 mA. As such, because the FET 1600 handles a major portion of the current, the current flowing through the single MEM switch element 1604*b* (the last contact region) is still low and may not cause significant damage to the one or more MEMS switches 1602. When the single MEM switch element 1604*b* transitions to open circuit, the entire current (about 3 A) is diverted to the protective switch 1600 and prevents formation of a high voltage and potential an electric discharge across the single MEMS element 1604*b*. Once the single MEMS switch element 1604*b* is open, the FET 1600 may be turned off by reducing the gate voltage Vg to zero or below a threshold. Through a similar process the MEMS switch may be turned on prior to transition from OFF state to ON state to protect the MEMS switch 1602 from extreme voltage/current.

Figure 16A:
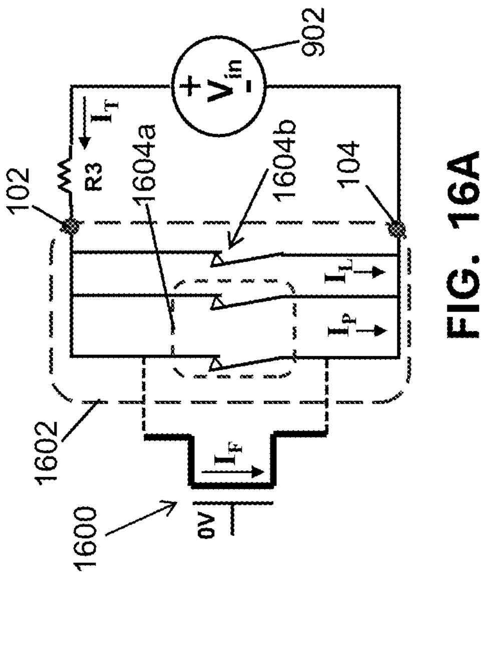
Figure 16C:
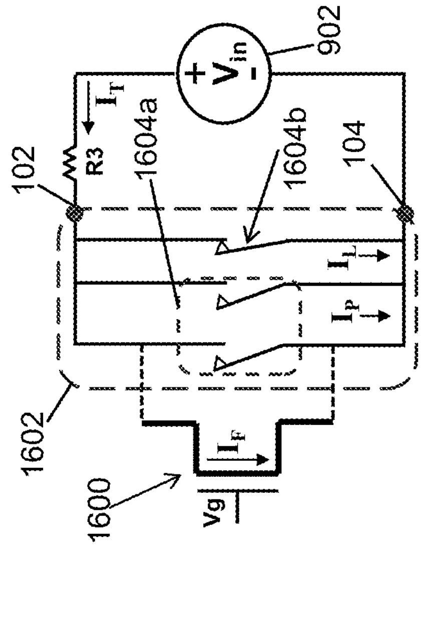
Figure 17B:
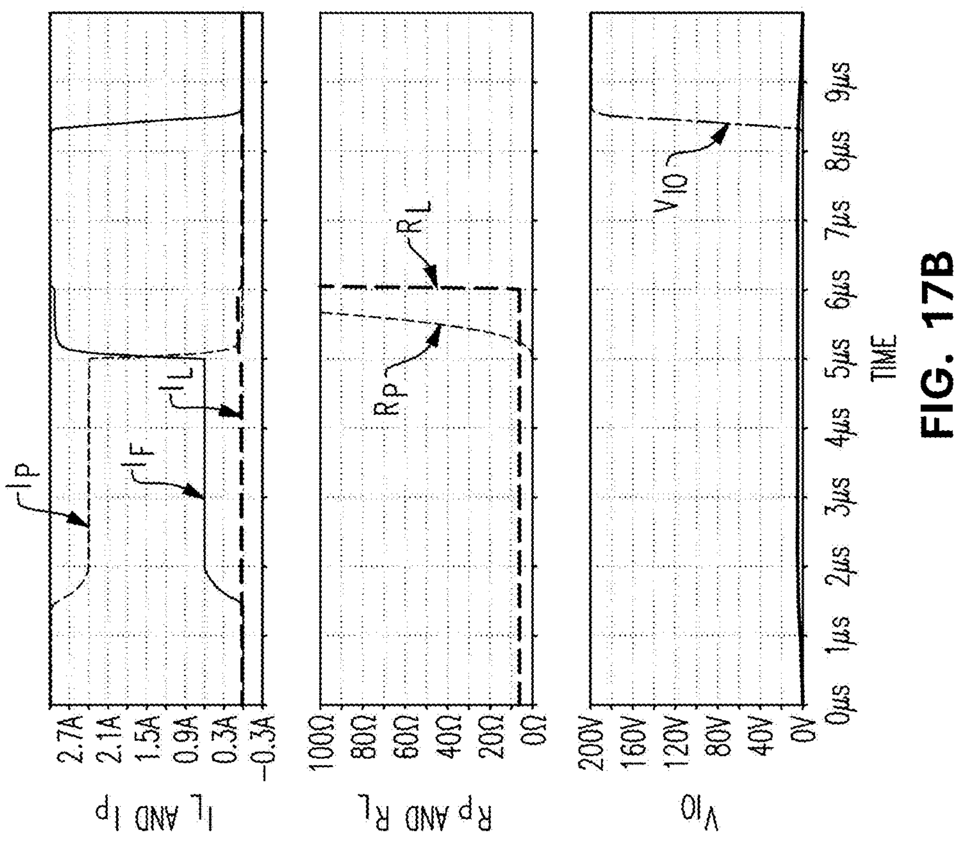
FIGS. 17A-17B schematically illustrate calculated temporal variation of current flow and voltage drop between the input and output terminals of the equivalent circuit shown in FIGS. 16A-16C, during a transition of the MEMS switch from ON state to OFF state, when a protective switch is off (FIG. 17A) and an on (FIG. 17B).
Figure 17A:
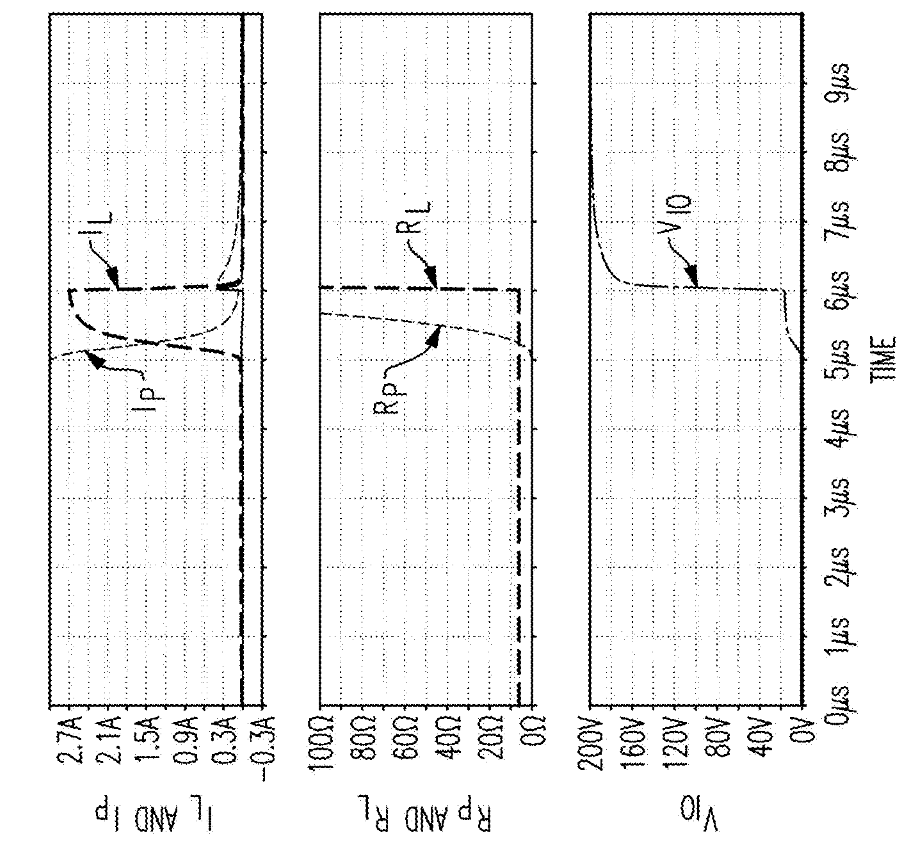

FIGS. 17A-17B illustrate simulated temporal variation of Ip and $I_L$, and voltage drop ($V_{IO}$) between the input and output terminals 102, 104, for the circuit shown in FIGS. 16A-16C, during transition of the one or more MEMS switches 1602 from an ON state to an OFF state, when the protective switch 1600 is in the OFF state (FIG. 17A) and when the protective switch 1600 is on state presence (FIG. 17B). In this example calculation the transition of the one or more MEMS switches 1602 from the ON state to the OFF state is modeled by transition of a group 1604*a* of MEMS switch elements and a single MEMS switch element 1604*b*, where during the transition the resistance Rp gradually increases (as more MEMS switch elements are switched OFF) and the resistance $R_L$ of the single MEMS switch element 1604*b*, suddenly jumps from the ON state to the OFF state. As shown in FIG. 17A, when the protective switch 1600 is turned OFF, $I_L$ suddenly increases as all MEMS switch elements of the group 1604*a* are switched OFF and right before the last MEMS switch element 1604*b* is turned OFF and as the last MEMS switch element 1604*b* is turned OFF, and $V_{IO}$ rapidly increases to $V_{in}$ during the transition of the last MEMS switch element 1604*b* to OFF state. In contrast, as shown in FIG. 17B, when the protective switch 1600 is turned ON, $I_L$, does not change significantly as all MEMS switch elements of the group 1604*a* are switched OFF and $V_{IO}$ increases to $V_{in}$ with a delay after the last MEMS switch element 1604*b* is turned OFF, when the protective switch is turned OFF. This calculation shows that by turning the protective switch 1600 ON before activating the MEMS switch 1602 and turning the protective switch 1600 OFF after the MEMS switch 1602 is turned OFF, the MEMS switch 1602 can be protected from sudden flow of a large current via a localized region of a contact pad and/or the conductive beam.

Figure 17D:
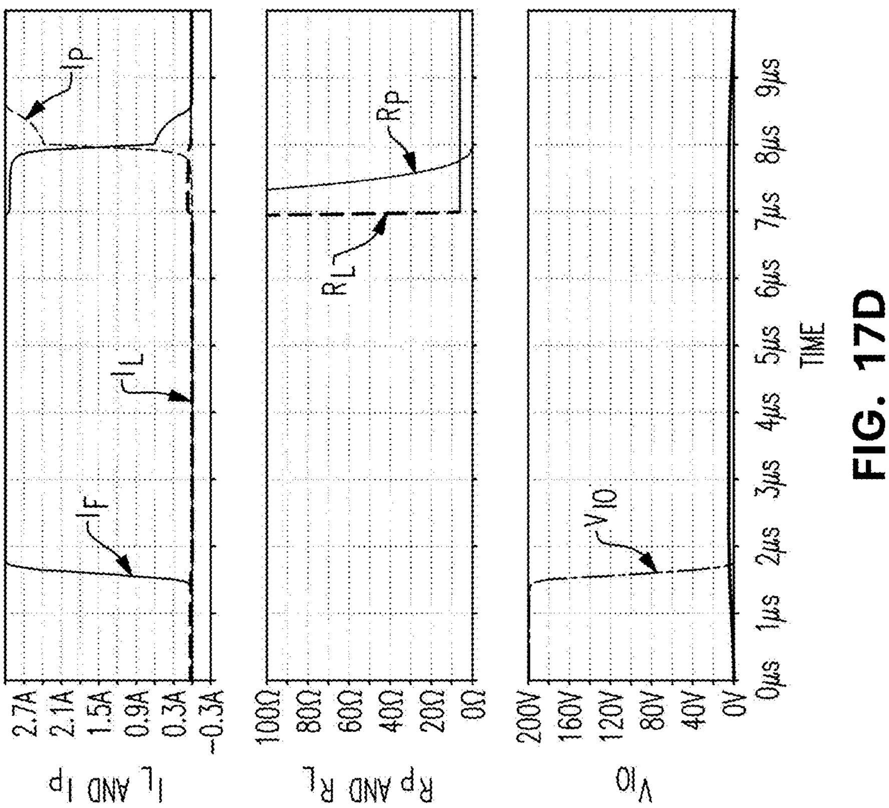
FIGS. 17C-17D schematically illustrate calculated temporal variation of current flow and voltage drop between the input and output terminals of the equivalent circuit shown in FIGS. 16A-16C, during a transition of the MEMS switch from OFF state to ON state, when the protective switch is off (FIG. 17C) and an on (FIG. 17D).
Figure 17C:
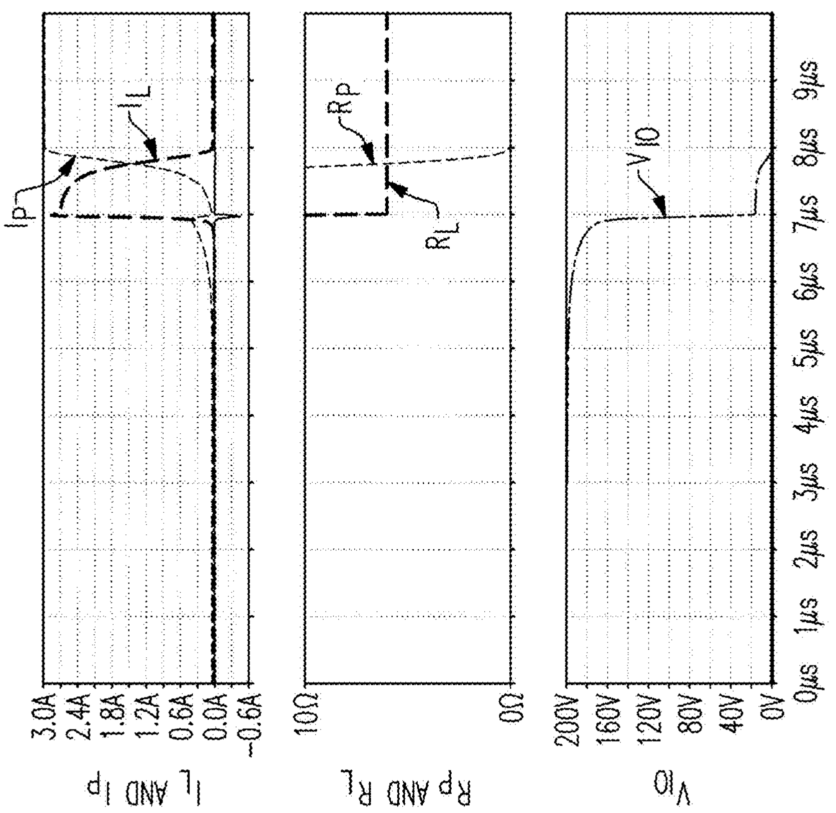

FIGS. 17C-17D illustrate simulated temporal variation of Ip and $I_L$, and voltage drop ($V_{IO}$) between the input and output terminals 102, 104, for the circuit shown in FIGS. 16A-16C, during transition of the one or more MEMS switches 1602 from an OFF state to an ON state, when the protective switch 1600 is in the OFF state (FIG. 17C) and when the protective switch 1600 is the ON state (FIG. 17D). Similar to FIGS. 17A-17B in this example calculation the transition of the one or more MEMS switches 1602 from the OFF state to the ON state is modeled by transition of a group 1604*a* of MEMS switch elements and a single MEMS switch element 1604*b*, where during the transition the resistance Rp gradually decreases (as more MEMS switch elements are switched ON) and the resistance $R_L$ of the single MEMS switch element 1604*b*, suddenly jumps from the OFF state to the ON state. As shown in FIG. 17C, when the protective switch 1600 is turned OFF, $I_L$ suddenly increases as all MEMS switch elements of the group 1604*a* are switched ON and right before the last MEMS switch element 1604*b* is turned ON and as the last MEMS switch element 1604*b* is turned ON, and $V_{IO}$ rapidly decreases to near zero during the transition of the last MEMS switch element 1604*b* to ON state. In contrast, as shown in FIG. 17D, when the protective switch 1600 is turned ON, $I_L$, does not change significantly as all MEMS switch elements of the group 1604*a* are switched ON and $V_{IO}$ decreases to near zero with a delay after the last MEMS switch element 1604*b* is turned ON, when the protective switch is turned OFF. This calculation shows that by turning the protective switch 1600 ON before deactivating the MEMS switch 1602 and turning the protective switch 1600 OFF after the MEMS switch 1602 is turned ON, the MEMS switch 1602 can be protected from sudden flow of a large current via a localized region of a contact pad and/or the conductive beam.

In some embodiments, the protective switch 1600 may comprise a transistor such as a field effect transistor (FET). The FET can comprise a metal oxide semiconductor (MOS) FET, and the one or more MEMS switches 1602 may comprise the MEMS switch 1002 in FIG. 10 (comprising a single teeter-totter switch) or the MEMS switch network 1102 in FIG. 11 (comprising two teeter-totter switches) to protect one or more teeter-totter switches therein during transitions between the ON and OFF states. In various implementations, the protective switch 1600 may comprise a power FET. In some examples, the FET 1600 may comprise a GaN FET or SiC FET. In some embodiments, the FET 1600 may be controlled using a one-shot circuit. In some examples, the one-shot circuit may comprise an XOR gate and a delay circuit (e.g., formed by one or more resistors and capacitors). In some examples, the one-shot circuit may comprise several inverter gates connected in series.

Figure 18:
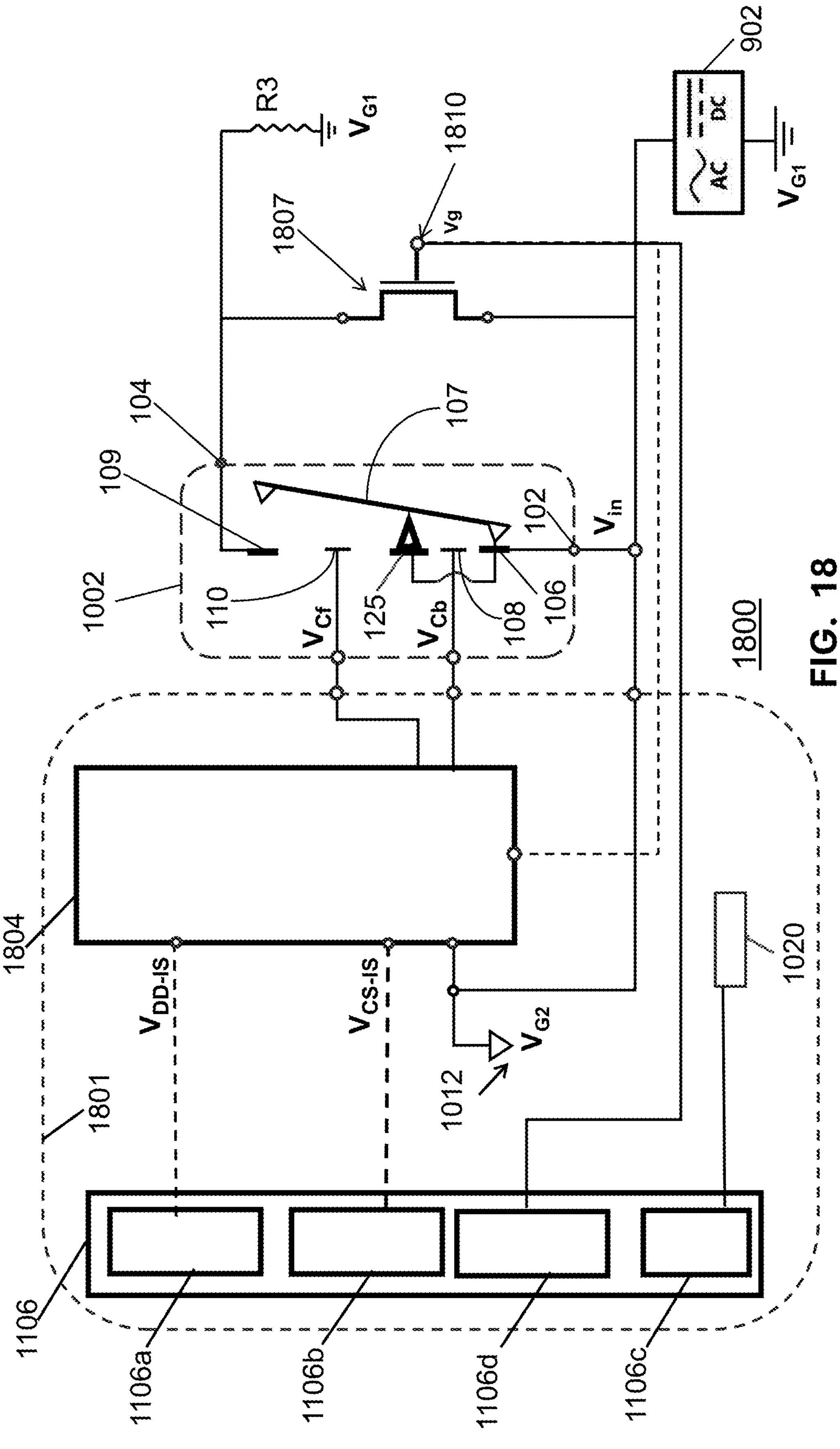
FIG. 18 schematically illustrates an example switching circuit comprising a MEMS switch protected by a field effect transistor (FET), serving as a protective switch, and a control circuit configured to control the state of the MEMS switch.

FIG. 18 schematically illustrates an example switching circuit 1800 comprising a MEMS switch 1002 (described above with respect to FIG. 10) and a control circuit 1801 configured to control the state of the MEMS switch 1002 by providing front and back control voltages $V_{Cf}$ and $V_{Cb}$ to the front and back control electrodes, 110, 108, of the MEMS switch 1002, respectively. In some examples, the control circuit 1801 may comprise a actuation and control circuit 1804 configured to generate the front and back control voltages $V_{Cf}$ and $V_{Cb}$. The MEMS switch 1002 may be connected between the input terminal 102 connected to a voltage source 902 and the output terminal 104 connected to an electrical ground or another reference voltage ($V_{G1}$), e.g., via a resistor R3. In some cases, control circuit 1802 may comprise one or more features described above, e.g., with respect to control circuit 1001 (FIG. 10), the details of which are omitted herein for brevity. For example, the control circuit 1801 may be configured to provide the front and back control voltages $V_{Cf}$ and $V_{Cb}$ with respect to an input voltage ($V_{in}$) provided by the voltage source 902 to the conductive beam 107 via the input terminal 102, the back contact electrode 106 and the middle electrode 125, which can be electrically connected to the back contact electrode 106.

It will be appreciated that as described above the MEMS switch 1002 may include multiple MEMS switch elements or behave similar to multiple parallel MEMS elements.

In some embodiments, a protective switch 1807 (e.g., a MOS FET) may be connected in parallel with the MEMS switch 1002 of the switching circuit 1800 to protect the contact surfaces of the conductive beam 107 and the front contact pad 109 during transitions between ON and OFF states. Similar to the protective switch 1600 (FIGS. 16A-16D), in some embodiments, the protective switch 1807 may be switched ON e.g., by a gate voltage Vg provided to the gate 1810 of the protective switch 1807, to establish a low resistance electrical path parallel to the MEMS switch 1002 to reduce an amount of current that passing through the conductive junction formed between conductive beam 107 and the front contact electrode 109 when transitioning from the ON state to the OFF state, or to reduce voltage difference between conductive beam 107 and the front contact electrode 109 when transitioning from OFF to ON state.

In some various implementations, the state of the protective switch 1807 may be controlled by the gate voltage ($V_g$) generated by the control circuit 1801 or a separate hot switch control circuit (not shown) different from the control circuit 1801. In some cases, the hot switch control circuit may be included in the control circuit 1801 or can be an external circuit connected to the control circuit 1801.

In some embodiments, the gate voltage $V_g$ may comprise an isolated gate voltage signal generated by the isolator circuit 1106 in response to receiving an external gate control voltage from the external hot switch control circuit. In some such embodiments, the isolator circuit 1106 may comprise a fourth isolator configured to receive the external gate control voltage and generate the isolated gate voltage. In some examples, the fourth isolator 1106*d* can be separate from the first, second, and the third isolators 1106*a*, 1106*b*, 1106*c*. In some such embodiments, the external hot switch control circuit may generate and/or control the gate voltage $V_g$ based at least in part on the $V_{CS}$ or $V_{CS\text{-}IS}$. For example, the external hot switch control circuit may temporally align the external gate control voltage with $V_{CS}$ or $V_{CS\text{-}IS}$ such that the protective switch 1807 is turned ON prior to activation or deactivation of the MEMS switch 1002 and is turned of after the MEMS switch 1002 is activated or deactivated.

In some embodiments, the actuation and control circuit 1804 of the control circuit 1801 may be configured to generate and/or control the gate voltage Vg based at least in part on $V_{CS}$ or $V_{CS\text{-}IS}$. In some such embodiments, the actuation and control circuit 1804 or the hot switch control circuit may use the isolated control signal $V_{CS\text{-}IS}$ (e.g., received from an isolator of the control circuit 1801) and/or $V_{Cf}$ and $V_{Cb}$, and generate and/or control the gate voltage Vg based at least in part on the $V_{Cf}$ and $V_{Cb}$ and/or $V_{CS\text{-}IS}$. For example, the actuation and control circuit 1804 may temporally align $V_g$ with $V_{CS\text{-}IS}$ and/or such that the protective switch 1807 is turned on prior to activation or deactivation of the MEMS switch 1002.

Figure 19:
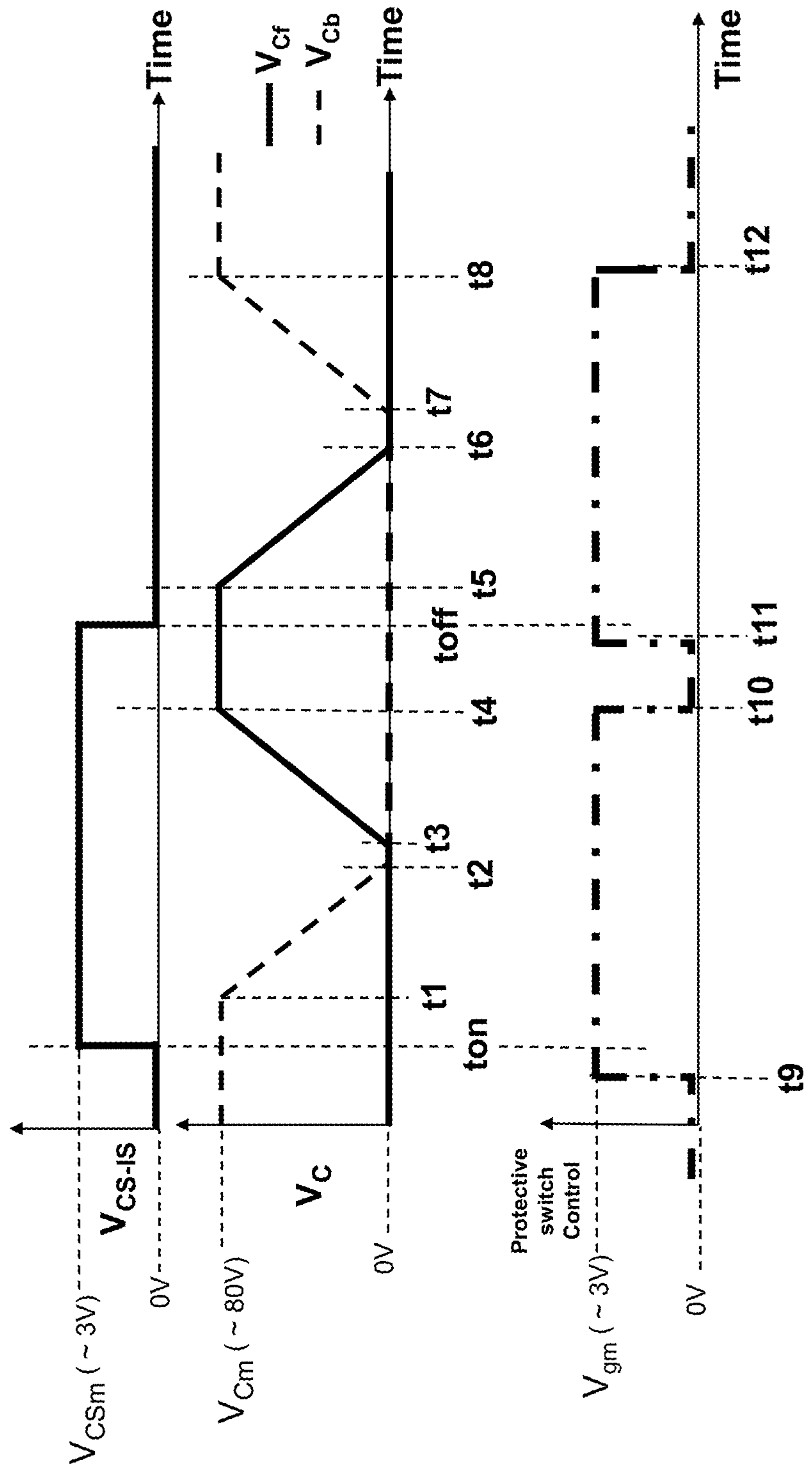
FIG. 19 schematically illustrates example temporal variations of control signal voltage and front and back control voltages provided to the MEMS switch shown in FIG. 18, and the gate voltage ($V_g$) provided to the FET during transitioning from OFF to ON state and FIG. 20 schematically illustrates an example circuit breaker comprising a MEMS switch and an electric overstress (EOS) protection device configured to protect the MEMS switch from transient signals.

FIG. 19 schematically illustrates example temporal variations of the control signal voltage (e.g., isolated control signal voltage $V_{CS\text{-}IS}$) and the front and back control voltages $V_{Cf}$ and $V_{Cb}$ provided to the MEMS switch 1002, and the gate voltage ($V_g$) provided to the protective switch 1807 during the transition from the OFF state to the ON state and vice versa.

In the example shown, at time $t_{on}$, $V_{CS\text{-}IS}$ can be switched from 0 to $V_{CSm}$ to change the state of the MEMS switch 1002 from OFF state to ON state and at time to the gate voltage ($V_g$) may be switched from 0 to an on voltage ($V_{gm}$) of the protective switch 1807 to turn on the protective switch 1807 to protect the MEMS switch 1002. In some cases, once the transition to the ON state is complete (e.g., at time $t_4$), $V_g$ can be switched from $V_{gm}$ back to 0 to to turn on the protective switch 1807. Further, in the example shown, at time $t_{off}$, $V_{CS\text{-}IS}$ can be switched from $V_{Cm}$ to 0 to change the state of the MEMS switch 1002 from the ON state to the OFF state and at time $t_{11}$ the gate voltage ($V_g$) may be switched from 0 to an ON voltage ($V_{gm}$) of the protective switch 1807 to turn on the protective switch 1807 to protect the MEMS switch 1002. In some cases, once the transition to OFF state is complete (e.g., at time $t_8$), $V_g$ can be switched from $V_{gm}$ back to 0 to to turn off the protective switch F1807.

As described above with respect to FIG. 11B, to change the state of the MEMS switch 1002 from the OFF state to the ON state, from time $t_1$ after $t_{on}$ to time $t_2$, $V_{Cb}$ may be decreased from $V_{Cm}$ to 0 and from time $t_3$ (than can be after $t_2$) to time $t_4$, $V_{Cf}$ may be increased from 0 to $V_{Cm}$. In some cases, to can be earlier than $t_1$ such that when the reduction of $V_{Cb}$ starts, the FET 1807 is already on. In some such cases, depending on the delay between ton and $t_1$, $t_9$ can be earlier, coinciding, or later than $t_{on}$. In some cases, the delay between $t_{on}$ and $t_1$ can be a predetermined value (e.g., a set parameter of the actuation and control circuit 1804) and the actuation and control circuit 1804 or the hot switch control circuit may be configured to temporally align to with respect to $t_{on}$ such that $t_9<t_1$. Similarly, to change the state of the MEMS switch 1002 from ON to OFF state, from time $t_5$ after $t_{off}$ to time $t_2$ $V_{Cf}$ may be decreased from $V_{Cm}$ to 0, and from time $t_7$ (that can be after $t_6$) $V_{Cb}$ may be increased from 0 to $V_{Cm}$. In some cases, $t_{11}$ can be smaller than $t_5$ such that when the reduction of $V_{Cf}$ starts, the protective switch 1807 is already on. In some such cases, depending on the delay between $t_{off}$ and $t_5$, $t_{11}$ can be smaller, equal, or larger than $t_{off}$. In some cases, the delay between $t_{off}$ and $t_5$ can be a predetermined value (e.g., a set parameter of the actuation and control circuit 1804) and the actuation and control circuit 1804 or the hot switch control circuit may be configured to temporally align $t_{11}$ with respect to $t_{off}$ such that $t_{11}<t_5$. In some cases, once the transition to ON state is complete (e.g., at time $t_8$), $V_g$ can be switched from $V_{gm}$ back to 0 to turn off the protective switch 1807. In some examples, $t_{on}$ (the edge of the MEMS control signal) may be delayed with respect to $t_9$ (the edge of the protective switch control signal) by a duration from 0.1 to 1 microsecond, from 1 to 100 microseconds, from 100 microseconds to 1 millisecond, from 1 to 100 milliseconds, or a time value that is in a range defined by any of these values or larger or smaller. In some examples, $t_1$ (the time at which the MEMS control voltage begins to change) may be delayed with respect to $t_{on}$ by a duration from 0.1 to 1 microsecond, from 1 to 100 microseconds, from 100 microseconds to 1 millisecond, from 1 millisecond to 100 milliseconds, or a time value that is in a range defined by any of these values or larger or smaller.

In some embodiments, protective switch 1807 may be replaced by two or more protective switches connected in parallel with the MEMS switch 1002 between the input and output terminals 102, 104.

In some embodiments, one or more protective switches may be connected in parallel between the input and output terminals 102, 104, of the MEMS switch network 1102 of the switching circuit 1100, or the MEMS switch 1002 of the switching circuit 1300, for protection against damage during transitions between ON and OFF states. In some cases, these protective switches may be controlled by the control circuits the switching circuits 1100 and 1300, or separate hot switch control circuit, e.g., based on temporal signal alignments described above with respect to FIG. 18, the details of which may not be repeated herein for brevity.

In some embodiments, two or more protective switches may be connected in parallel with a MEMS switch or MEMS switch network to provide protection during an activation or deactivation process. In some examples, two or more protective switches may be connected together in series between the input terminal 102 and 104 to protect a MEMS switch or MEMS switch network having an operating voltage greater than the operating voltage of an individual protective switch. In some examples, two or more protective switches may be connected together in parallel between the input terminal 102 and 104 to protect a MEMS switch or MEMS switch network having an operating current greater than the operating current of an individual protective switch. In some examples, three or more protective switches may be connected together in parallel and series between the input terminal 102 and 104 to protect a MEMS switch or MEMS switch network having operating voltage and current greater than the operating voltage and current of an individual protective switch. For example, two pairs of serially connected protective switches may be connected in parallel with the MEMS switch or MEMS switch network. In some embodiments, the two or more protective switches may be controlled by a single gate voltage distributed among the protective switches or by individual gate voltages synchronized to control the protective switches.

Circuit Breaker with MEMS Switch and Electrical Overstress (EOS) Protection

In some cases, a MEMS switch can be exposed to electrical overstress (EOS) events that may damage the switch by generating a high voltage, e.g., between a conductive beam and a contact electrode and generating a high current beyond the specified limits of the MEMS switch (e.g., exceeding one or both the operating voltage and operating current of the MEMS switch). For example, a MEMS switch (e.g., a teeter-totter switch) may experience a transient signal event, or an electrical signal lasting a short duration and having rapidly changing voltage and/or current and having high power. Transient signal events can include, for example, electrostatic discharge (ESD) events arising from an abrupt release of charge (e.g., voltage/current spike) from a device or system electrically connected to the MEMS. In some cases, an EOS event can occur when the MEMS switch is in the ON or OFF state. The EOS event can cause high current to flow through contacting regions of the MEMS switches (e.g., the end of the conductive beam contacting the corresponding contact electrode), and can even cause arcing to occur between non-contacting regions of the MEMS switches (e.g., the end of the conductive beam separated from the corresponding contact electrode). Such high current or arcing events can damage the MEMS switches. To prevent such EOS events from damaging the MEMS switches, according to various embodiments, an EOS protection device may be integrated with the MEMS switches and configured to shunt discharge current caused by the EOS events. In particular, a spark gap may be configured to arc in response to an overvoltage applied on the MEMS switch to protect the MEMS switch from being damaged, e.g., when the switch is in the ON or OFF state. In some such embodiments, the EOS or protection device may be electrically connected with the MEMS switch in parallel, between an input and output terminals (e.g., input and output terminals of the MEMS switch). In some embodiments, the EOS device may be electrically connected between an input terminal (or an output terminal) and a ground voltage or a reference voltage (e.g., the isolated reference voltage $V_{G\text{-}IS}$ in FIG. 11A). The EOS protection device can have an activation voltage (e.g., arcing voltage) lower than voltage that would cause damage to the MEMS switch. For example, in the OFF state, the EOS protection device can have an activation voltage lower than a breakdown voltage between the conductive beam and an open circuited one of the contact electrodes. In the ON state, the EOS protection device can have an activation voltage lower than a voltage that would cause excessive current flowing between the conductive beam and the contacting one of the contact electrodes to cause damage to the MEMS switch.

Figure 20:
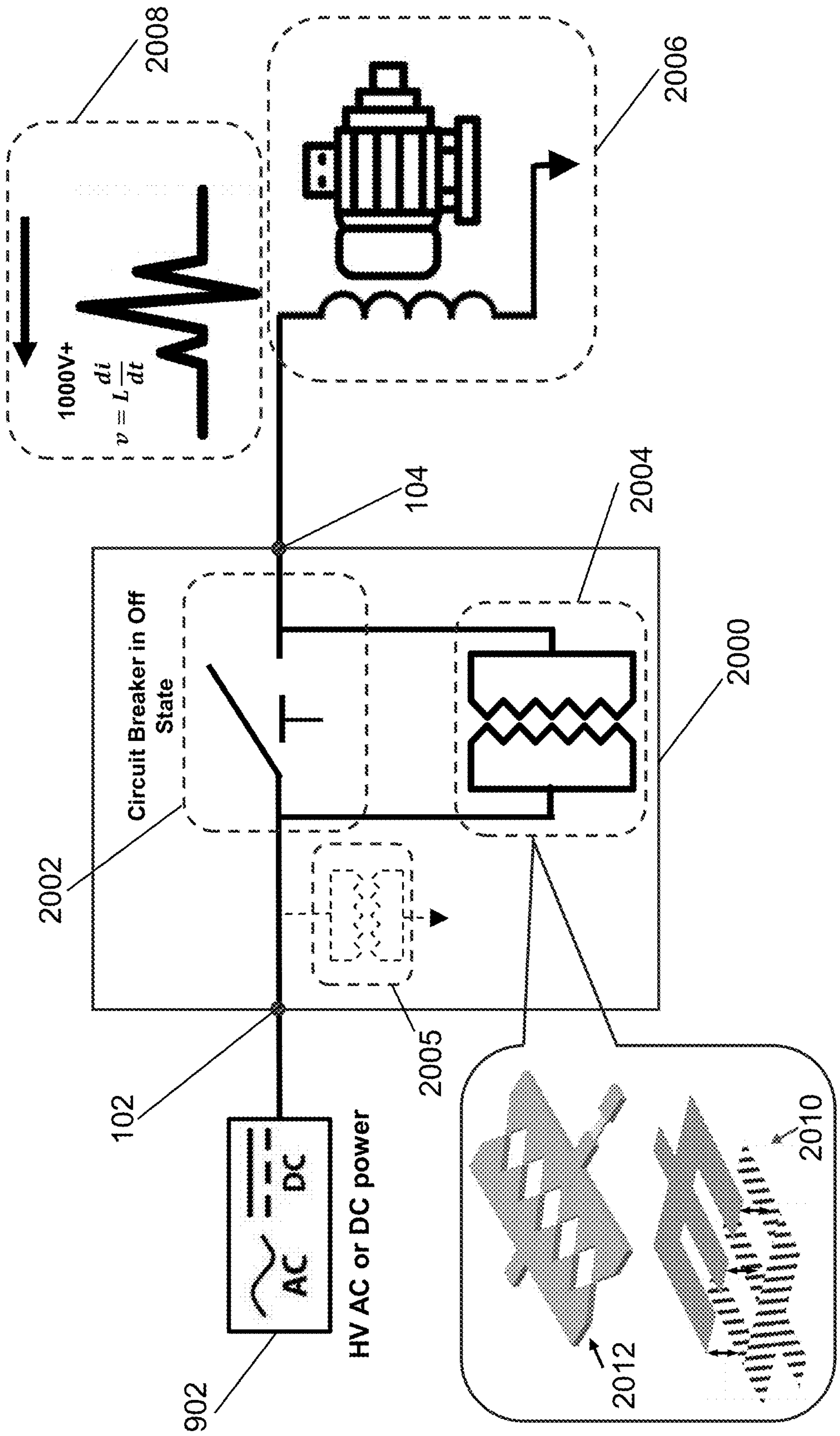

FIG. 20 schematically illustrates a circuit breaker 2000 connected between first and second terminals 102, 104. By way of example, the first terminal 102 is illustrated as being connected to an electric power source (e.g., a voltage source) 902 and the second terminal 104 is illustrated as being connected to an electric system 2006 (e.g., an electric machine such as an electromotor). The circuit breaker 2000 is configured to control the electrical connection between the electric power source 902 and the electric system 2006 using at least one MEMS switch 2002. In some embodiments, the circuit breaker 2000 may comprise the MEMS switch 2002 and an EOS protection device 2004 connected in parallel with the MEMS switch and configured to protect the MEMS switch 2002 against EOS events. In some embodiments, the MEMS switch 2002 may comprise a teeter-totter switch or teeter-totter switch network (e.g., the teeter-totter switches in FIGS. 1B, 2A, 3A, 5A, 10 or the teeter-totter switch networks in FIGS. 7, 8, and 11A FIG. 8). In some embodiments, the teeter-totter switch 2002 and the EOS protection device 2004 may be connected between an input and output terminals 102, 104 of the circuit breaker 2000 that are connected to the electric power source 902 and the electric system 2006, respectively. In some examples, the electric system may comprise an inductive load or device (e.g., an electromotor) that can generate a very large transient voltage 2008 (e.g., larger than 500 or 1000 volts) between the input and output terminals 102, 104 in response to a large transient current (di/dt). In some such examples, the EOS protection device 2004 may be configured to a protector for the MEMS circuit breaker against the resulting voltage (L×di/dt), e.g., by provide a shunt path when the transient voltage exceeds a threshold voltage (e.g., a breakdown voltage) of the EOS protection device 2004 (e.g. by generating an electric arc).

In some cases, the EOS protection device 2004 may comprise a spark gap, e.g., an integrated or on-chip spark gap). In contrast to solid-state EOS protection device, in some cases, the spark-gap may not transfer the high voltage across the breaker due to leakage.

In some implementations, the EOS protection device 2004 may comprise a lateral spark gap device 2012 comprising a pair of spaced conductive structures in which arcing can occur generally in a horizontal direction, e.g., in a direction parallel to a main surface of a substrate over which the conductive strictures are formed. For example, the conductive structures may be formed at substantially the same vertical level or be coplanar. The conductive structures may have a suitable shape including sharpened or substantially flat tips. In some such implementations, the lateral spark gap 2012 may comprise one or more spark gaps, e.g., an array of coplanar gaps, formed between a pair of coplanar arrays of electrodes formed on or above a substrate. Each electrode array of the pair of coplanar arrays of electrodes may be connected to one of a pair of terminals through which the EOS protection device 2004 can be connected to the input and output terminals 102, 104.

In some implementations, the EOS protection device 2004 may comprise a vertical spark gap device 2010 comprising a pair of vertically separated conductive structures in which arcing can occur generally in a vertical, e.g., in a direction crossing a main surface of a substrate over which the conductive strictures are formed. The conductive structures may have a suitable shape including sharpened or substantially planar tips. In some such implementations, the vertical spark gap device 2010 may comprise one or more spark gaps, e.g., an array of vertical gaps formed between a pair of vertically separated arrays of electrodes formed on or above a substrate. Each electrode array of the pair of vertically separated arrays of electrodes may be connected to a one of a pair of terminals through which the EOS protection device 2004 can be connected to the input and output terminals 102, 104.

In some embodiments, the EOS protection device 2004 may comprise a microplasma chamber configured to form a microplasma (e.g., having low resistance), upon receiving a high voltage signal (e.g., an unexpected transient signal). In some such embodiments, the microplasma chamber may comprise an enclosed volume or sealed chamber (e.g., hermetically sealed) formed on a chip (e.g., a semiconductor chip). For example, the sealed chamber may comprise a cavity formed within a substrate and a dielectric layer formed over the cavity. In some cases, the sealed chamber may be filled with a gas or gas mixture at specified pressure. The EOS protection device 2004 may further comprise a pair of electrodes connected to a pair of terminals through which the EOS protection device 2004 can be connected to the input and output terminals 102, 104. In some cases, at least one of the electrodes can be in contact with the gas molecules contained in the chamber and may be configured to form the microplasma upon receiving a high voltage via the input and output terminals 102, 104.

In some embodiments, the circuit breaker 2000 may comprise an EOS protection device 2005 electrically connected between the input terminal 102 (or the output terminal 104) and a reference potential such as ground (e.g., an isolated reference potential such as isolated ground) of the circuit breaker 2000. In various implementations, the circuit breaker 2000 may comprise one or both EOS protection devices 2005 and 2004.

Figure 21A:
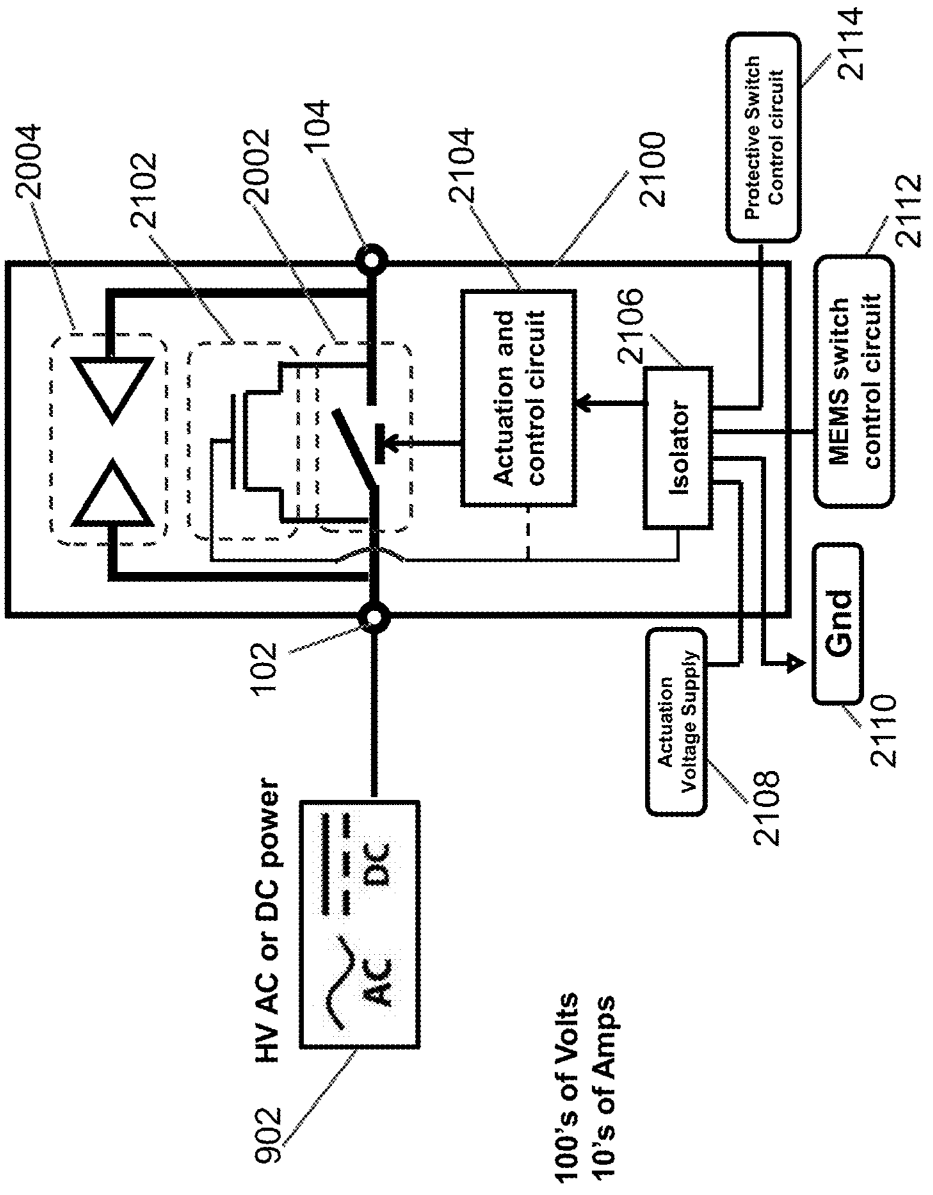
FIG. 21A schematically illustrates another example of a circuit breaker comprising a MEMS switch, an electric overstress (EOS) protection device configured to protect the MEMS switch from unexpected transient signals, and a protective switch configured to protect the MEMS switch during a transition between ON and OFF states.

FIG. 21A schematically illustrates an example circuit breaker 2100 comprising the MEMS switch 2002 and the EOS protection device 2004 configured to protect the MEMS switch 2002 against unexpected external transient signals (e.g., when the MEMS switch 2002 is in the OFF state). The EOS protection device 2004 is additionally configured to protect a protective switch 2102, e.g., a transistor, configured to protect the MEMS switch 2002 against formation of high current and/or high voltage between a contact electrode and the conductive beam of the MEMS switch 2002 during a transition between the ON and OFF states (as described above with respect to FIGS. 16A-16D and 18). In some embodiments, the MEMS switch 2002, the EOS protection device 2004, and the protective switch 2102 can be connected in parallel between the input and output terminals 102, 104 of the circuit breaker 2100. In some embodiments, the protective switch 2102 may comprise one or more features described above with respect to the protective switch 1600, 1807, as illustrated in FIGS. 16A-16D and 18, the details of which may not be repeated herein for brevity.

In some embodiments, the circuit breaker 2100 may be configured to provide electric power from an electric source 902 connected to the input terminal 102 to a device or system connected to the output terminal 104 and allow a system or user to control the connection between electric source and the device or system using MEMS switch 2002.

In some embodiments, the circuit breaker 2100 may comprise one or more features described above with respect to the switching circuit 1000, the switching circuit 1100, the switching circuit 1300, described above with respect to FIGS. 10, 11A, and 13, respectively, the details of which may not be repeated herein for brevity.

In some embodiments, the circuit breaker 2100 may comprise an isolator module 2106 comprising one or more isolators (e.g., optical isolators, magnetic isolators, and the like) configured to provide electric isolation between the circuits and elements within the circuit breaker 2100 and one or more external systems and devices. In some implementations, the isolator module 2106 may comprise one or more features described above with respect to the isolator circuit 1106 in FIGS. 11A and 18. The external systems and devices may provide signals or supply voltages to the circuit breaker 2100 and/or receive signals from the circuit breaker 2100. In some embodiments, the circuit breaker 2100 may comprise a voltage control and supply circuit 2104 configured to receive signals from the isolator module 2106 and provide control signals to the MEMS switch 2002 and the protective switch 2102. For example, the isolator module 2106 may receive a supply voltage from an actuation voltage supply 2108, a switch control signal from a switch control circuit 2112 and a protective switch control signal from a protective switch control circuit 2114 and may be configured to provide corresponding isolated voltages and signals to the voltage control and supply circuit 2104. In some cases, the supply voltage received from the actuation voltage supply 2108, the switch control signal received from the switch control circuit 2112, and the protective switch control signal received from the protective switch control circuit 2114 may be generated with respect to a first common reference voltage 2110 (e.g., a common ground) that is electrically isolated from a second common reference signal with respect to which the corresponding the isolated supply voltage, isolated switch control signal, and isolated protective switch control signal are generated. In some cases, the second common reference may be substantially equal to the electrical potential of one or more conductive beams of the MEMS switch 2102. In some embodiments, the protective switch 2102 may receive an isolated protective switch control signal corresponding to the protective switch control signal generated by the protective switch control circuit 2114 directly from the isolator 2106. In some embodiments, the voltage control and supply circuit 2104 may generate the protective switch control signal using switch control signal received from the switch control circuit 2112 (via the isolator module 2106). In some such embodiments, the circuit breaker 2100 may not receive the protective switch control signal from the protective switch control circuit 2114.

In some embodiments, the actuation voltage provided by the actuation voltage supply 2108 can be from 1 to 2 volts, from 2 to 3 volts from 3 to 4 volts from 4 to 5 volts, or any ranges formed by these values or larger or smaller values.

In some embodiments, the MEMS control signal provided by the MEMS switch control circuit 2112 can be from 1 to 2 volts, from 2 to 3 volts, from 3 to 4 volts, from 4 to 5 volts, or have a voltage value that is in a range defined by any of these values or larger or smaller.

In some embodiments, the protective control signal provided by the protective switch control circuit 2114 can be from 1 to 5 volts, from 5 to 10 volts from 10 to 20 volts from 20 to 30 volts, or any ranges formed by these values or larger or smaller values.

Figure 21B:
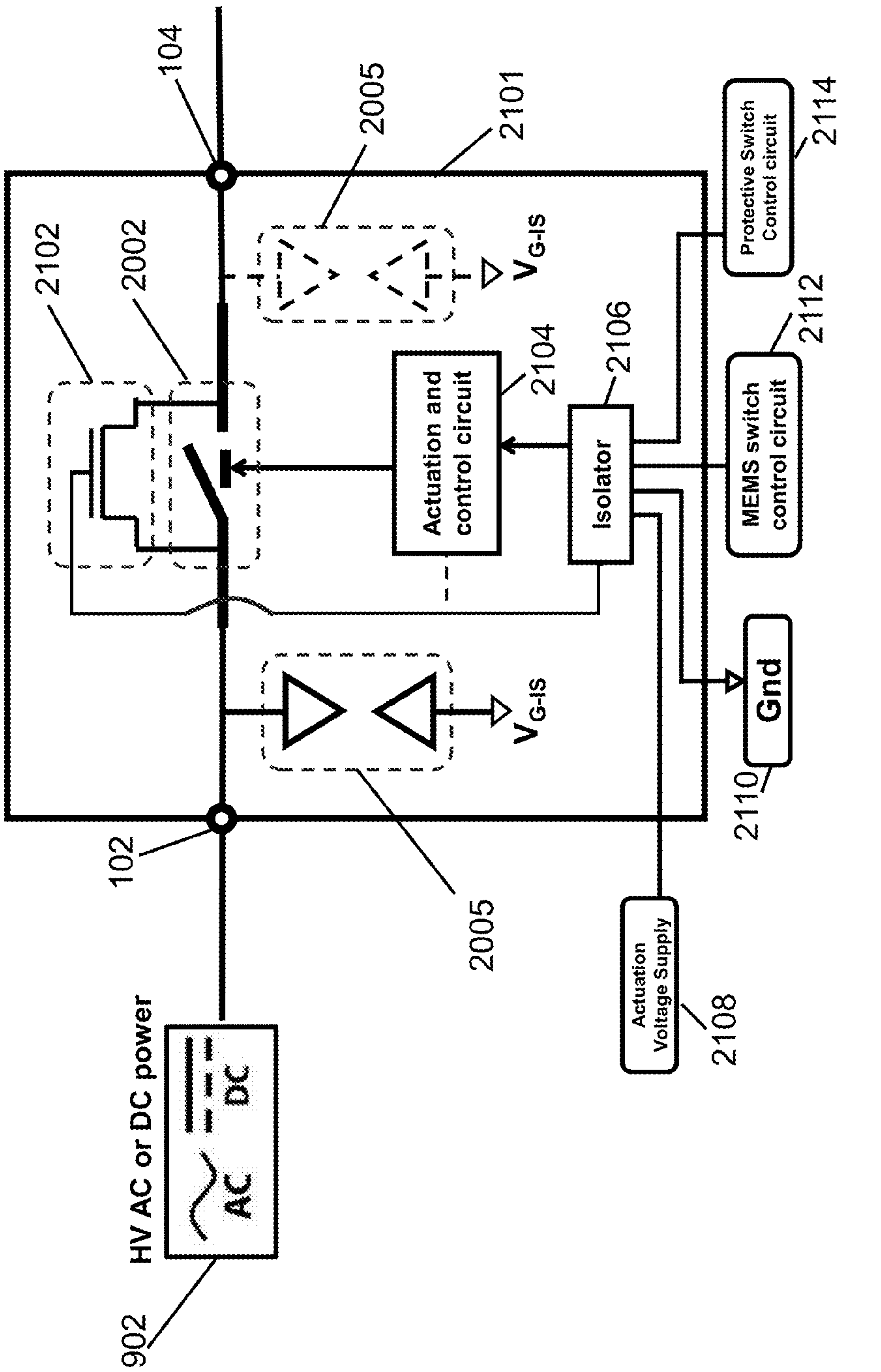
FIG. 21B schematically illustrates another example of a circuit breaker comprising a MEMS switch, an electric overstress (EOS) protection device configured to protect the MEMS switch from unexpected transient signals, and a protective switch configured to protect the MEMS switch during a transition between ON and OFF states.

In some embodiments, a circuit breaker may comprise an EOS protection device connected between the input terminal 102 or the output terminal 104 and an internal isolated reference voltage or an external reference voltage. FIG. 21B schematically illustrates another example circuit breaker 2101 comprising the MEMS switch 2002 and an EOS protection device 2005 configured to protect the MEMS switch 2002 against unexpected external transient signals (e.g., when the MEMS switch 2002 is in the OFF state). In some embodiments, the EOS protection device 2005 can be electrically connected between the input terminal 102 (or the output terminal 104) and a reference potential (e.g., an isolated reference potential such as $V_{G\text{-}IS}$ in FIG. 11A) of the circuit breaker 2101. In various implementations, the EOS protection device 2005 of the circuit breaker 2101 may provide the same or similar protection for the MEMS switch 2002 and the protective switch 2102 the as the protection device 2004 of the circuit breaker 2100.

In some embodiments, the MEMS switch 2002 device may be integrated and/or co-fabricated with the electrical overstress (EOS) protection device 2004 configured to protect the MEMS switch 2002. In some examples, the EOS protection device 2004 may be co-fabricated with the MEMS switch 2002 on a common substrate. In some such examples, the EOS protection device 2004 can be electrically connected to the MEMS switch 2002 via conductive lines formed on or over the common substrate. Advantageously, the MEMS switch 2002 and the EOS protection device 2004 may have corresponding structures that can be co-fabricated from a common layer formed over the substrate. In various implementations, the EOS protection device 2004 may comprise a vertical or lateral spark gap device. In various implementations, at least a portion of the EOS protection device 2004 may be co-fabricated with a portion of the MEMS switch 2002. As described herein, co-fabrication refers to a fabrication process in which two or more structures are at least partly formed from a common process step, such as a deposition step or a patterning step. In these implementations, corresponding features resulting from the co-fabrication can have characteristic signatures. For example, structures of the EOS protection device 2004 that are co-fabricated with the MEMS switch 2002 can have substantially the same physical dimensions as the corresponding structures of the MEMS switch 2002.

Figure 22:
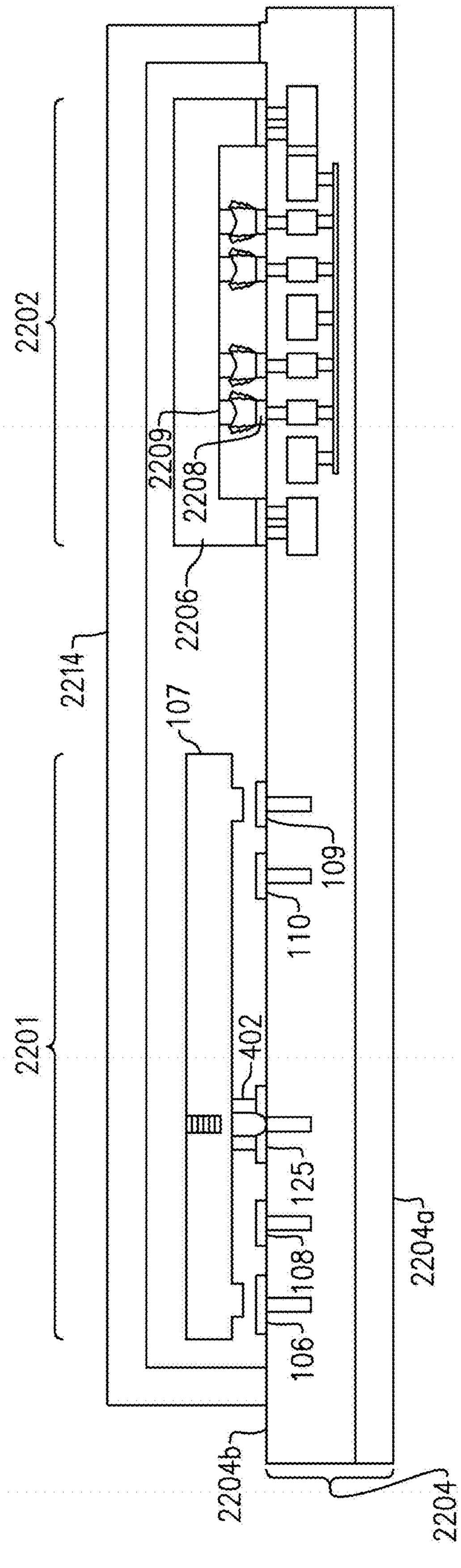
FIG. 22 schematically illustrates a cross-sectional side view of a portion of an example circuit breaker comprising a teeter-totter switch and a multi-gap vertical spark gap array co-fabricated on a common substrate.

FIG. 22 schematically illustrates a side cross-sectional view of a portion of an example circuit breaker (e.g., the circuit breaker 2000) comprising a teeter-totter switch 2201 and a vertical spark gap device having one or more spark gaps configured to arc in the vertical direction. The illustrated vertical spark gap device comprises a multi-gap vertical spark gap array 2202 configured to protect the teeter-totter switch 2201 against high voltage transient signals. In some embodiments, the teeter-totter switch 2201 and the multi-gap vertical spark gap array 2202 can be fabricated or co-fabricated on a common substrate 2204. In some cases, the substrate 2204 may comprise a top layer 2204*b* disposed on a base layer 2204*a*. In some cases, the top layer 2204*b* may comprise conductive lines configured to provide electrical connections between contact electrodes of the teeter-totter switch 2201 and the multi-gap vertical spark gap array 2202, and the input and output terminals 102, 104. Additionally, the top layer 2204*b* may comprise conductive lines configured to provide electrical connections between contact electrodes of the teeter-totter switch 2201 and the control circuit 2018, and conductive lines configured to provide electrical connection between electrodes of the multi-gap vertical spark gap array 2202. In some cases, the multi-gap vertical spark gap array 2202 may comprise a gas-filled chamber formed on a substrate 2204.

In some implementations, the base layer 2204*a* may comprise silicon (e.g., a silicon wafer) and the top layer 2204*b* may comprise a dielectric (e.g., silicon dioxide). In some embodiments, the teeter-totter switch 2201 may comprise one or more features described above with respect to the teeter-totter switch 100, 150, 300, or the teeter-totter switch shown in FIGS. 5A-5B, 6A-6C, the details of which may not be repeated herein for brevity.

In some embodiments, the spark gap array 2202 may comprise a conductive bridge 2206 or an electrically conductive beam disposed over the horizontal main surface of the substrate. The conductive bridge 2206 may be anchored on opposing ends and may comprise a plurality of upper arcing electrodes (e.g., top electrode fingers) 2209 protruding from a bottom surface of the conductive bridge 2206, a plurality of lower arcing electrodes 2208 formed on a top surface of the top layer 2204*b* (e.g., protruding from the top surface), where the plurality of top and bottom fingers are configured to form a plurality of arcing gaps (spark gaps) in a region below the conductive bridge 2206 and the top surface of the top layer 2204*b*.

In some examples, the plurality of the upper arcing electrodes 2209 may be electrically connected to each other and to one of the input or output terminals 102, 104, by the conductive bridge 2206 and the plurality of the lower arcing electrodes 2208 may be electrically connected to each other and to the other one of the input or output terminals 102, 104.

In some embodiments, the spark gap array 2202 may comprise a capping layer 2214 enclosing the conductive bridge 2206, the electrode fingers and arcing gaps formed below the conductive bridge 2206 and above the top layer 2204*b*. The capping layer 2214 can be hermetically sealed to form a gas-filled cavity such that an arcing medium of the arcing gaps formed between the plurality of top electrode fingers comprises a gas or gas mixture having a specified composition and pressure. In some implementations, the capping layer 2214 can hermetically seal the structures enclosed therein such that the gas or gas mixture inside its enclosed volume does not substantially mix with outside air. For example, the enclosure can be fabricated under an atmosphere other than air at a sufficient pressure such that the cavity inside the capping layer 2214 remains isolated with an internal pressure that is about the same or slightly higher relative to the outside air. In some embodiments, the capping layer 2214 may be fabricated separately from the substrate 2204 and then bonded or otherwise connected to the substrate 2204, on which the arcing gaps are formed, via one or more sealing connections. In some embodiments, the capping layer 2214 may be configured to protect the teeter-totter switch 2201 from the environment. For example, the capping layer 2214 may suppress contamination and provide a desired atmosphere for operation of the spark gap array 2202. In some examples, the capping layer may comprise a sealed chamber filled with a gas (e.g., an inert gas) and configured to maintain the pressure of the gas within a specified range. In some embodiments, the MEMS switch 2201 and the spark gap array 2202 (e.g., having at least one co-fabricated portion) may be covered by two separate capping layers. In these arrangements, the different capping layers may be configured differently, e.g., configured to provide different atmospheres around the MEMS switch 2201 and the spark gap array 2202.

In some embodiments, at least a portion of a spark gap array 2202 can be co-fabricated with a corresponding portion of the MEMS switch 2201 using a microelectromechanical systems (MEMS) fabrication technique. For example, the conductive bridge 2206 and the top electrode fingers 2209 may be fabricated using methods used for fabricating the conductive beam 107. In some examples, the conductive bridge 2206 may be fabricated using a plating process (e.g., a gold electroplating process). As another example, the capping layer 2214 may be fabricated and bonded to the substrate 2204 using common MEMS fabrication and bonding techniques.

Circuit Breaker Circuitry with Sensors

In some embodiments, a system comprising a MEMS switch may include one or more sensors configured to monitor various parameters of the MEMS switch or MEMS switch network and, in some cases, a circuitry (e.g., a circuit breaker) connect to or comprising the MEMS switch or MEMS switch network. For example, the one or more sensors may include sensors to measure electric current passing through the MEMS switch, the temperature of the MEMS switch, or other parameters that may be used to determine an operational condition of the MEMS switch or to determine that the state of the MEMS switch should be changed (e.g., from ON to OFF state). For example, a temperature sensor may be used to measure and/or estimate the temperature of the MEMS switch in the ON state. In response to determining that the temperature is above a threshold value, a microcontroller (e.g., microcontroller 1110 in FIG. 11A) may provide an actuation control signal to a control circuit (e.g., control circuit 1101 in FIG. 11A) to change the state of the MEMS switch to OFF state, e.g., to protect a core circuitry protected by the circuit breaker circuitry. As another example, a current sensor may be used to measure and/or estimate electric current conducted by the MEMS switch in the ON state. In response to determining that the electric current is above a threshold value (e.g., an operating current of the MEMS switch), a microcontroller (e.g., microcontroller 1110 in FIG. 11A) may provide an activation control signal to the control circuit to change the state of the MEMS switch to OFF state. In various implementations, at least a portion of a sensor may be integrated and/or co-fabricated with the MEMS switch on a common substrate. In some embodiments, the system comprising the MEMS switch (e.g., a control circuit of the system) may comprise a sensor block configured to receive a sensor signal (e.g., an analog signal) from the sensor or a sensor element and generate a processed sensor signal or measured value (e.g., digitized sensor signal or digitized measure value) usable by the microcontroller. In some examples, the sensor block (e.g., a sensor readout circuit) may comprise an analog-to-digital converter (ADC) configured to receive an analog senor signal from the sensor element and generate a digital sensor signal that can be processed by the microcontroller.

Figure 23:
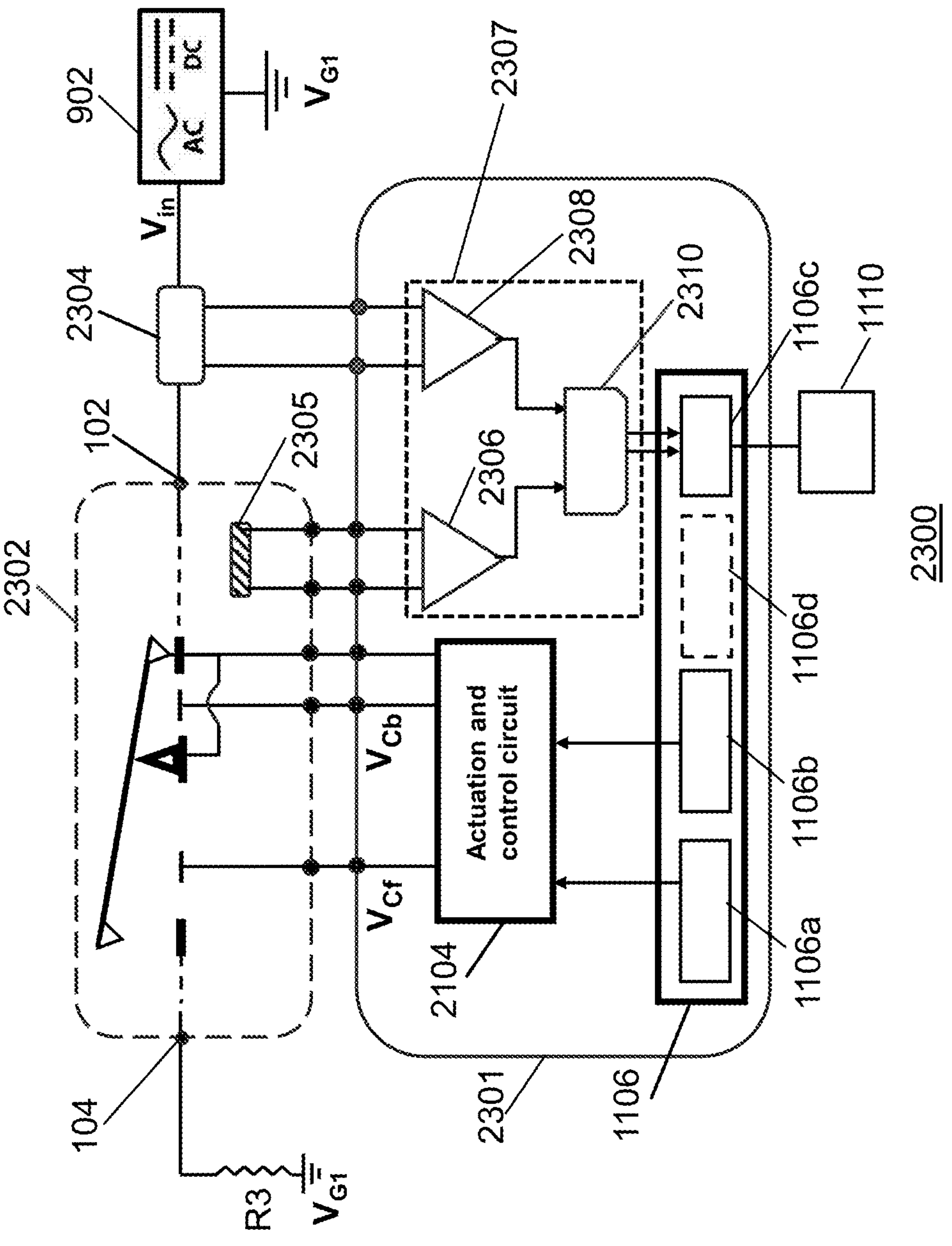
FIG. 23 schematically illustrates a system comprising a MEMS switch module integrated with one or more sensors and a control circuit to control the MEMS switch module and the one or more sensors.

FIG. 23 schematically illustrates an electric (or electronic) system 2300 or a portion of an electric system comprising a MEMS switch module 2302 (e.g., a single MEMS switch or a MEMS switch network) and a control circuit 2301 configured to control the MEMS switch module 2302. In some embodiments, the MEMS switch module 2302 or may comprise one or more features described above with respect to various circuit breakers described above, e.g., the circuit breaker 200 (FIG. 7). For example, the MEMS switch 2302 may be arranged similarly to the teeter-totter switch 150 (FIGS. 2A-2C) or the teeter-totter switch 300 (FIGS. 3A-3C). The control circuit 2301 may comprise one or more features similar to those described above with respect to control circuits 1101 (FIGS. 10, 11A), 1301 (FIG. 13), or 1801 (FIG. 18), the details of which may not be repeated herein for brevity.

In some embodiments, the electric system 2300 can be a circuit breaker configured to control electric connection between an electric power source 902 and a load (e.g., a resistive load having a resistance R3) via an input terminal 102 and an output terminal 104. In some examples, the MEMS switch module 2302 may comprise one or more teeter-totter switches connected in parallel and/or in series. In some embodiments, the electric system 2300 may comprise one or both of a temperature sensor 2305 configured to monitor and measure temperature of the MEMS switch 1002 and a current sensor 2304 configured to monitor and measure electric current conducted between the input terminal 102 to the output terminal 104 by the MEMS switch module 2302. In some embodiments, the temperature sensor 2305 and/or the current sensor 2304 may comprise one or more sensor elements, configured to generate one or more analog sensor signals indicative of the temperature of the MEMS switch module 2302 and/or current conducted through the MEMS switch module 2302, respectively.

In some embodiments, the control circuit 2301 may comprise a sensor block or sensor readout circuit 2307 configured to receive sensor signals (e.g., an analog sensor signal) from the temperature sensor 2305 and/or the current sensor 2304 and generate a processed sensor signal usable by the microcontroller 1110, e.g., to generate a control signal that can cause the microcontroller to change the state of the MEMS switch module 2302. In some examples, the processed signal may comprise a digital signal (e.g., a digitalized sensor signal).

In some embodiments, the temperature sensor 2305 may comprise a first resistor. The change in resistance of a resistor with temperature or temperature coefficient of resistance (TCR). A positive TCR indicates that a resistor's resistance increases with increasing temperature, as in the case of a metallic material. On the other hand, a negative TCR indicates that a resistor's resistance decreases with increasing temperature, as in the case of a semiconductor material. The resistor of the temperature sensor 2305 may be formed as a thin film resistor having either a positive or positive TCR. The temperature sensor is disposed close to the MEMS switch module 2302, e.g., on the same substrate. In some such examples, the control circuit 2307 may comprise a first amplifier 2306 (e.g. a differential amplifier) configured to generate a sensor signal proportional to resistance of the first resistor. In some embodiments, the temperature sensor 2305 may comprise a thermo-electric element configured to generate a temperature dependent signal (e.g., a current or a voltage) indicative or the temperature of the MEMS switch.

In some embodiments, the current sensor 2304 may comprise a second resistor connecting the electric power source 902 to the MEMS switch module 2302. In some such examples, the sensor block 2307 may comprise a second amplifier 2308 (e.g. a differential amplifier) configured to generate a sensor signal proportional to a voltage drop across the second resistor and thereby a current transmitted via the current sensor 2304 and thereby through the MEMS switch module 2302 when the MEMS switch module is in ON state. In some embodiments, the current sensor 2304 may comprise a Hall sensor configured to generate a sensor signal indicative of the current transmitted between the electric power source 902 and the MEMS switch module 2302. In some implementations, the current sensor 2304 can be part of a Delta-Sigma measurement system configured to measure the current transmitted between the electric power source 902 and the MEMS switch module 2302. In some embodiments, the sensor block 2307 may comprise an analog-to-digital converter (ADC) 2310 configured to receive one or both the sensor signals indicative of the temperature of the MEMS switch and the current passing through the MEMS switch, generate respective digital sensor signals, and transmit the digital sensor signals to the microcontroller 110 via the third isolator 1106*c* such that the microcontroller 110 receives isolated digital sensor signals.

In some embodiments, the microcontroller 1110 may compare a sensor signal (e.g., an isolated digital sensor signal) received from the control circuit 2301, to determine whether the one or both temperature of the MEMS switch module 2302 and the current passing through the MEMS switch, as indicated by the respective signals, exceed respective predetermined threshold values. In some cases, the predetermined threshold values (e.g., threshold current and/or threshold temperature) may be stored in a non-transitory memory of microcontroller 1110. For example, upon the microcontroller 1110 determining that a temperature sensed from the temperature sensor 2305 (e.g., indicated the sensor signal) exceeds a predetermined threshold temperature, the microcontroller 1110 may activate the MEMS switch module 2302 by changing the state of a MEMS switch from ON to OFF state), e.g., by tiling the beam of the teeter-totter switch 1002 to connect the first end of the beam 107 to the back contact electrode 106 and disconnect the second end of the beam 107 from the front contact electrode 109. As another example, upon the microcontroller 1110 determining that a current sensed from the current sensor 2304 (e.g., indicated the sensor signal) exceeds a predetermined threshold current, the microcontroller 1110 may activate the MEMS switch module 2302, by changing the state of a MEMS switch from ON to OFF state).

In some implementations, one or both the temperature sensor 2305 and the current sensor 2304 may be fabricated or disposed on a substrate on which at least a portion of the MEMS switch module 2302 (e.g., at least one MEMS switch of a plurality of MEMS switches) is formed. In some such implementations, one or both the temperature sensor 2305 and the current sensor 2304 may be co-fabricated with least a portion of the MEMS switch module 2302 (e.g., a portion of a MEMS switch therein). In some examples, one or more thin film-based sensors may comprise a thin film resistor patterned from a same layer as one or more of the first and second contact electrodes 106, 109, or one or more of the first and second control electrodes 108, 110. In some such examples, the thin film resistor may have the same thickness as the one or more of the first and second contact electrodes 106, 109 or the one or more of the first and second control electrodes 108, 110.

In some embodiments, the sensor block 2307 may provide the processed sensor signals generated using the sensor signals received from the temperature and current sensors 2305, 2304, to an isolator configured to provide an isolated processed sensor signal to the microcontroller 1110. In some examples, the isolator can be, e.g., the third isolator 1106*c* of the isolator circuit 1106 (described above with respect to FIGS. 11A and 18), which additionally comprises the first, second, and fourth isolators 1106*a*, 1106*b*, 1106*d*, configured to isolate the supply voltage, MEMS switch control signals, and the protective switch control signals, respectively.

Figures 24A, 24B:
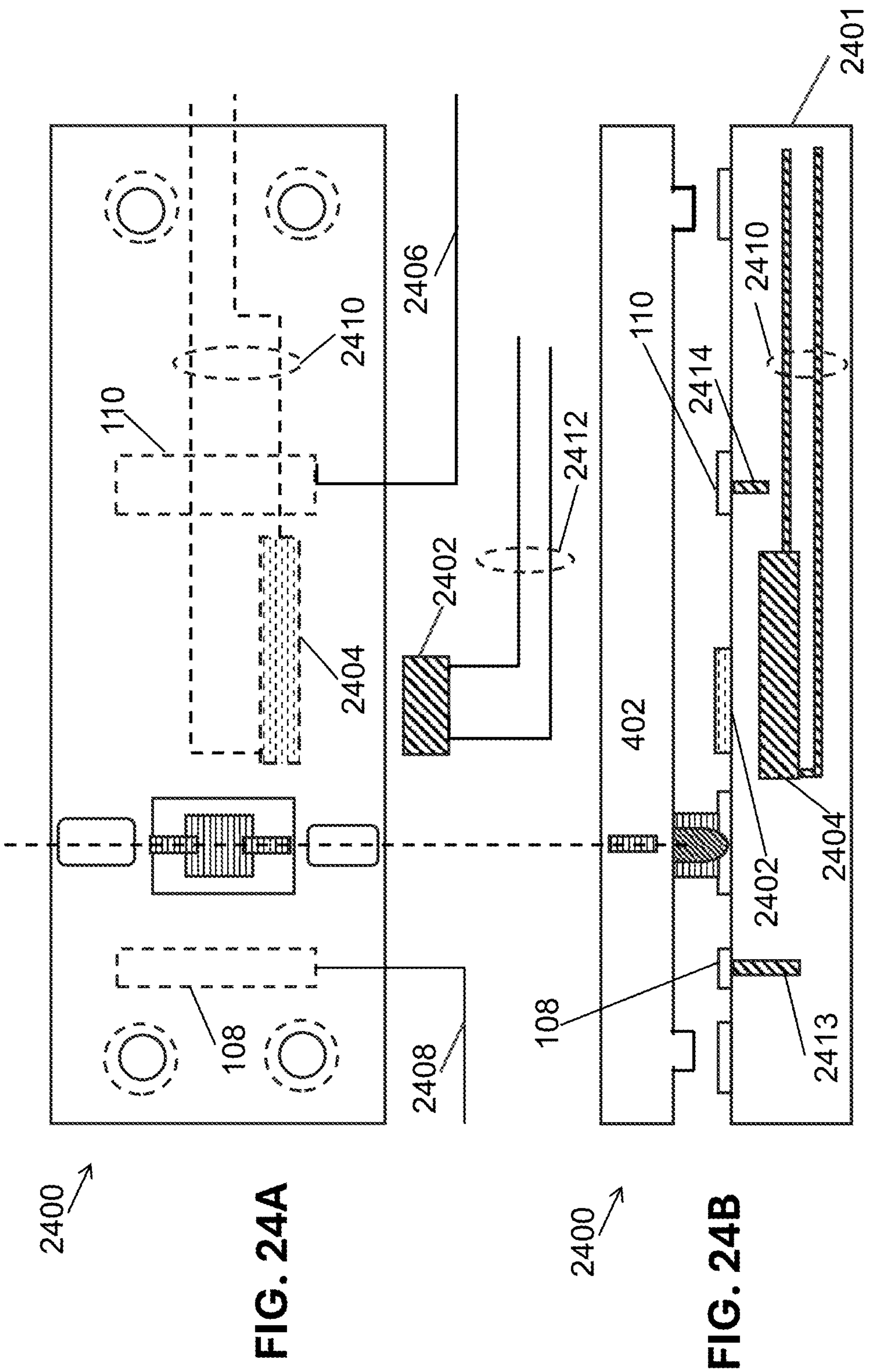
FIGS. 24A-24B schematically illustrate a top view (FIG. 24A) and a cross-sectional side view (FIG. 24B) of an example MEMS switch comprising one or more integrated sensors.

FIGS. 24A-24B schematically illustrate a top view (FIG. 24A) and a side cross-sectional view (FIG. 24B) of an example MEMS switch 2400 (e.g., a MEMS switch in the MEMS switch module 2302) comprising one or more integrated sensors. In some cases, the MEMS switch 2400 can be a teeter-totter switch comprising one or more features described above with respect to the teeter-totter switch shown in FIGS. 6A-6C. In some cases, the MEMS switch 2400 may be formed on a top layer 2401 of a substrate (e.g., a chip or a wafer). In some such cases, the integrated sensor may be formed or disposed on a top surface of the top layer 2401 or within the top layer 2401. In some cases, the integrated sensor may comprise a resistor 2402 formed on or above the top layer 2401 where the resistor 2402 can be connected to a readout circuit (e.g., the sensor block 2307) via conductive lines 2412. In various implementations, the conductive lines 2412 may be formed on, above, or within the top layer 2401. In some examples, at least a portion of the conductive lines 2410 may be formed within the top layer 2401. In some examples, the resistor 2402 and, in some cases, the conductive lines 2412, may be co-fabricated with another conductive line (e.g., conductive lines 2406, 2408) connected to a control electrode of the MEMS switch 2400 (e.g., front or back control electrodes 110, 108 of the teeter-totter switch). In some cases, the integrated sensor may comprise a resistor 2404 formed within the top layer 2401 (below the top surface) and the resistor 2404 can be connected to a readout circuit (e.g., the sensor block 2307) via conductive lines 2410 at least partially formed within the top layer 2401. In some examples, the resistor 2404 and, in some cases, the conductive lines 2410, may be co-fabricated with another conductive line or a conductive via (e.g., conductive lines 2406, 2408, conductive vias 2413, 2414) connected to a control electrode of the MEMS switch 2400 (e.g., front or back control electrodes 110, 108 of the teeter-totter switch). In some examples, the resistor 2404 may comprise polysilicon. In some other examples, the resistor 2404 may comprise a metal. In some examples, the resistor 2404 may be co-fabricated with the via 2413 by depositing and patterning a polysilicon layer during formation of the top layer 2401. In some examples, the conductive lines 2412 may comprise polysilicon or a metal.

Figure 25:
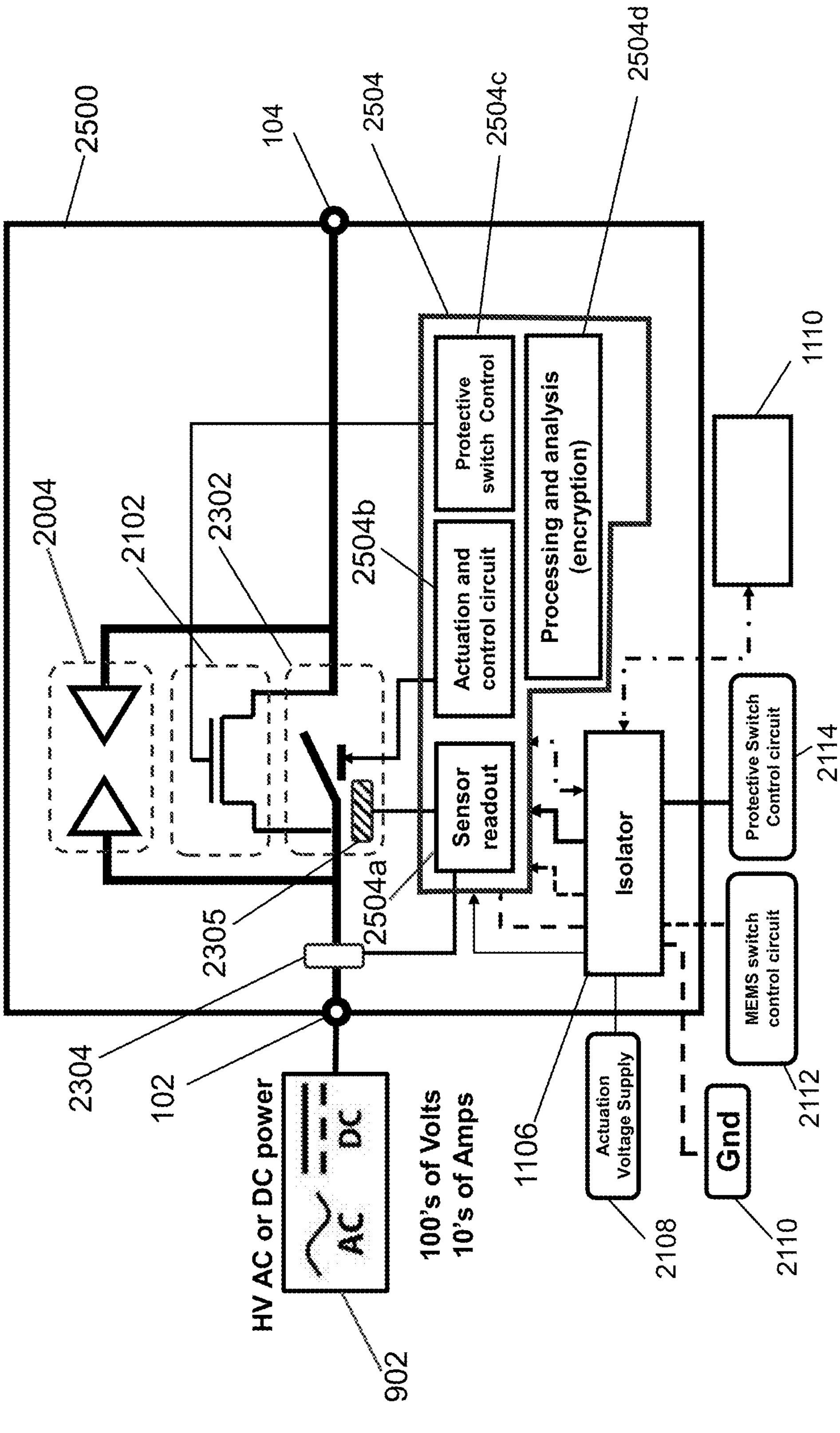
FIG. 25 is a block diagram illustrating an example circuit breaker comprising a MEMS switch module protected by a protective switch and an EOS protection device and monitored using one or more sensors including a temperature sensor and a current sensor.

FIG. 25 is a block diagram illustrating an example circuit breaker 2500 comprising the MEMS switch module 2302, the protective switch 2102, the EOS protection device 2004 (described above with respect to FIG. 21), the temperature sensor 2305, and the current sensor 2304. In some embodiments, the circuit breaker 2500 may comprise a signal control and processing circuit 2504 and an isolator circuit 1106. In some embodiments, the signal control and processing circuit 2504 may be configured to generate control voltages using isolated signals received from the isolator circuit 1106 and process sensor signals received from the temperature and current sensors 2305, 2304. In some embodiments, the isolator circuit 1106 may receive one or more of an actuation supply voltage 2108, MEMS control signals, and protective switch control signals, and provide one or more of an isolated supply voltage, isolated MEMS control signals, and isolated protective switch control signals to the signal control and processing circuit 2504. In some examples, the isolator circuit 1106 may be connected to a microcontroller 1110 and an external reference voltage 2110.

Additionally, in some cases, the signal control and processing circuit 2504 may be configured to encrypt a sensor signal or an isolated control signal. In some embodiments, the signal control and processing circuit 2504 may comprise one or more of a sensor readout module 2504*a*, an actuation and control circuit, herein referred to as MEMS actuation and control module 2504*b*, a protective switch control module 2504*c*, a processing and analysis module 2504*d*. In some cases, the MEMS actuation and control module 2504*b* may comprise the voltage control and supply circuit 1004, 1104, 1804, and 2104.

Figure 26:
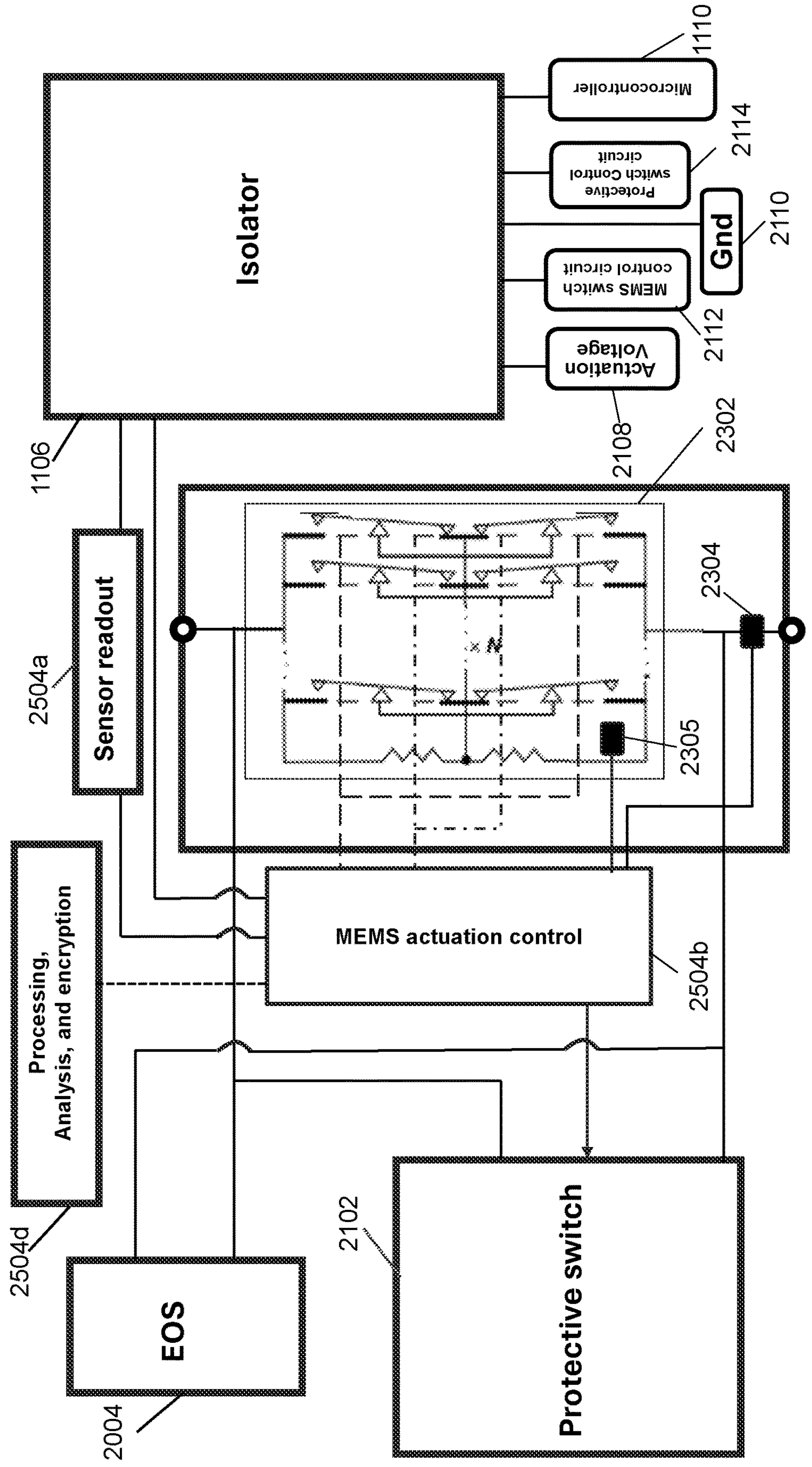
FIG. 26 is a block diagram illustrating an example implementation of the circuit breaker system shown in FIG. 25 comprising a MEMS switch module and various protective, monitoring and control modules fabricated on separate dies.

In some embodiments, two or more of the isolation circuit 1106, the MEMS switch module 2302, the MEMS actuation and control module 2504*b*, the sensor readout module 2504*a*, the processing and analysis module 2504*d*, the EOS protection device 2004, and the protective switch 2102, may be fabricated on separate dies and, in some cases, contained in separate packages. In some cases, the separate packages and/or dies may be electrically connected via conductive lines of a circuit board (e.g., a printed circuit board, PCB) on which they may be mounted. FIG. 26 is a block diagram illustrating an example implementation of the circuit breaker 2500 described above. In the example shown the isolation circuit 1106, the MEMS switch module 2302, the MEMS actuation and control module 2504*b*, the sensor readout module 2504*a*, the processing and analysis module 2504*d*, the EOS protection device 2004, and the protective switch 2102 are fabricated on separate dies and the protective switch control module is included in the MEMS actuation and control module 2504*b*.

Figure 27A:
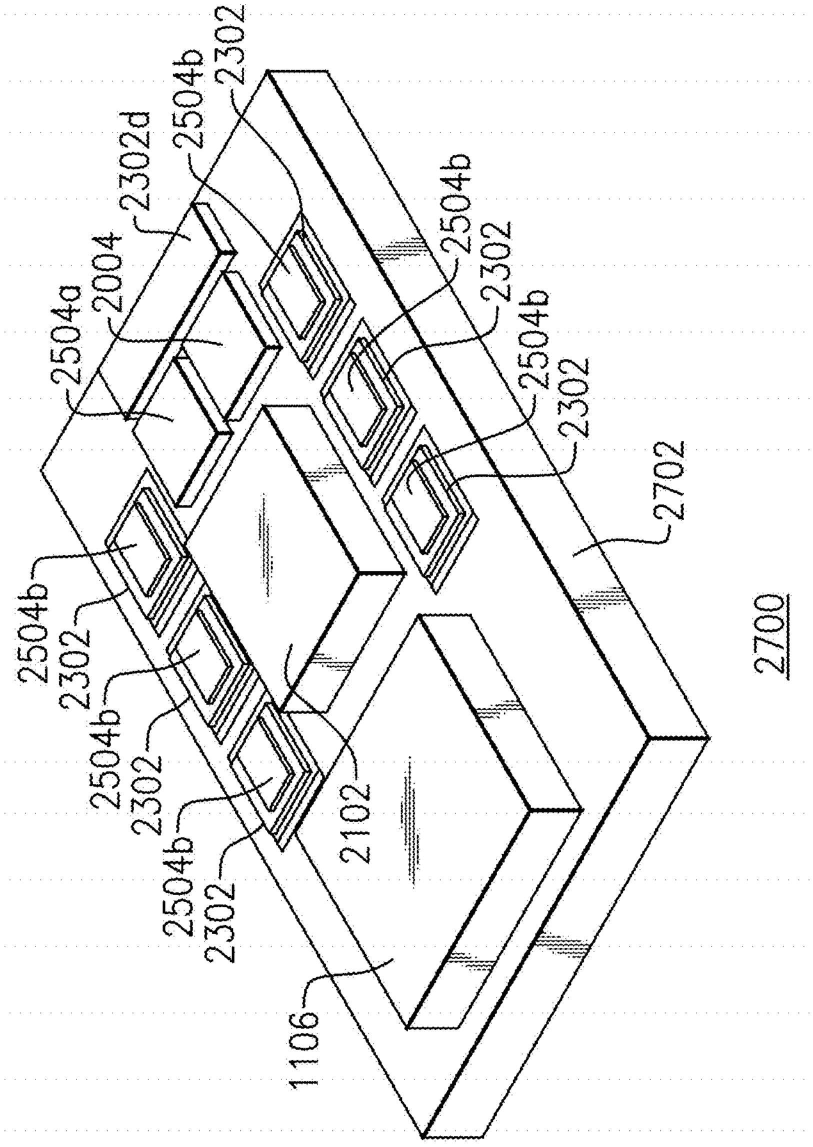
FIG. 27A is a perspective view of an example implementation of the modular circuit breaker system shown in FIGS. 25 and 26 comprising a plurality of MEMS switch modules and various protective, monitoring and control modules fabricated on separate dies and integrated on a circuit board.

FIG. 27A is a perspective view of an example modular circuit breaker 2700 comprising six MEMS switch modules 2302, six MEMS actuation and control modules 2504*b*, an isolator circuit 1106, a sensor readout module 2504*a*, a processing and analysis module 2504*d*, an EOS protection device 2004, and a protective switch 2102, each fabricated on a separate die. In some cases, the sensor readout module 2504*a*, the EOS protection device 2004, the isolator circuit 1106, and the protective switch 2102, may be each contained in a separate package. In some cases, each MEMS switch module 2302 may be controlled by a MEMS actuation and control module 2504*b* integrated with (e.g., mounted on and connect to) the MEMS switch modules. In some cases, the sensor readout module 2504*a*, the EOS protection device 2004, the isolator circuit 1106, the protective switch 2102, and each of the six MEMS modules (and the respective MEMS switch control modules thereon), may be mounted on separate regions of a circuit board 2702 and may be connected by conductive lines formed on and/or within the circuit board 2702 to form a modular circuit breaker 2700.

Figure 27C:
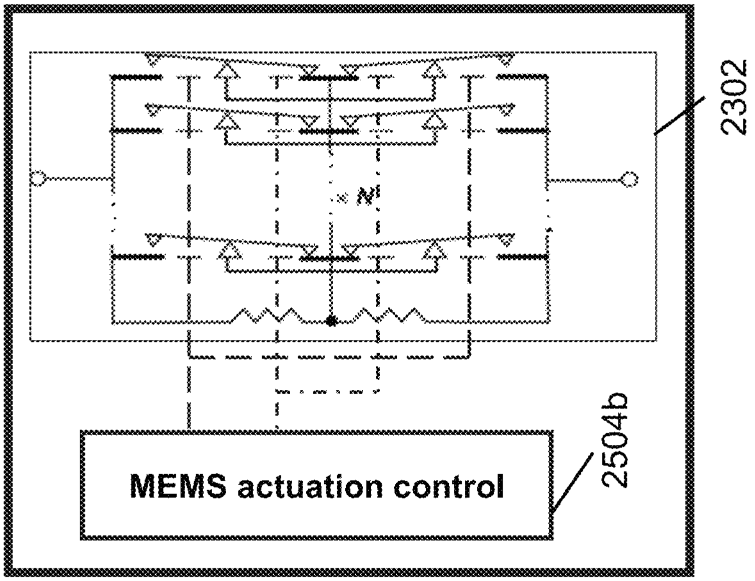
FIG. 27C is a block diagram illustrating an individual MEMS switch module of the plurality of MEMS switch modules used in the modular circuit breaker system shown in FIG. 27B.
Figure 27B:
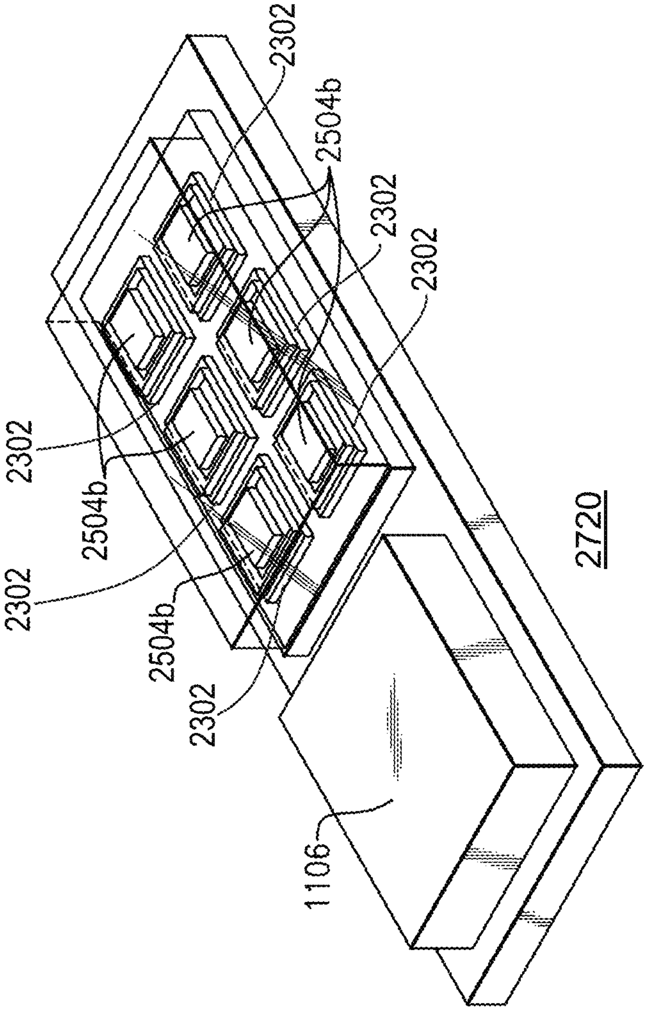
FIG. 27B is a perspective view of another example modular circuit breaker system comprising a plurality of MEMS switch modules and an isolator module integrated on a circuit board.

FIG. 27B is a perspective view of another example modular circuit breaker 2720 comprising an isolator circuit 1106 and six MEMS switch modules 2302 each integrated with an actuation and control module 2504*b*. In some examples, each of the actuation and control module may be mounted on the respective the MEMS switch module and can be electrically connected to the control electrodes of the MEMS switch module (e.g., by a plurality of vias). In some implementations, at least the MEMS switch modules 2302 and the isolator circuit 1106 may be fabricated on separate dies and contained in separate packages. In some cases, the MEMS switch modules 2302 and the isolator circuit 1106 may be mounted on separate regions of a circuit board 2702 and may be connected by conductive lines formed on and/or within the circuit board 2704 to form the modular circuit breaker 2720.

FIG. 27C schematically illustrates the internal circuitry and components of an individual MEMS switch module 2302 connected to a respective MEMS actuation control module 2504*b*. In some embodiments, the MEMS switch module 2302 may compromise a MEMS switch network (e.g., MEMS switch network of the circuit breaker 200 shown in FIG. 8) and the MEMS actuation and the control module 2504*b* may comprise one or more features described above with respect to the actuation control circuits 1004, 1104, 1804, and 2104.

In some embodiments, a MEMS switch (e.g., a cantilever-based or teeter-totter switch) may be actuated using a mechanism different from the electrostatic or capacitive actuation described above. In some such embodiments, using an alternative actuation mechanism can make the switching voltage ($V_S$) of a MEMS switch substantially independent of the voltage switched by the MEMS switch and thereby eliminate the need for providing a differential reference voltage to the voltage control and supply circuit that actuates the MEMS switch (as described above with respect to FIGS. 10 and 11A). In some cases, the alternative actuation mechanism that is not based on electric field control may improve isolation of the MEMS switch operation from the surrounding circuits and devices that may directly (e.g., via an conductive connection) or indirectly (e.g., via an electric field coupling) communicate with the MEMS switch. In some embodiments, a MEMS switch may be actuated using a magnetic force resulting from interaction between a magnetic field and a magnetic material (e.g. a ferromagnetic material). In some such embodiments, the main beam of the MEMS switch (e.g., the conductive beams 105, 107, and 407) may comprise a magnetic material that may interact with a magnetic field applied on the beam by a magnetic actuator to pull the beam toward the substrate. In various implementations, the magnetic material may be confined in one or more regions of the beam (e.g., regions close to magnetic actuators) or distributed over the entire structure of beam. In some cases, a beam may comprise a magnetic region configured to interact with the magnetic field to actuate the beam and a conductive region configured to establish a conductive path between one or both ends of the beam and a conductive post through which the beam is anchored to the substrate. For example, when beam may comprise a main magnetic structure (e.g., formed by patterning and etching a magnetic layer) and a conductive line disposed on (or formed within) the main magnetic structure. In some examples, the beam may comprise a magnetic layer composed of ferromagnetic material and a conductive layer composed of an electrically conducive material.

In some examples, the magnetic actuator may comprise a coil configured to generate a magnetic field near or at a region of the beam comprising magnetic material, in response to receiving an electric current from a control circuit. In some cases, when the current passing through the coil exceeds a switching current (Is) the interaction between the resulting magnetic field and a magnetic region of the beam may pull down a section of the beam close to the magnetic actuator causing the state of the MEMS switch to change from the OFF state to the ON state or vice versa.

Figure 28B:
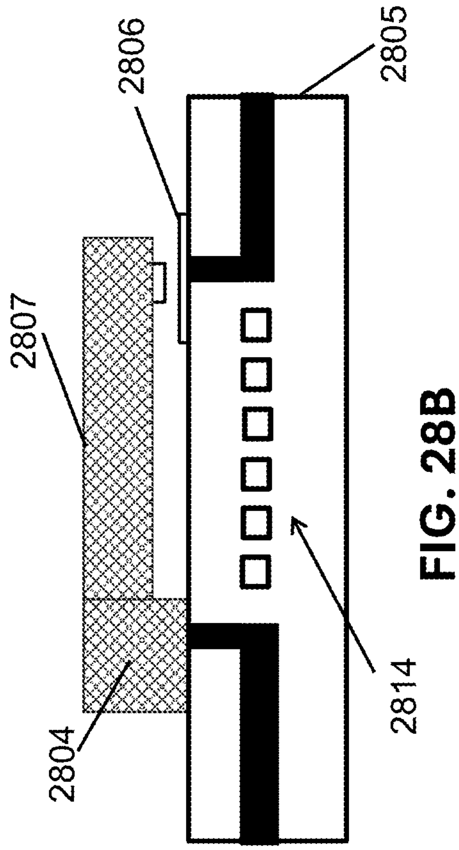
FIG. 28B schematically illustrates a cross-sectional side view of a magnetically actuated cantilever-based MEMS switch.
Figure 28A:
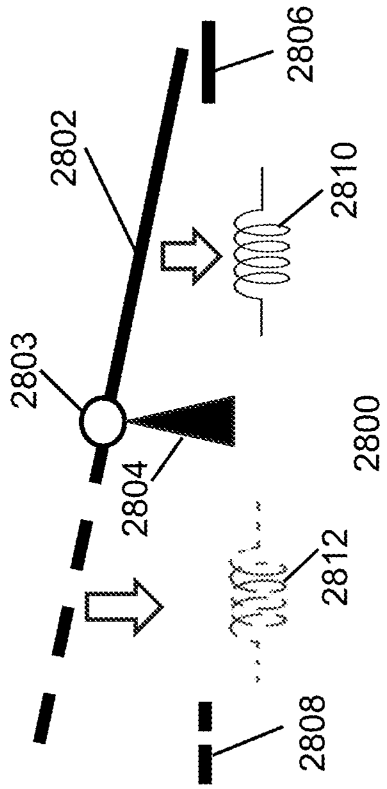
FIG. 28A schematically illustrates an example of a magnetically actuated MEMS switch.

FIG. 28A schematically illustrate an example of a magnetically actuated MEMS switch 2800 comprising a hybrid beam 2802 comprising magnetic (e.g., ferromagnetic) and electrically conductive regions. In some cases, the beam 2802 may be configured to be actuated by a magnetic field and provide a conductive path between at least one contact electrode 2806 and a conductive post 2804 (e.g., via an electrically conductive hinge 2803) when the MEMS switch is in the ON state. In various implementations, the MEMS switch 2800 may comprise a cantilever-based MEMS switch having a single contact electrode 2806 and a magnetic actuator in one side of the post 2804 or a teeter-totter MEMS switch having front and back contact electrode 2806, 2808, and two magnetic actuators in opposite sides of the post 2804 in a longitudinal direction (e.g., along the beam). In some examples, the magnetic actuators 2810, 2812, may comprise a conductive structure (e.g., a coil, a spiral, a loop, and the like) configured to generate a magnetic field having a component normal to the substate over which the MEMS switch 2800 is fabricated. In various implementations, the magnetic actuator 2810 (or 2812) may be formed over the substrate or may be embedded in the substrate below a top major surface of the substrate. In some embodiments, at least regions of the hybrid beam 2802 located above the magnetic actuators 2810, 2812, may comprise a magnetic material.

FIG. 28B schematically illustrates a side cross-sectional view of a magnetically actuated cantilever-based MEMS switch, fabricated on a substrate 2805, comprising a hybrid beam 2807 that is mechanically and electrically connected to a conductive post 2804, and a magnetic actuator 2814 formed below a major top surface of the substrate 2805. In some examples, the magnetic actuator 2814 may comprise a conductive spiral formed in a plane substantially parallel to a major to surface of the substrate 2805 and configured to generate a magnetic field that can full down the hybrid beam 2807 toward the substrate 2805 to establish a conductive path between the contact electrode 2806 and the post 2804.

Figure 28C:
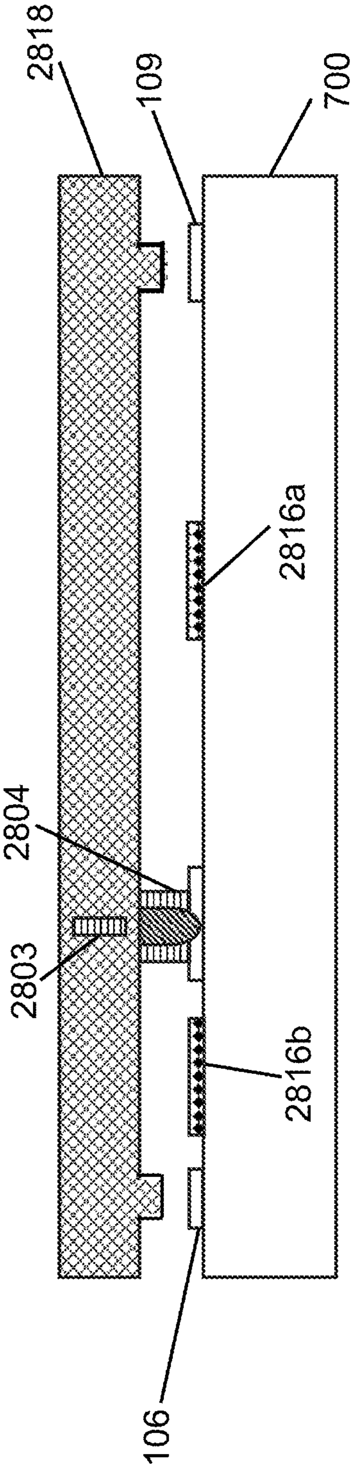
FIG. 28C schematically illustrates a cross-sectional side view of a magnetically actuated teeter-totter MEMS switch.

FIG. 28C schematically illustrates a side cross sectional view of a magnetically actuated teeter-totter MEMS switch, fabricated on a substrate 700, comprising a hybrid beam 2818 mechanically and electrically connected to a conductive post 2804 via a hinge 2803, and two magnetic actuators 2816*a*, 2816*b* formed on the top major surface of the substrate 700. In some embodiments, the teeter-totter MEMS switch may comprise one or more features described above with respect to the teeter-totter switches shown in FIGS. 1B, 3A-3C, and 5A-5. In some examples, the magnetic actuators 2816*a*, 2816*b*, may comprise conductive spirals formed on the top major to surface of the substrate 700 and configured to generate a magnetic field that can full down the respective portions of the hybrid beam 2818 toward the substrate 700 to establish a conductive path between the front contact electrode 109 (or the back contact electrode 106) and the post 2804. In some examples, the hinge 2803 and the post 2804 may comprise an electrically conductive material. In some examples, the hinge 2803 may comprise the same magnetic material used to form the hybrid beam 2818 and additionally an electrically conductive region configured to electrically connect an electrically conductive region of the hybrid post to the post 2804.

In various implementations, the magnetic material used in the structure of the hybrid beams, 2807, 2818 may compromise a ferro-magnetic material configured to interact with the magnetic field to generate a magnetic force having a component in a direction normal to a major surface of the substrate 2805 or the substrate 700.

In some embodiments the magnetic material may comprise: Permalloy (NiFe), iron-silicon alloys (Fe—Si), neodymium-iron-boron (NdFeB), ferrites, cobalt (Co), nickel (Ni), iron, AlNiCo (alloys of aluminum, nickel, cobalt), permalloy (nickel-iron Alloy), neodymium magnets (e.g., NdFeB), samarium-cobalt (SmCo) magnets, or other materials, alloys or compounds (e.g., ferromagnetic alloys or compounds).

In some embodiments, the hybrid beams 2807 and 2818 may comprise a magnetic thin film (e.g., comprising one or more of the above-mentioned magnetic materials) formed on a bottom surface (facing the substrates 2805, 700) of the hybrid beams 2807 and 2818.

EXAMPLE EMBODIMENTS

Various additional example embodiments of the disclosure can be described by the following examples:

Examples 1

Example 1. A micro-electromechanical (MEMS) switch, comprising:

- a conductive beam anchored over a substrate by a conductive post serving simultaneously as a mechanical pivot and a conductive path between the conductive beam and a middle electrode on the substrate; and
- a pair of contact electrodes formed on the substrate at opposite lateral sides of the conductive post;
- wherein upon activation of the MEMS switch, the conductive beam is configured to tilt such that one side of the conductive beam contacts one of the pair of contact electrodes to form a further conductive path, and
- wherein the conductive post is closer to a first end of the conductive beam relative to a second end of the conductive beam opposite the first end.

Example 2. The MEMS switch of Example 1, wherein the conductive post is disposed closer to the first end relative to the second end by at least 5% of a length of the conductive beam Example 3. The MEMS switch of Example 1, further comprising a pair of control electrodes formed on the substrate at opposite lateral sides of the conductive post, wherein each of the control electrodes is disposed laterally between the conductive post and a respective one of the pair of contact electrodes.

Example 4. The MEMS switch of Example 3, wherein activation of the MEMS switch comprises application of a voltage to one of the control electrodes that is closer to the first end of the conductive beam to cause an attractive electrostatic force between the one of the control electrodes and the conductive beam.

Example 5. The MEMS switch of Example 1, wherein upon activation of the MEMS switch, the conductive path and the further conductive path are electrically shorted to each other.

Example 6. The MEMS switch of Example 5, wherein the further conductive path is extended between a terminal and middle contact electrode.

Example 7. The MEMS switch of Example 1, further comprising a mechanical stopper formed at a bottom surface of the conductive beam and extending towards the substrate, wherein upon activation of the MEMS switch, the mechanical stopper contacts the substrate to substantially limit an elastic deformation of one or more of the conductive beam, the conductive post, and a hinge connecting the conductive beam to the conductive post.

Example 8. The MEMS switch of Example 7, wherein a portion of the mechanical stopper contacting the substrate comprises a curved surface.

Example 9. The MEMS switch of Example 1, further comprising a mechanical stopper formed at a bottom surface of the conductive beam and extending towards the substrate, wherein the mechanical stopper is configured to serve as a fulcrum when the MEMS switch is activated to substantially limit an elastic deformation of a hinge connecting the conductive beam to the conductive post.

Example 10. The MEMS switch of Example 1, wherein the MEMS switch is configured as part of a circuit breaker disposed between an input at a first voltage and an output at a second voltage and configured to pass current through the conductive path and the further conductive path when activated.

Example 11. A micro-electromechanical (MEMS) switch, comprising:

- a conductive beam anchored over a substrate by a conductive post serving simultaneously as a mechanical pivot and a conductive path between the conductive beam and a middle electrode on the substrate; and
- a pair of contact electrodes formed on the substrate at opposite lateral sides of the conductive post;
- wherein upon activation of the MEMS switch, the conductive beam is configured to tilt such that one side of the conductive beam contacts one of the pair of contact electrodes to form a further conductive path, and that the conductive path and the further conductive path become electrically shorted to each other.

Example 12. The MEMS switch of Example 11, wherein the MEMS switch is configured as part of a circuit breaker disposed between a high voltage input at a first voltage and a low voltage output at a second voltage and configured to pass current through the conductive path and the further conductive path when activated.

Example 13. The MEMS switch of Example 12, wherein upon deactivation of the MEMS switch, the one side of the conductive beam is configured to detach from the one of the pair of contact electrodes to form an open circuit between the high voltage input and the low voltage output.

Example 14. The MEMS switch of Example 11, wherein the conductive post is closer to a first end of the conductive beam relative to a second end of the conductive beam opposite the first end.

Example 15. The MEMS switch of Example 11, further comprising a pair of control electrodes formed on the substrate at opposite lateral sides of the conductive post, wherein each of the control electrodes is disposed laterally between the conductive post and a respective one of the pair of contact electrodes.

Example 16. The MEMS switch of Example 14, wherein activation of the MEMS switch comprises application of a voltage to one of the control electrodes that is closer to the first end of the conductive beam to cause an attractive electrostatic force between the one of the control electrodes and the conductive beam.

Example 17. The MEMS switch of Example 11, further comprising a mechanical stopper formed at a bottom surface of the conductive beam and extending towards the substrate, wherein upon activation of the MEMS switch, the mechanical stopper contacts the substrate to substantially limit an elastic deformation of one or more of the conductive beam, the conductive post, and a hinge connecting the conductive beam to the conductive post.

Example 18. A micro-electromechanical (MEMS) switch, comprising:

a conductive beam anchored over a substrate by a conductive post serving simultaneously as a mechanical pivot and a conductive path between the conductive beam and a middle electrode on the substrate;

a pair of contact electrodes formed on the substrate at opposite lateral sides of the conductive post; and a mechanical stopper formed at a bottom surface of the conductive beam and extending towards the substrate, wherein upon activation of the MEMS switch, the conductive beam is configured to tilt such that one side of the conductive beam contacts one of the pair of contact electrodes to form a further conductive path, and the mechanical stopper is configured to substantially suppress an elastic deformation of one or both of the conductive beam and the conductive post.

Example 19. The MEMS switch of Example 18, wherein when the MEMS switch is deactivated, the one side of the conductive beam is detached from the one of the pair of contact electrodes, and the mechanical stopper is separated from the substrate by a gap.

Example 20. The MEMS switch of Example 19, wherein when the MEMS switch is activated, the mechanical stopper contacts the substrate.

Example 21. The MEMS switch of Example 18, wherein the conductive post is closer to a first end of the conductive beam relative to a second end of the conductive beam opposite the first end.

Example 22. The MEMS switch of Example 18, wherein upon activation of the MEMS switch, the conductive path and the further conductive path are electrically shorted to each other.

Example 23. The MEMS switch of Example 18, wherein the MEMS switch is configured as part of a circuit breaker disposed between an input at a first voltage and an output at a second voltage and configured to pass current through the conductive path and the further conductive path when activated.

Examples 2

Example 1. A circuit breaker circuitry, comprising:

an input terminal and an output terminal;

a micro-electromechanical systems (MEMS) switch electrically connected therebetween, comprising:

a conductive beam pivoted over a substrate by a conductive post to tilt in opposite directions;

first and second contact electrodes formed on the substrate at opposite lateral sides of the conductive post, wherein the first contact electrode is electrically shorted with the conductive post, and first and second control electrodes formed on the substrate at opposite lateral sides of the conductive post, wherein each of the first and second control electrodes is disposed laterally between the conductive post and a respective one of the first and second contact electrodes, wherein the input terminal, the first contact electrode and the conductive post are commonly electrically connected, wherein upon activation of the MEMS switch, the conductive beam tilts in a first direction to cause:

a first side of the conductive beam to electromechanically couple to the first contact electrode, and a second side of the conductive beam to mechanically decouple from the second contact electrode, thereby open circuiting a path between the input terminal and the output terminal.

Example 2. The circuit breaker circuitry of Example 1, further comprising a resistor electrically connected to the input terminal and arranged electrically in parallel to the MEMS switch, such that upon activation of the MEMS switch, the input terminal commonly electrically connects to the first contact electrode and the conductive post though the resistor.

Example 3. The circuit breaker circuitry of Example 1, wherein upon deactivation of the MEMS switch, the conductive beam tilts in a second direction to cause:

a second side of the conductive beam to electromechanically couple to the second contact electrode, thereby creating a direct current path between the input terminal and the conductive post through the conductive beam.

Example 4. The circuit breaker circuitry of Example 3, wherein one or both of the activation and the deactivation of the MEMS switch comprise applying an isolated voltage through an isolation power supply circuit comprising a transformer.

Example 5. The circuit breaker circuitry of Example 3, wherein the conductive beam is electrically connected to an isolated ground with respect to which a first control voltage is provided to the first control electrode such that a voltage difference between the first control electrode and the conductive beam remains substantially constant with a changing voltage at the input terminal.

Example 6. The circuit breaker circuitry of Example 1, wherein the conductive post is closer to a first end of the conductive beam relative to a second end of the conductive beam opposite the first end.

Example 7. The circuit breaker circuitry of Example 6, wherein the conductive post is disposed closer to the first end relative to the second end by at least 5% of a length of the conductive beam.

Example 8. The circuit breaker circuitry of Example 1, further comprising a second MEMS switch arranged substantially the same as the MEMS switch and serially connected thereto, wherein the first contact electrodes of the MEMS switch and the second MEMS switch are electrically shorted to each other and configured to be commonly connected to the input terminal upon activation of the MEMS switch and the second MEMS switch, and wherein the second contact electrode of the second MEMS switch is directly connected to the output terminal.

Example 9. A circuit breaker circuitry, comprising:

an input terminal and an output terminal;

a micro-electromechanical systems (MEMS) switch electrically connected therebetween, comprising:

a conductive beam pivoted over a substrate by a conductive post to tilt in opposite directions, wherein the conductive post is closer to a first end of the conductive beam relative to a second end of the conductive beam opposite the first end;

first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby commonly electrically connecting the input terminal to the first contact electrode, and a second side of the conductive beam to electromechanically decouple from the second contact electrode, thereby open circuiting a path between the input terminal and the output terminal.

Example 10. The circuit breaker circuitry of Example 9, wherein the conductive post is closer to the first end of the conductive beam relative to the second end of the conductive beam opposite the first end.

Example 11. The circuit breaker circuitry of Example 10, wherein the conductive post is disposed closer to the first end relative to the second end by at least 5% of a length of the conductive beam.

Example 12. The circuit breaker circuitry of Example 9, wherein the first contact electrode is electrically shorted with the conductive post, and wherein upon activation of the MEMS switch, the first side of the conductive beam electromechanically couples to the first contact electrode, thereby electrically connecting the input terminal to the conductive post.

Example 13. The circuit breaker circuitry of Example 12, further comprising a resistor electrically connected to the input terminal and arranged electrically in parallel to the MEMS switch, such that upon activation of the MEMS switch, the input terminal commonly electrically connects to the first contact electrode and the conductive post though the resistor.

Example 14. The circuit breaker circuitry of Example 9, further comprising a second MEMS switch arranged substantially the same as the MEMS switch and serially connected thereto, wherein the first contact electrode and the MEMS switch and the second MEMS switch are electrically shorted to each other and configured to be commonly connected to the input terminal upon activation of the MEMS switch ad the second MEMS switch, and wherein the second contact electrode of the second MEMS switch is directly connected to the output terminal.

Example 15. A circuit breaker circuitry, comprising:

an input terminal and an output terminal;

a pair of serially connected micro-electromechanical systems (MEMS) switches electrically connected therebetween, wherein each of the MEMS switches comprises:

a conductive beam pivoted over a substrate by a conductive post to tilt in opposite directions;

first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the output terminal, wherein the first contact electrodes of the pair of MEMS switches are electrically shorted to each other.

Example 16. The circuit breaker circuitry of Example 15, wherein for each of the pair of MEMS switches, the first contact electrode is electrically shorted with the conductive post, and wherein upon activation of each of the pair of MEMS switches, the first side of the conductive beam electromechanically couples to the first contact electrode, thereby commonly electrically connecting the input terminal to the first contact electrode and the conductive post.

Example 17. The circuit breaker circuitry of Example 16, further comprising a resistor electrically connected in parallel to each of the pair of MEMS switches, such that upon activation, for each of the pair of MEMS switches, the input terminal commonly electrically connects to the first contact electrode and the conductive post though the resistor.

Example 18. The circuit breaker circuitry of Example 17, wherein the resistors connected in parallel to the each of the pair of MEMS switches are electrically connected in series to serve as a voltage divider between the input terminal and the output terminal when each of the pair of MEMS switches is activated.

Example 19. The circuit breaker circuitry of Example 15, wherein upon deactivation of each of the pair of MEMS switches, the conductive beam tilts in a second direction to cause:

a second side of each of the conductive beams to electromechanically couple to the respective one of the second contact electrodes, thereby creating a direct current path between the input terminal and output terminal through each of the conductive posts and through each of the conductive beams.

Example 20. The circuit breaker circuitry of Example 15, wherein the conductive beam of each of the pair of MEMS switches is electrically connected to an isolated ground with respect to which a control voltage is provided to the first control electrode such that for each of the pair of MEMS switches, a voltage difference between the first control electrode and the first contact electrode remains substantially constant with a changing voltage at the input terminal.

Examples 3

Example 1. A circuit breaker system, comprising: an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit comprising a first transformer configured to provide an activation voltage as an isolated voltage to the first control electrode for the activation of the MEMS switch.

Example 2. The circuit breaker system of Example 1, wherein the isolation circuit is further configured to provide an isolated ground electrically connected to the conductive beam with respect to which a control voltage is provided to the first control electrode, such that a voltage difference between the first control electrode and the conductive beam remains substantially constant with a changing voltage at the input terminal.

Example 3. The circuit breaker system of Example 2, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 4. The circuit breaker system of Example 3, wherein the isolation circuit is further configured to provide a deactivation voltage as an isolated voltage to the second control electrode for deactivation of the MEMS switch.

Example 5. The circuit breaker system of Example 4, wherein the isolation circuit further comprises a second transformer configured to provide an isolated control signal.

Example 6. The circuit breaker system of Example 5, further comprising an actuation and control circuit configured to receive the isolated control signal from the second transformer and generate the activation voltage or the deactivation voltage based on the isolated control signal.

Example 7. The circuit breaker system of Example 5, further comprising a microcontroller connected to the isolation circuit, wherein the isolation circuit further comprises a third transformer configured to receive data from a sensor and provide isolated data signal to the microcontroller, wherein the data is indicative of an operating condition or parameter of the MEMS switch.

Example 8. The circuit breaker system of Example 1, wherein the first contact electrode is electrically shorted with the conductive post.

Example 9. The circuit breaker system of Example 1, further comprising a resistor electrically connecting the output terminal and a ground potential.

Example 10. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit comprising a plurality of transformers and configured to maintain a substantially constant voltage difference between the first control electrode and the conductive beam with a changing voltage at the input terminal connected to the conductive post.

Example 11. The circuit breaker system of Example 10, wherein the plurality of transformers comprises a first transformer configured to provide an activation voltage as an isolated voltage to the first control electrode for the activation of the MEMS switch.

Example 12. The circuit breaker system of Example 11, wherein the isolation circuit is further configured to provide an isolated ground electrically connected to the conductive beam, such that the substantially constant voltage difference between the first control electrode and the conductive beam is maintained with the changing voltage at the input terminal.

Example 13. The circuit breaker system of Example 9, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 14. The circuit breaker system of Example 13, wherein the first transformer is further configured to provide to provide a deactivation voltage as an isolated voltage to the second control electrode for deactivation of the MEMS switch.

Example 15. The circuit breaker system of Example 14, further comprising a microcontroller connected to the isolation circuit, wherein the isolation circuit further comprises a second transformer configured to receive control signals from the microcontroller and provide isolated control signals to an actuation and control circuit configured to generate an activation voltage or a deactivation voltage based on the isolated control signal.

Example 16. The circuit breaker system of Example 10, wherein the conductive post is closer to a first end of the conductive beam relative to a second end of the conductive beam opposite the first end.

Example 17. The circuit breaker system of Example 16, wherein the conductive post is disposed closer to the first end relative to the second end by at least 5% of a length of the conductive beam.

Example 18. The circuit breaker system of Example 10, wherein the first contact electrode is electrically shorted with the conductive post.

Example 19. A circuit breaker system, comprising:

an input terminal and an output terminal;

a pair of serially connected micro-electromechanical systems (MEMS) switches electrically connected therebetween, wherein each of the MEMS switches comprises:

a conductive beam pivoted over a substrate by a conductive post to tilt in opposite directions;

first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause:

a first side of the conductive beam to electromechanically couple to the first contact electrode, thereby electrically connecting the input or output terminal to the respective conductive post, and a second side of the conductive beam to electromechanically decouple from the second contact electrode, thereby open circuiting a path between the input or output terminal and the second contact electrode, an isolation circuit comprising a plurality of transformers and configured to maintain a substantially constant voltage difference between the first and second control electrodes and the respective conductive beams with a changing voltage at the input terminal connected to the first contact electrode.

Example 20. The circuit breaker system of Example 19, wherein the plurality of transformers comprises a first transformer configured to provide an activation voltage as an isolated voltage to the first control electrode of each MEMS switch for the activation of the MEMS switches.

Example 21. The circuit breaker system of Example 20, wherein the isolation circuit is further configured to provide an isolated ground electrically connected to the conductive beam, such that the substantially constant voltage difference between the first control electrode and the respective conductive beam is maintained with the changing voltage at the input terminal.

Example 22. The circuit breaker system of Example 21, wherein upon deactivation of the MEMS switch, the conductive beam tilts in a second direction to cause:

a second side of the conductive beam to electromechanically couple to the second contact electrode, thereby creating a direct current path between the conductive post and the second contact electrode through the conductive beam.

Example 23. The circuit breaker system of Example 20, wherein the first transformer is further configured to provide a deactivation voltage as an isolated voltage to the second control electrode of each MEMS switch for deactivation of the MEMS switches.

Examples 4

Example 1. A circuit breaker circuitry, comprising:

an input terminal and an output terminal;

a micro-electromechanical systems (MEMS) switch electrically connected between the input and output terminals, the MEMS switch comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction, thereby open circuiting a path between the input terminal and the output terminal; and a protective switch electrically connected in parallel to the MEMS switch between the input and output terminals, wherein the protective switch is configured to shunt at least a portion of a current flowing between the input and output terminals during activation of the MEMS switch and prior to a completion of open circuiting the path.

Example 2. The circuit breaker circuitry of Example 1, wherein during activation of the MEMS switch, a first side of the conductive beam electromechanically couples to the first contact electrode, and a second side of the conductive beam electromechanically decouples from the second contact electrode, thereby open circuiting the path between the input terminal and the output terminal, wherein during activation, current flow through the MEMS switch decreases over a time period of 0.1-50 microseconds until the MEMS switch reaches an open circuit condition.

Example 3. The circuit breaker circuitry of Example 1, wherein upon deactivation of the MEMS switch, the conductive beam tilts in a second direction, thereby short circuiting a direct current path between the input and output terminals, wherein the protective switch is configured to shunt at least a portion of a current flowing between the input and output terminals during deactivation of the MEMS switch and prior to completion of coupling of the second side of the conductive beam to the second contact electrode.

Example 4. The circuit breaker circuitry of Example 3, wherein during deactivation of the MEMS switch, the second side of the conductive beam electromechanically couples to the second contact electrode, thereby short circuiting the path between the input terminal and the output terminal, wherein during deactivation, current flow through the MEMS switch increases to over a time period of 5-100 microseconds until the MEMS switch reaches a short circuit condition.

Example 5. The circuit breaker circuitry of Example 3, further comprising a controller circuitry for controlling the protective switch such that prior to commencement of the deactivation and activation of the MEMS switch, the protective switch is activated for shunting the portion of the current flowing between the input terminal.

Example 6. The circuit breaker circuitry of Example 5, wherein the activation of the protective switch comprises receiving a protective control signal and deactivation and activation of the MEMS switch comprises receiving deactivation and activation voltages, respectively, wherein deactivation and activation voltages are delated by at least 0.1 microsecond with respect to protective control signal.

Example 7. The circuit breaker circuitry of Example 1, wherein the protective switch comprises at least one field effect transistor.

Example 8. The circuit breaker circuitry of Example 6, wherein the protective switch comprises two field effect transistor connected in series.

Example 9. The circuit breaker circuitry of Example 1, wherein the first contact electrode is electrically shorted with the conductive post, thereby commonly electrically connecting the input terminal to the first contact electrode and the conductive post.

Example 10. The circuit breaker circuitry of Example 3, wherein one or both of the activation and the deactivation of the MEMS switch comprise applying an isolated voltage through an isolation power supply circuit comprising a transformer.

Example 11. The circuit breaker circuitry of Example 1, wherein the first contact electrode is electrically shorted with the conductive post.

Example 12. The circuit breaker circuitry of Example 1, wherein the conductive post is closer to a first end of the conductive beam relative to a second end of the conductive beam opposite the first end.

Example 13. A circuit breaker circuitry, comprising:

an input terminal and an output terminal;

a micro-electromechanical systems (MEMS) switch electrically connected between the input and output terminals, the MEMS switch comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction, thereby open circuiting a path between the input terminal and the output terminal over a time period of 0.1-10 us seconds until the MEMS switch reaches an open circuit condition; and a protective switch electrically connected in parallel to the MEMS switch between the input and output terminals.

Example 14. The circuit breaker circuitry of Example 13, wherein during activation of the MEMS switch, a first side of the conductive beam electromechanically couples to the first contact electrode, and a second side of the conductive beam electromechanically decouples from the second contact electrode, thereby open circuiting the path between the input terminal and the output terminal.

Example 15. The circuit breaker circuitry of Example 14, wherein the MEMS switch is configured such that during the time period, a contact area between the second side of the conductive beam and the second contact electrode continuously reduces until the second side of the conductive beam completely electromechanically decouples from the second contact electrode.

Example 16. The circuit breaker circuitry of Example 14, wherein the protective switch is configured to shunt at least a portion of a current flowing between the input and output terminals during activation of the MEMS switch and prior to a completion of open circuiting the path.

Example 17. The circuit breaker circuitry of Example 13, wherein the first contact electrode is electrically shorted with the conductive post.

Example 18. A circuit breaker circuitry, comprising:

an input terminal and an output terminal;

a plurality of micro-electromechanical systems (MEMS) switches electrically connected in parallel between the input and output terminals, each of the MEMS switches comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the each of the MEMS switches, the conductive beam tilts in a first direction, thereby open circuiting a path between the input terminal and the output terminal; and a protective switch electrically connected in parallel to the MEMS switches between the input and output terminals.

Example 19. The circuit breaker circuitry of Example 18, wherein activation of the MEMS switches occurs over a time period of 0.1-10 us seconds during which each of the MEMS switches reaches an open circuit condition.

Example 20. The circuit breaker circuitry of Example 19, wherein the protective switch is configured to shunt at least a portion of a current flowing between the input and output terminals during activation of the MEMS switches and prior to a completion of open circuiting the path.

Example 21. The circuit breaker circuitry of Example 18, wherein the first contact electrode of each of the MEMS switches is electrically shorted with the conductive post.

Example 22. The circuit breaker circuitry of Example 18, wherein the protective switch comprises a field effect transistor.

Examples 5

Example 1. A circuit breaker circuitry, comprising:

an input terminal and an output terminal;

a micro-electromechanical systems (MEMS) switch electrically connected between the input and output terminals, the MEMS switch comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and an electrical overstress (EOS) protection device electrically connected to the MEMS switch between the input and output terminals, wherein in response to an EOS event, the EOS protection device is configured to be activated to provide a shunt current path.

Example 2. The circuit breaker circuitry of Example 1, wherein the EOS protection device comprises a spark gap structure configured to arc in response to the EOS event.

Example 3. The circuit breaker circuitry of Example 1, wherein upon activation of the MEMS switch, the conductive beam tilts in a first direction, thereby open circuiting a path between the input terminal and the output terminal, and wherein the EOS protection device has an activation voltage lower than a breakdown voltage of the open circuit path.

Example 4. The circuit breaker circuitry of Example 3, wherein the breakdown voltage of the open circuit path corresponds to a breakdown voltage between the conductive beam and an open-circuited one of the first and second contact electrodes.

Example 5. The circuit breaker circuitry of Example 1, further comprising a protective switch electrically connected in parallel to the MEMS switch and the EOS protection device.

Example 6. The circuit breaker circuitry of Example 5, wherein the protective switch comprises a field effect transistor having a breakdown voltage, and wherein the EOS protection device has an activation voltage lower than the breakdown voltage of the field effect transistor.

Example 7. The circuit breaker circuitry of Example 2, wherein the spark gap structure is fabricated using a semiconductor fabrication process including a lithography process and packaged in a semiconductor package.

Example 8. The circuit breaker circuitry of Example 1, wherein the EOS protection device is electrically connected in parallel to the MEMS switch and configured to provide the shunt current path between the input and output terminals.

Example 9. The circuit breaker circuitry of Example 1, wherein the EOS protection device is electrically connected to the MEMS switch at a first end and to a reference voltage at a second end to provide the shunt current path between the input terminal or the output terminal and the reference voltage.

Example 10. The circuit breaker circuitry of Example 1, wherein the first contact electrode is electrically shorted with the conductive post.

Example 11. The circuit breaker circuitry of Example 1, wherein the conductive post is closer to a first end of the conductive beam relative to a second end of the conductive beam opposite the first end.

Example 12. A circuit breaker circuitry, comprising:

an input terminal and an output terminal;

a micro-electromechanical systems (MEMS) switch electrically connected between the input and output terminals, the MEMS switch comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and a spark gap device electrically connected to the MEMS switch and comprising a pair of conductive arcing electrodes separated by a gap.

Example 13. The circuit breaker circuitry of Example 12, wherein the spark gap device is electrically connected in parallel to the MEMS switch, and wherein in response to an EOS event, the spark gap is configured to arc to provide a shunt current path between the input and output terminals.

Example 14. The circuit breaker circuitry of Example 12, wherein upon activation of the MEMS switch, the conductive beam tilts in a first direction, thereby open circuiting a path between the input terminal and the output terminal, and wherein the spark gap has an arcing voltage lower than a breakdown voltage of the open circuit path.

Example 15. The circuit breaker circuitry of Example 14, wherein the breakdown voltage of the open circuit path corresponds to a breakdown voltage between the conductive beam and an open-circuited one of the first and second contact electrodes.

Example 16. The circuit breaker circuitry of Example 12, further comprising a protective switch electrically connected in parallel to the MEMS switch and the spark gap device.

Example 17. The circuit breaker circuitry of Example 16, wherein the protective switch comprises a field effect transistor having a breakdown voltage, and wherein the spark gap device has an activation voltage lower than the breakdown voltage of the field effect transistor.

Example 18. The circuit breaker circuitry of Example 10, wherein the first contact electrode is electrically shorted with the conductive post.

Example 19. The circuit breaker circuitry of Example 13, wherein a first electrode of the spark gap device is electrically connected to the MEMS switch at a first end and a second electrode of the spark gap device is electrically connected to a reference voltage at a second end to provide the shunt current path between the input terminal or the output terminal and the reference voltage.

Example 20. A circuit breaker circuitry, comprising:

an input terminal and an output terminal;

a micro-electromechanical systems (MEMS) switch electrically connected between the input and output terminals, the MEMS switch comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and an electrical overstress (EOS) protection device electrically to the MEMS switch between the input and output terminals, wherein the MEMS switch and the EOS protection device are fabricated on a common substrate using a semiconductor fabrication process.

Example 21. The circuit breaker circuitry of Example 20, wherein the MEMS switch and the EOS protection device have one or more corresponding features that are co-fabricated.

Example 22. The circuit breaker circuitry of Example 21, wherein the features that are co-fabricated have at least one common physical dimension.

Example 23. The circuit breaker circuitry of Example 22, wherein the EOS protection device comprises a spark gap structure configured to arc in response to the EOS event.

Example 24. The circuit breaker circuitry of Example 23, wherein the spark gap structure comprises a pair of conductive arcing electrodes separated by a gap, wherein the conductive electrodes are configured to arc in a direction generally perpendicular to a main surface of the common substrate.

Example 25. The circuit breaker circuitry of Example 20, wherein the EOS protection device is electrically connected in parallel to the MEMS switch and configured to provide a shunt current path between the input and output terminals.

Example 26. The circuit breaker circuitry of Example 20, wherein the EOS protection device is electrically connected to the MEMS switch at a first end and to a reference voltage at a second end to provide the shunt current path between the input terminal or the output terminal and the reference voltage.

Examples 6

Example 1. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit comprising a first optical isolator configured to provide an activation voltage as an isolated voltage to the first control electrode for the activation of the MEMS switch.

Example 2. The circuit breaker system of Example 1, wherein the first optical isolator comprises a first optical source and a first optical-to-electrical power converter.

Example 3. The circuit breaker system of Example 2, wherein the isolation circuit is further configured to provide an isolated ground electrically connected to the conductive beam, such that a voltage difference between the first control electrode and the conductive beam remains substantially constant with a changing voltage at the input terminal.

Example 4. The circuit breaker system of Example 3, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 5. The circuit breaker system of Example 4, wherein the first optical isolator is further configured to provide a deactivation voltage as an isolated voltage to the second control electrode for deactivation of the MEMS switch.

Example 6. The circuit breaker system of Example 5, further comprising a second optical isolator comprising a second optical source and a second optical-to-electrical power converter, wherein the second optical isolator is configured to provide an isolated control signal.

Example 7. The circuit breaker system of Example 6, further comprising an actuation and control circuit configured to receive the isolated control signal from the second optical isolator and generate the activation voltage or the deactivation voltage based on the isolated control signal.

Example 8. The circuit breaker system of Example 7, further comprising a microcontroller connected to the isolation circuit, wherein the isolation circuit further comprises a third optical isolator, the third optical isolator comprising a third optical source and a third optical-to-electrical power converter, the third optical isolator configured to receive data from a sensor and provide isolated data signal to the microcontroller, wherein the data is indicative of an operating condition or parameter of the MEMS switch.

Example 9. The circuit breaker system of Example 1, wherein the first contact electrode is electrically shorted with the conductive post.

Example 10. The circuit breaker system of Example 1, further comprising a resistor electrically connecting the output terminal and a ground potential.

Example 11. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit comprising a plurality of optical isolators and configured to maintain a substantially constant voltage difference between the first control electrode and the conductive beam with a changing voltage at the input terminal connected to the conductive post.

Example 12. The circuit breaker system of Example 11, wherein each of the optical isolators comprises an optical source and an optical-to-electrical power converter.

Example 13. The circuit breaker system of Example 12, wherein the plurality of optical isolators comprises a first optical isolator configured to provide an activation voltage as an isolated voltage to the first control electrode for the activation of the MEMS switch.

Example 14. The circuit breaker system of Example 13, wherein the isolation circuit is further configured to provide an isolated ground electrically connected to the conductive beam, such that the substantially constant voltage difference between the first control electrode and the conductive beam is maintained with the changing voltage at the input terminal.

Example 15. The circuit breaker system of Example 13, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 16. The circuit breaker system of Example 15, wherein the first optical isolator is further configured to provide to provide a deactivation voltage as an isolated voltage to the second control electrode for deactivation of the MEMS switch.

Example 17. The circuit breaker system of Example 16, further comprising a microcontroller connected to the isolation circuit, wherein the isolation circuit further comprises a second optical isolator configured to receive control signals from the microcontroller and provide isolated control signals to an actuation and control circuit configured to generate the activation voltage or the deactivation voltage based on the isolated control signal, the second optical isolator comprising a second optical source and a second optical-to-electrical power converter.

Example 18. The circuit breaker system of Example 12, wherein the conductive post is closer to a first end of the conductive beam relative to a second end of the conductive beam opposite the first end.

Example 19. The circuit breaker system of Example 18, wherein the conductive post is disposed closer to the first end relative to the second end by at least 5% of a length of the conductive beam.

Example 20. The circuit breaker system of Example 12, wherein the first contact electrode is electrically shorted with the conductive post, and wherein upon activation of the MEMS switch, the first side of the conductive beam electromechanically couples to the first contact electrode, thereby commonly electrically connecting the input terminal to the first contact electrode.

Example 21. A circuit breaker system, comprising:

an input terminal and an output terminal;

a pair of serially connected micro-electromechanical systems (MEMS) switches electrically connected therebetween, wherein each of the MEMS switches comprises:

a conductive beam pivoted over a substrate by a conductive post to tilt in opposite directions;

first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the pair of MEMS switches each of the conductive beams tilts to cause:

a first side of the conductive beam to electromechanically couple to the first contact electrode, thereby electrically connecting the input or output terminal to the respective conductive post, and a second side of the conductive beam to electromechanically decouple from the second contact electrode, thereby open circuiting a path between the input or output terminal and the second contact electrode, an isolation circuit comprising a plurality of optical isolators and configured to maintain a substantially constant voltage difference between the first and second control electrodes and the respective conductive beams with a changing voltage at the input terminal connected to the first contact electrode.

Example 22. The circuit breaker system of Example 21, wherein each of the optical isolators comprises an optical source and an optical-to-electrical power converter.

Example 23. The circuit breaker system of Example 22, wherein the plurality of optical isolators comprises a first optical isolator configured to provide an activation voltage as an isolated voltage to the first control electrode of each MEMS switch for the activation of the MEMS switches.

Example 24. The circuit breaker system of Example 22, wherein the isolation circuit is further configured to provide an isolated ground electrically connected to the conductive beam, such that the substantially constant voltage difference between the first control electrode and the respective conductive beam is maintained with the changing voltage at the input terminal.

Example 25. The circuit breaker system of Example 23, wherein upon deactivation of the MEMS switch, the conductive beam tilts in a second direction to cause:

a second side of the conductive beam to electromechanically couple to the second contact electrode, thereby creating a direct current path between the conductive post and the second contact electrode through the conductive beam.

Example 26. The circuit breaker system of Example 23, wherein the first optical isolator is further configured to provide a deactivation voltage as an isolated voltage to the second control electrode of each MEMS switch for deactivation of the MEMS switches.

Examples 7

Example 1. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes;

a current sensor serially connected to the MEMS switch between the input and output terminals; and a microcontroller communicatively coupled to the MEMS switch and the current sensor, wherein upon the microcontroller determining that a current sensed from the current sensor exceeds a predetermined threshold value, the microcontroller is configured to activate the MEMS switch by tilting the conductive beam in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode.

Example 2. The circuit breaker system of Example 1, wherein the current sensor comprises a resistor connected between the first contact electrode and a power source.

Example 3. The circuit breaker system of Example 1, further comprising an analog-to-digital converter (ADC) electrically connected to the current sensor and configured to convert sensed current into a digital signal, wherein the circuit breaker further comprises an isolation circuit electrically connected between the ADC and the microcontroller, the isolation circuit comprising a transformer configured to receive the digital signal and provide an isolated signal to the microcontroller.

Example 4. The circuit breaker system of Example 1, wherein the first contact electrode is electrically shorted with the conductive post.

Example 5. The circuit breaker system of Example 3, further comprising a second isolation circuit electrically connected between the microcontroller and the MEMS switch, the second isolation circuit configured to provide an activation voltage as an isolated voltage to the first control electrode for the activation of the MEMS switch.

Example 6. The circuit breaker system of Example 5, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 7. The circuit breaker system of Example 6, wherein the second isolation circuit is further configured to provide a deactivation voltage as an isolated voltage to the second control electrode for deactivation of the MEMS switch.

Example 8. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes;

a temperature sensor in thermal communication with the MEMS switch; and a microcontroller communicatively coupled to the MEMS switch and the temperature sensor, wherein upon the microcontroller determining that a temperature sensed from the temperature sensor exceeds a predetermined threshold value, the microcontroller is configured to activate the MEMS switch by tilting the conductive beam in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode.

Example 9. The circuit breaker system of Example 8, wherein the temperature sensor comprises a thin film resistor integrated on a same substrate with the MEMS switch.

Example 10. The circuit breaker system of Example 9, wherein the thin film resistor has a positive temperature coefficient of resistance.

Example 11. The circuit breaker system of Example 8, further comprising an analog-to-digital converter (ADC) electrically connected to the temperature sensor and configured to convert sensed current or voltage into a digital signal, wherein the circuit breaker further comprises an isolation circuit electrically connected between the ADC and the microcontroller, the isolation circuit comprising a transformer configured to receive the digital signal and provide an isolated signal to the microcontroller.

Example 12. The circuit breaker system of Example 8, wherein the first contact electrode is electrically shorted with the conductive post, and wherein upon activation of the MEMS switch.

Example 13. The circuit breaker system of Example 11, further comprising a second isolation circuit electrically connected between the microcontroller and the MEMS switch, the second isolation circuit configured to provide an activation voltage as an isolated voltage to the first control electrode for the activation of the MEMS switch.

Example 14. The circuit breaker system of Example 13, wherein upon deactivation of the MEMS switch, the conductive beam tilts in a second direction to cause:

a second side of the conductive beam to electromechanically couple to the second contact electrode, thereby creating a direct current path between the second contact electrode and the conductive post through the conductive beam.

Example 15. The circuit breaker system of Example 14, wherein the second isolation circuit is further configured to provide a deactivation voltage as an isolated voltage to the second control electrode for deactivation of the MEMS switch.

Example 16. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes; and one or more thin film-based sensors co-fabricated on a same substrate to have at least one common physical dimension with a layer of the MEMS switch to have at least one physical dimension common.

Example 17. The circuit breaker system of Example 16, wherein the one or more thin film-based sensors comprises a thin film resistor patterned from a same layer as one or more of the first and second contact electrodes or one or more of the first and second control electrodes.

Example 18. The circuit breaker system of Example 17, wherein the thin film resistor has a same thickness as the one or more of the first and second contact electrodes or the one or more of the first and second control electrodes.

Example 19. The circuit breaker system of Example 16, further comprising a microcontroller communicatively coupled to the MEMS switch and one or more thin film-based sensors, wherein upon the microcontroller determining that a sensed signal sensed from the one or more sensors exceeds a predetermined threshold value, the microcontroller is configured to activate the MEMS switch by tilting the conductive beam in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode.

Example 20. The circuit breaker system of Example 19, further comprising an analog-to-digital converter (ADC) electrically connected to one of the thin film-based sensors and configured to convert a sensed current or voltage into a digital signal, wherein the circuit breaker further comprises an isolation circuit electrically connected between the ADC and the microcontroller, the isolation circuit comprising a transformer configured to receive the digital signal and provide an isolated signal to the microcontroller.

TERMINOLOGY

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another or may be combined in various ways. All possible combinations and subcombinations of features of this disclosure are intended to fall within the scope of this disclosure.

What is claimed is:

1. A circuit breaker system, comprising:

an input terminal and an output terminal;

a micro-electromechanical systems (MEMS) switch electrically connected therebetween, comprising:

a conductive beam pivoted over a substrate by a conductive post to tilt in opposite directions, first and second contact electrodes formed on the substrate at opposite lateral sides of the conductive post, and first and second control electrodes formed on the substrate at opposite lateral sides of the conductive post, wherein each of the first and second control electrodes is disposed laterally between the conductive post and a respective one of the first and second contact electrodes, wherein upon activation of the MEMS switch, the conductive beam tilts in a first direction to cause:

a first side of the conductive beam to electromechanically couple to the first contact electrode, thereby electrically connecting the input terminal to the first contact electrode, and a second side of the conductive beam to electromechanically decouple from the second contact electrode, thereby open circuiting a path between the input terminal and the second contact electrode; and an isolation circuit comprising a first optical isolator configured to provide an activation voltage as an isolated voltage to the first control electrode for the activation of the MEMS switch.

2. The circuit breaker system of claim 1, wherein the first optical isolator comprises a first optical source and a first optical-to-electrical power converter.

3. The circuit breaker system of claim 2, wherein the isolation circuit is further configured to provide an isolated ground electrically connected to the conductive beam, such that a voltage difference between the first control electrode and the conductive beam remains substantially constant with a changing voltage at the input terminal.

4. The circuit breaker system of claim 2, wherein the first optical isolator is further configured to provide a deactivation voltage as an isolated voltage to the second control electrode to establish a direct current path between the conductive post and the second contact electrode through the conductive beam.

5. The circuit breaker system of claim 4, further comprising a second optical isolator comprising a second optical source and a second optical-to-electrical power converter, wherein the second optical isolator is configured to provide an isolated control signal.

6. The circuit breaker system of claim 5, further comprising an actuation and control circuit configured to receive the isolated control signal from the second optical isolator and generate the activation voltage or the deactivation voltage based on the isolated control signal.

7. The circuit breaker system of claim 6, further comprising a microcontroller connected to the isolation circuit, wherein the isolation circuit further comprises a third optical isolator, the third optical isolator comprising a third optical source and a third optical-to-electrical power converter, the third optical isolator configured to receive data from a sensor and provide isolated data signal to the microcontroller, wherein the data is indicative of an operating condition or parameter of the MEMS switch.

8. The circuit breaker system of claim 1, further comprising a resistor electrically connecting the output terminal and a ground potential.

9. A circuit breaker system, comprising:
- an input terminal and an output terminal;
- a micro-electromechanical systems (MEMS) switch electrically connected therebetween, comprising:
  - a conductive beam pivoted over a substrate by a conductive post to tilt in opposite directions,
  - first and second contact electrodes formed on the substrate at opposite lateral sides of the conductive post, and
  - first and second control electrodes formed on the substrate at opposite lateral sides of the conductive post, wherein each of the first and second control electrodes is disposed laterally between the conductive post and a respective one of the first and second contact electrodes,
- wherein upon activation of the MEMS switch, the conductive beam tilts in a first direction to cause:
  - a first side of the conductive beam to electromechanically couple to the first contact electrode, thereby electrically connecting the input terminal to the first contact electrode, and
  - a second side of the conductive beam to electromechanically decouple from the second contact electrode, thereby open circuiting a path between the input terminal and the second contact electrode; and
- an isolation circuit comprising a plurality of optical isolators and configured to maintain a substantially constant voltage difference between the first control electrode and the conductive beam with a changing voltage at the input terminal connected to the conductive post.

10. The circuit breaker system of claim 9, wherein each of the plurality of optical isolators comprises an optical source and an optical-to-electrical power converter.

11. The circuit breaker system of claim 10, wherein the plurality of optical isolators comprises a first optical isolator configured to provide an activation voltage as an isolated voltage to the first control electrode for the activation of the MEMS switch.

12. The circuit breaker system of claim 11, wherein the isolation circuit is further configured to provide an isolated ground electrically connected to the conductive beam, such that the substantially constant voltage difference between the first control electrode and the conductive beam is maintained with the changing voltage at the input terminal.

13. The circuit breaker system of claim 11, wherein the first optical isolator is further configured to provide to provide a deactivation voltage as an isolated voltage to the second control electrode to establish a direct current path between the conductive post and the second contact electrode through the conductive beam.

14. The circuit breaker system of claim 13, further comprising a microcontroller connected to the isolation circuit, wherein the isolation circuit further comprises a second optical isolator configured to receive control signals from the microcontroller and provide isolated control signals to an actuation and control circuit configured to generate the activation voltage or the deactivation voltage based on the isolated control signals, the second optical isolator comprising a second optical source and a second optical-to-electrical power converter.

15. The circuit breaker system of claim 10, wherein the conductive post is disposed closer to a first end of the conductive beam relative to a second end of the conductive beam by at least 5% of a length of the conductive beam.

16. A circuit breaker system, comprising:
- an input terminal and an output terminal;
- a pair of serially connected micro-electromechanical systems (MEMS) switches electrically connected therebetween, wherein each of the MEMS switches comprises:
  - a conductive beam pivoted over a substrate by a conductive post to tilt in opposite directions,
  - first and second contact electrodes formed on the substrate at opposite lateral sides of the conductive post, and
  - first and second control electrodes formed on the substrate at opposite lateral sides of the conductive post, wherein each of the first and second control electrodes is disposed laterally between the conductive post and a respective one of the first and second contact electrodes,
- wherein upon activation of the pair of MEMS switches each of the conductive beams tilts to cause:
  - a first side of the conductive beam to electromechanically couple to the first contact electrode, thereby electrically connecting the input or output terminal to the respective conductive post, and
  - a second side of the conductive beam to electromechanically decouple from the second contact electrode, thereby open circuiting a path between the input or output terminal and the second contact electrode; and
- an isolation circuit comprising a plurality of optical isolators and configured to maintain a substantially constant voltage difference between the first and second control electrodes and the respective conductive beams with a changing voltage at the input terminal connected to the first contact electrode.

17. The circuit breaker system of claim 16, wherein each of the plurality of optical isolators comprises an optical source and an optical-to-electrical power converter.

18. The circuit breaker system of claim 17, wherein the plurality of optical isolators comprises a first optical isolator configured to provide an activation voltage as an isolated voltage to the first control electrode of each MEMS switch for the activation of the MEMS switches.

19. The circuit breaker system of claim 17, wherein the isolation circuit is further configured to provide an isolated ground electrically connected to the conductive beam, such that the substantially constant voltage difference between the first control electrode and the respective conductive beam is maintained with the changing voltage at the input terminal.

20. The circuit breaker system of claim 18, wherein the first optical isolator is further configured to provide a deactivation voltage as an isolated voltage to the second control electrode of each MEMS switch to establish a direct current path between the conductive post and the second contact electrode through the conductive beam.

* * * * *